US010186533B2

(12) United States Patent
Kato et al.

(10) Patent No.: US 10,186,533 B2
(45) Date of Patent: Jan. 22, 2019

(54) SOLID-STATE IMAGING DEVICE, CAMERA MODULE AND ELECTRONIC APPARATUS

(71) Applicant: Sony Corporation, Tokyo (JP)

(72) Inventors: Nanako Kato, Kanagawa (JP); Toshifumi Wakano, Kanagawa (JP); Atsuhiko Yamamoto, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/256,987

(22) Filed: Sep. 6, 2016

(65) Prior Publication Data

US 2016/0372504 A1 Dec. 22, 2016

Related U.S. Application Data

(63) Continuation of application No. 13/588,469, filed on Aug. 17, 2012, now Pat. No. 10,074,678.

(30) Foreign Application Priority Data

Aug. 22, 2011 (JP) .................................. 2011-180142
Jun. 28, 2012 (JP) .................................. 2012-145606

(51) Int. Cl.
*H01L 31/062* (2012.01)
*H01L 27/146* (2006.01)
*H04N 5/3745* (2011.01)

(52) U.S. Cl.
CPC .. *H01L 27/14605* (2013.01); *H01L 27/14603* (2013.01); *H01L 27/14609* (2013.01);
(Continued)

(58) Field of Classification Search
CPC ............. H01L 27/146; H01L 27/14601; H01L 27/14603; H01L 27/14605; H01L 27/14609; H01L 27/14612
(Continued)

(56) References Cited

U.S. PATENT DOCUMENTS 7,638,804 B2 * 12/2009 Kido ................. H01L 27/14603
257/434
8,314,870 B2 11/2012 Itonaga et al.
(Continued)

FOREIGN PATENT DOCUMENTS

JP 2006-073733 A 3/2006
JP 2007-019521 A 1/2007
(Continued)

OTHER PUBLICATIONS

Japanese Office Action dated Mar. 8, 2016 for corresponding Japanese Application No. 2012145606.
(Continued)

*Primary Examiner* — Matthew E Warren
(74) *Attorney, Agent, or Firm* — Michael Best & Friedrich LLP

(57) ABSTRACT

A solid-state imaging device includes a plurality of photoelectric conversion units, a floating diffusion unit that is shared by the plurality of photoelectric conversion units and converts electric charge generated in each of the plurality of photoelectric conversion units into a voltage signal, a plurality of transfer units that are respectively provided in the plurality of photoelectric conversion units and transfer the electric charge generated in the plurality of photoelectric conversion units to the floating diffusion unit, a first transistor group that is electrically connected to the floating diffusion unit and includes a gate and source/drain which are arranged with a first layout configuration, and a second transistor group that is electrically connected to the floating diffusion unit, includes a gate and source/drain arranged with a second layout configuration symmetrical to the first layout configuration, and is provided in a separate area from the first transistor group.

29 Claims, 27 Drawing Sheets

(52) U.S. Cl.
CPC .. *H01L 27/14612* (2013.01); *H01L 27/14636* (2013.01); *H01L 27/14641* (2013.01); *H04N 5/3745* (2013.01); *H01L 27/1464* (2013.01); *H01L 27/14643* (2013.01)

(58) Field of Classification Search
USPC .... 257/290–293, E31.084, E27.13, E27.131, 257/E27.132, E27.133
See application file for complete search history.

(56) References Cited

U.S. PATENT DOCUMENTS

| | | | |
|---|---|---|---|
| 8,860,099 B2 * | 10/2014 | Tatani | H01L 27/14603 257/230 |
| 2006/0043440 A1 | 3/2006 | Hiyama et al. | |
| 2006/0255380 A1 | 11/2006 | Lee | |
| 2007/0164332 A1 | 7/2007 | Paik et al. | |
| 2007/0215912 A1 | 9/2007 | Kido et al. | |
| 2008/0303930 A1 | 12/2008 | Kuroda | |
| 2010/0045833 A1 | 2/2010 | Iwabuchi et al. | |
| 2010/0060763 A1 | 3/2010 | Hiyama et al. | |
| 2011/0019063 A1 | 1/2011 | Watanabe et al. | |
| 2011/0181747 A1 * | 7/2011 | Kido | H01L 27/14603 348/222.1 |

FOREIGN PATENT DOCUMENTS

| | | |
|---|---|---|
| JP | 2007-115994 | 5/2007 |
| JP | 2008-270299 A | 11/2008 |
| JP | 2010-147965 | 7/2010 |
| JP | 2010-212288 | 9/2010 |
| JP | 2011-049446 | 3/2011 |
| JP | 2011-155596 A | 8/2011 |

OTHER PUBLICATIONS

Chinese Office Action dated May 12, 2016 for corresponding Chinese Application No. 201210300957.9.
Partial European Search Report dated Apr. 5, 2017 for corresponding European Application No. 12179627.0.
Extended European Search Report dated Jul. 7, 2017 for corresponding European Application No. 12179627.0.

* cited by examiner

SOLID-STATE IMAGING DEVICE, CAMERA MODULE AND ELECTRONIC APPARATUS

CROSS REFERENCES TO RELATED APPLICATION

This application is a Continuation application of patent application Ser. No. 13/588,469 filed Aug. 17, 2012, which claims priority to Japanese Patent Application Nos.: 2012-145606 and 2011-180142, filed in the Japan Patent Office on Jun. 28, 2012 and Aug. 22, 2011, respectively, the entire contents of which being incorporated herein by reference.

BACKGROUND

The present disclosure relates to a solid-state imaging device and an electronic apparatus including the solid-state imaging device.

Hitherto, as solid-state imaging devices, complementary metal oxide semiconductor (CMOS) image sensors that read signal electric charge stored in a photodiode (photoelectric conversion element) through metal oxide semiconductor (MOS) transistors have been used in various applications in recent years. In general, CMOS image sensors have a substrate on which photodiodes that photoelectrically convert incident light are formed, and a wiring layer formed on the substrate. At present, as CMOS image sensors, front-illuminated CMOS image sensors that are irradiated with light from the surface on the wiring layer side of the substrate have been widely used. Furthermore, in recent years, in order to improve the sensitivity of photodiodes, back-illuminated CMOS image sensors that are irradiated with light from the surface (reverse surface) on a side opposite to the wiring layer side of the substrate also have been proposed.

In a back-illuminated CMOS image sensor, in virtue of its structural features, when compared to the front-illuminated CMOS image sensor, degree of freedom of layout of, for example, wires, transistors, and the like, which are provided in pixel units, is markedly improved. Specifically speaking, a front-illuminated CMOS image sensor is irradiated with light from the wiring layer side of the substrate. Consequently, phenomena, such as reflection, absorption, refraction, light-shielding, and the like of incident light, occur in, for example, wires, transistors, and the like of pixel units. For this reason, in the front-illuminated CMOS image sensor, the sensitivity of photodiodes may be decreased or sensitivity difference may occur between pixels. Therefore, in the front-illuminated CMOS image sensor, in order to solve such problems, it is necessary that a layout be devised in pixel units so that wiring is not arranged as much as possible on photodiodes.

On the other hand, since the back-illuminated CMOS image sensor is irradiated with light from the reverse surface of the substrate, the back-illuminated CMOS image sensor is not easily affected by reflection, absorption, refraction, and the like of incident light in wires, transistors, and the like of pixel units. In addition, since the back-illuminated CMOS image sensor is irradiated with light from the reverse surface of the substrate, it is possible to arrange the wiring of pixel units on photodiodes. Therefore, in the back-illuminated CMOS image sensor, when compared to the front-illuminated CMOS image sensor, the degree of freedom of layout increases.

Hitherto, in a CMOS image sensor, as the pixel size becomes finer, a technology of sharing pixels is often adopted so as to maximize the photodiode numerical aperture. In this pixel sharing technology, by sharing transistors among a plurality of pixels so as to minimize the occupation area of elements other than the photodiodes in the pixel units, the area of the photodiodes is secured. By using this pixel sharing technology, it is possible to improve characteristics, such as the amount of signal saturated and the sensitivity of photodiodes.

Accordingly, hitherto, in the CMOS image sensor in which the pixel sharing technology is applied, various pixel unit layouts have been proposed (for example, see Japanese Unexamined Patent Application Publication Nos. 2010-147965, 2010-212288, 2007-115994, and 2011-049446).

Japanese Unexamined Patent Application Publication No. 2010-147965 describes a front-illuminated CMOS image sensor in which four pixels are shared. In Japanese Unexamined Patent Application Publication No. 2010-147965, light-receiving areas formed by four photodiodes, which are arranged by 2×2 in the vertical arrangement direction and the horizontal arrangement direction of pixels (hereinafter, referred to as vertical direction and horizontal direction, respectively) are repeatedly arranged in a two-dimensional manner. Then, two pixels arranged in one of the diagonal directions in a predetermined first light-receiving area, and two pixels arranged in one of the diagonal directions in a second light-receiving area adjacent to one of the sides of the first light-receiving area in the vertical direction constitute one sharing unit.

Furthermore, in the CMOS image sensor of Japanese Unexamined Patent Application Publication No. 2010-147965, in the vertical direction, between the first light-receiving area and the second light-receiving area, a reset transistor and a contact hole that are shared by four pixels are arranged. Then, an amplification transistor and a selection transistor, which are shared in four pixels, are arranged between the first light-receiving area and a light-receiving area adjacent on a side opposite to the second light-receiving area side of the first light-receiving area.

Japanese Unexamined Patent Application Publication No. 2010-212288 describes a front-illuminated CMOS image sensor in which a plurality of pixels adjacent in the column direction are shared. Then, in the CMOS image sensor of Japanese Unexamined Patent Application Publication No. 2010-212288, a reset transistor is arranged in one of the diagonal directions of the photodiode of a predetermined pixel among a plurality of pixels that are shared, and an amplification transistor and a selection transistor are arranged on the other side.

Japanese Unexamined Patent Application Publication No. 2007-115994 describes a back-illuminated CMOS image sensor in which light-receiving areas formed of four photodiodes, which are arranged by 2×2 in the vertical direction and in the horizontal direction, are repeatedly arranged in a two-dimensional manner. Then, two pixels that are arranged in one of the diagonal directions in the predetermined first light-receiving area, and two pixels that are arranged in one of the diagonal directions in a second light-receiving area adjacent to one of sides of the first light-receiving area in the vertical direction constitute one sharing unit. Furthermore, in the CMOS image sensor of Japanese Unexamined Patent Application Publication No. 2007-115994, the reset transistor, the amplification transistor, and the selection transistor, which are shared by four pixels, are arranged between the first light-receiving area and the second light-receiving area.

Japanese Unexamined Patent Application Publication No. 2011-049446 describes a back-illuminated CMOS image sensor in which eight pixels are shared. In the CMOS image sensor of Japanese Unexamined Patent Application Publication No. 2011-049446, a first light-receiving unit in which four photodiodes are arranged by 2×2 in the vertical direction and in the horizontal direction and a second light-receiving unit having a structure similar to that of the first light-receiving unit constitute one sharing unit. Then, the second light-receiving unit is arranged so as to be adjacent to one of the sides of the first light-receiving unit in the vertical direction. Furthermore, in the CMOS image sensor of Japanese Unexamined Patent Application Publication No. 2011-049446, an amplification transistor shared by eight pixels is arranged between the first light-receiving unit and the second light-receiving unit, and a reset transistor is arranged between the first light-receiving unit and a light-receiving unit on a side opposite to the second light-receiving unit side of the first light-receiving unit.

SUMMARY

In the manner described above, hitherto, in the CMOS image sensor, various pixel layout technologies have been proposed. However, if the pixel size is made finer to such a degree as to be, for example, 1 μm or less, even if such a pixel sharing technology as described above is used, for example, a restriction is incurred on the layout of transistors and the like.

Specifically, as the pixel size becomes finer, a design is made so that the numerical aperture of photodiodes becomes a maximum. Consequently, the occupation area of transistors is necessary to be further reduced (minimized) accordingly. In this case, for example, depending on the pixel size and the layout technique of transistors, there is a probability that variations occur in the characteristics of, for example, sensitivity (output) among a plurality of photodiodes in the shared pixels.

The present disclosure has been made to solve the above-described problems. It is desirable to provide a solid-state imaging device capable of suppressing variations of characteristics of, for example, sensitivity among a plurality of photodiodes even if, for example, the pixel size becomes further finer, and an electronic apparatus including the solid-state imaging device.

A solid-state imaging device according to the present disclosure includes a plurality of photoelectric conversion units, a floating diffusion unit, a plurality of transfer units, a first transistor group, and a second transistor group. The function and the configuration of each unit are formed as follows. The floating diffusion unit is shared among the plurality of photoelectric conversion units and converts electric charge generated by each of the plurality of photoelectric conversion units into a voltage signal. The plurality of transfer units, which are provided for the plurality of respective photoelectric conversion units, transfer electric charge that is generated by the plurality of photoelectric conversion units to the floating diffusion unit. The first transistor group is electrically connected to the floating diffusion unit, and has the gate and the source/drain, which are arranged in the first layout configuration. The second transistor group is electrically connected to the floating diffusion unit, has the gate and the source/drain that are arranged in a second layout configuration symmetrical to the first layout configuration, and is provided in an area differing from that of the first transistor group.

The meaning of "the second layout configuration symmetrical to the first layout configuration" referred to in this specification is as follows. It means that the layout configurations of both of them are symmetrical to each other with respect to the straight line passing the center between both the transistor groups and extending in a direction intersecting at right angles to the arrangement direction between both the transistor groups within the plane in which the first transistor group and the second transistor group are formed.

Furthermore, meaning of the term "layout configuration" includes the meaning of not only the layout pattern of the gate and/or the source/drain of the transistors, but also the size (area) of the gate and/or the source/drain. That is, in this specification, in a case where the layout pattern and/or the size (area) of at least one of the gate and the source/drain is the same between the first transistor group and the second transistor group, the layout configurations of both of them are symmetrical.

Furthermore, the phrase that the layout configurations are "symmetrical" as used in this specification means that the layout configurations are substantially the same ("substantially symmetrical") in addition to that the layout configurations are the same between the first transistor group and the second transistor group. More specifically, the term "symmetrical" as used in this specification includes a case in which the layout configurations are somewhat different to each other within a range in which variations in the characteristics, such as, for example, sensitivity, among a plurality of photoelectric conversion units can be suppressed. Examples of ranges in which variations in characteristics can be suppressed include a range in which variations in sensitivity is approximately 0.1% or less.

Furthermore, the term "gate" as used in this specification includes not only the gate of a transistor but also a dummy gate (dummy electrode). Furthermore, the term "source/drain" as used in this specification includes not only the source area or the drain area of each transistor but also the source area or the drain area that is shared between two mutually adjacent transistors. In addition, the term "source/drain" includes an area that is shared between two mutually adjacent transistors, with the area acting as a source for one of the transistors and acting as a drain for the other transistor.

Furthermore, an electronic apparatus of the present disclosure includes the above-described solid-state imaging device of the present disclosure, and a signal processing circuit that performs predetermined processing on an output signal of the solid-state imaging device.

In the manner described above in the solid-state imaging device of the present disclosure, various transistors that are shared among a plurality of photoelectric conversion units are divided into at least two transistor groups and arranged. Then, the first layout configuration of the gate and the source/drain within the first transistor group is formed symmetrical to the second layout configuration of the gate and the source/drain in the second transistor group.

In the present disclosure, the layout configuration of the gate and the source/drain of the first transistor group is formed symmetrical to that of the second transistor group. As a result, according to the present disclosure, it is possible to suppress variations in the characteristics, such as, for example, sensitivity, among a plurality of photoelectric conversion units.

DETAILED DESCRIPTION OF EMBODIMENTS

Figure 1:
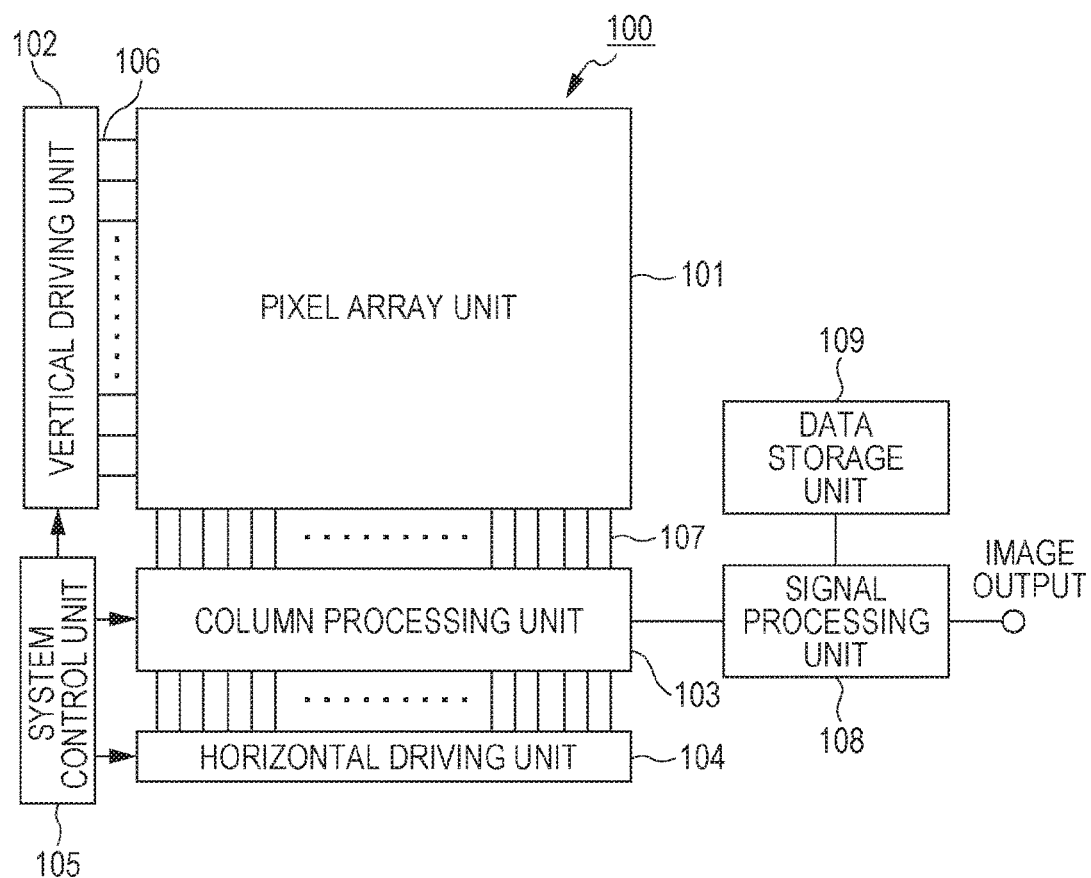
FIG. 1 is a schematic block diagram of a solid-state imaging device according to a first embodiment.

Examples of a solid-state imaging device and an electronic apparatus according to embodiments of the present disclosure will be described below in the following order with reference to the drawings. However, the present disclosure is not limited to the examples described below.
1. First Embodiment: 4-transistor-type solid-state imaging device (8-pixel sharing)
2. Various modifications of first embodiment
3. Second Embodiment: 4-transistor-type solid-state imaging device (4-pixel sharing)
4. Third Embodiment: 4-transistor-type solid-state imaging device (2-pixel sharing)
5. Fourth Embodiment: 3-transistor-type solid-state imaging device (8-pixel sharing)
6. Fifth Embodiment: 3-transistor-type solid-state imaging device (4-pixel sharing)
7. Sixth Embodiment: 3-transistor-type solid-state imaging device (2-pixel sharing)
8. Seventh Embodiment: 4-transistor-type solid-state imaging device (8-pixel sharing)
9. Eighth Embodiment: 4-transistor-type solid-state imaging device (8-pixel sharing)
10. Ninth Embodiment: 3-transistor-type solid-state imaging device (8-pixel sharing)
11. Tenth Embodiment: 3-transistor-type solid-state imaging device (8-pixel sharing)
12. Eleventh Embodiment: 4-transistor-type solid-state imaging device (4-pixel sharing)
13. Twelfth Embodiment: electronic apparatus.

1. First Embodiment

First, before the configuration example of a solid-state imaging device according to a first embodiment is described, problems that can occur when the pixel size is formed finer to such a degree as to be, for example, 1 μm or less will be described more specifically. The problem accompanying the finer pixel size described above can occur in a case where the pixel sharing technology is applied to a back-illuminated CMOS image sensor having a high degree of freedom of layout.

In a case where pixel sharing technology is applied to the back-illuminated CMOS image sensor, as has been proposed, for example, in Japanese Unexamined Patent Application Publication No. 2011-049446, there is a case in which various MOS transistors that are shared are divided into two transistor groups and each transistor group is formed in a different area. In this case, for example, depending on conditions for the pixel size, the size and the number of the MOS transistors, and a layout technique, there is a case in which the occupation areas of the gate and/or the source/drain in the two transistor groups differ from each other. That is, there is a case where the layout configurations of the two transistor groups within the shared pixel unit become asymmetrical to each other. In this case, there is a probability that an output difference (sensitivity difference) occurs among the plurality of photodiodes within the shared pixel unit. Regarding this cause, for example, the following reasons (1) and/or (2) are considered.

(1) Among the light entering from the reverse surface, light that passes through near, for example, the gate formed of polysilicon of the MOS transistor is reflected and/or absorbed by, for example, the interface between the gate and Si, the side wall of the gate, and the like. Therefore, the output differs between the photodiode for which the gate of the MOS transistor is arranged in the surroundings thereof and the photodiode for which the gate of the MOS transistor is not arranged, and an output difference occurs between them.

(2) Electrons that are generated by photoelectric conversion in the area of the photodiode close to the source and/or the drain of the MOS transistor easily moves to the source and/or the drain with a comparatively deep potential compared to the potential of the photodiode. In this case, in the photodiode for which the source and/or the drain of the MOS transistor is arranged in the surroundings thereof, electrons are difficult to be detected, and the output decreases. Therefore, the output differs between the photodiode having the source and/or the drain of the MOS transistor arranged in its surroundings and the photodiode having the source and/or the drain of the MOS transistor not arranged, and an output difference occurs between them.

In the front-illuminated CMOS image sensor, since a wiring layer is provided on the light incidence side of the photodiode, the reflection and/or absorption of the incident light occurs mainly in the wiring layer. Furthermore, in the front-illuminated CMOS image sensor, in general, the area of the source and/or drain is shielded by the wiring layer. Consequently, the problem of the output difference (sensitivity difference) among a plurality of photodiodes due to the factor of the (2) rarely occur. That is, in the front-illuminated CMOS image sensor, the problem resulting from the asymmetry of the layout configuration between the two transistor groups rarely occur. However, also in the front-illuminated CMOS image sensor, the problem resulting from the asymmetry of the layout configuration between two transistor groups can occur depending on the layout of the wiring layer provided on the light incidence side of the photodiode.

Accordingly, in various embodiments described below, configuration examples of the solid-state imaging device capable of suppressing the occurrence of the problem (the variations in the sensitivity among a plurality of photodiodes) resulting from the asymmetry of the layout configuration between two transistor groups will be described below.

Overall Configuration of Solid-State Imaging Device

The overall configuration of a solid-state imaging device according to a first embodiment will be specifically described with reference to the drawings. In the present embodiment, a solid-state imaging device will be described by using a 4-transistor-type back-illuminated CMOS image sensor as an example.

FIG. 1 is a schematic block configuration of a CMOS image sensor according to the first embodiment. A CMOS image sensor 100 includes a pixel array unit 101, a vertical driving unit 102, a column processing unit 103, a horizontal driving unit 104, and a system control unit 105. The pixel array unit 101, the vertical driving unit 102, the column processing unit 103, the horizontal driving unit 104, and the system control unit 105 are formed on one semiconductor substrate (chip), which is not shown in FIG. 1.

In addition, the CMOS image sensor 100 includes a signal processing unit 108 and a data storage unit 109. The signal processing unit 108 and the data storage unit 109 may be configured by a digital signal processor (DSP) or an external signal processing unit that performs processing using software, which is provided on a substrate differing from that of the CMOS image sensor 100. The signal processing unit 108 and the data storage unit 109 may be mounted on the same semiconductor substrate as the semiconductor substrate on which, for example, the pixel array unit 101 is formed.

The pixel array unit 101 includes a plurality of unit pixels (hereinafter, referred to simply as pixels), which are two-dimensionally arranged in a matrix. Furthermore, each pixel is provided with a photoelectric conversion element (a photodiode in the present embodiment) that generates light electric charge (hereinafter, referred to simply as electric charge) of the amount of electric charge corresponding to the amount of incidence light and stores it inside. In the present embodiment, since the construction is formed in such a way that a plurality of pixels are shared, shared unit parts each formed of a plurality of pixels that are shared (hereinafter, referred to as shared pixel unit parts) are two-dimensionally arranged in a matrix, and the pixel array unit 101 is formed.

The pixel array unit 101 further includes a pixel driving line 106 formed along the row direction (in FIG. 1, the right and left direction) for each row of the shared pixel unit parts that are two-dimensionally arranged in a matrix, and a vertical signal line 107 formed along the column direction (in FIG. 1, the up and down direction) for each column thereof. Each pixel driving line 106 is connected to the corresponding shared pixel unit part, and each vertical signal line 107 is connected to the corresponding shared pixel unit part.

Furthermore, one end of the pixel driving line 106 is connected to the output end of the row of the vertical driving unit 102 corresponding to the pixel driving line 106, and one end of the vertical signal line 107 is connected to the input end of the column of the column processing unit 103 corresponding to the vertical signal line 107. In FIG. 1, for simplicity of description, the pixel driving line 106 for each row is indicated using one signal line. As will be described later, usually, a plurality of signal lines that drive a plurality of transistors forming a pixel are provided for each row.

The vertical driving unit 102 is constituted by, for example, circuit elements, such as a shift register and an address decoder. The vertical driving unit 102 outputs various driving signals to each pixel (shared pixel unit part) of the pixel array unit 101 so as to drive each pixel, and reads a signal from each pixel.

The column processing unit 103 performs, for each column of the shared pixel unit part of the pixel array unit 101, predetermined signal processing on a pixel signal that is output through the vertical signal line 107 from a certain pixel within the shared pixel unit part of the selected row and temporarily stores the pixel signal after the signal processing.

Specifically, the column processing unit 103 performs at least a noise reduction process, such as, for example, a correlated double sampling (CDS) process, as signal processing. As a result of the CDS process in the column processing unit 103, for example, it is possible to remove reset noise, and fixed pattern noise unique to the pixel, which results from variations in the threshold value of an amplification transistor. In addition to the above-mentioned noise reduction function, for example, an analog to digital (AD) conversion function may be provided in the column processing unit 103, so that a digital signal is output.

The horizontal driving unit 104 is constituted by, for example, circuit elements, such as a shift register and an address decoder, and selectively scans a unit circuit (not shown) provided for each column of the column processing unit 103 sequentially. As a result of the selective scanning of the horizontal driving unit 104, the pixel signal on which signal processing has been performed in each unit circuit of the column processing unit 103 is output to the signal processing unit 108.

The system control unit 105 is constituted by, for example, a timing generator that generates timing signals of various operations of the CMOS image sensor 100. Various timing signals generated by the system control unit 105 are supplied to the vertical driving unit 102, the column processing unit 103, and the horizontal driving unit 104, and each unit is driven by the control in accordance with these timing signals.

The signal processing unit 108 performs various signal processing, such as, for example, an addition process, on the pixel signal output from the column processing unit 103. Furthermore, the data storage unit 109 temporarily stores data necessary for performing predetermined signal processing in the signal processing unit 108.

Configuration of Shared Pixel Unit Part

Figure 2:
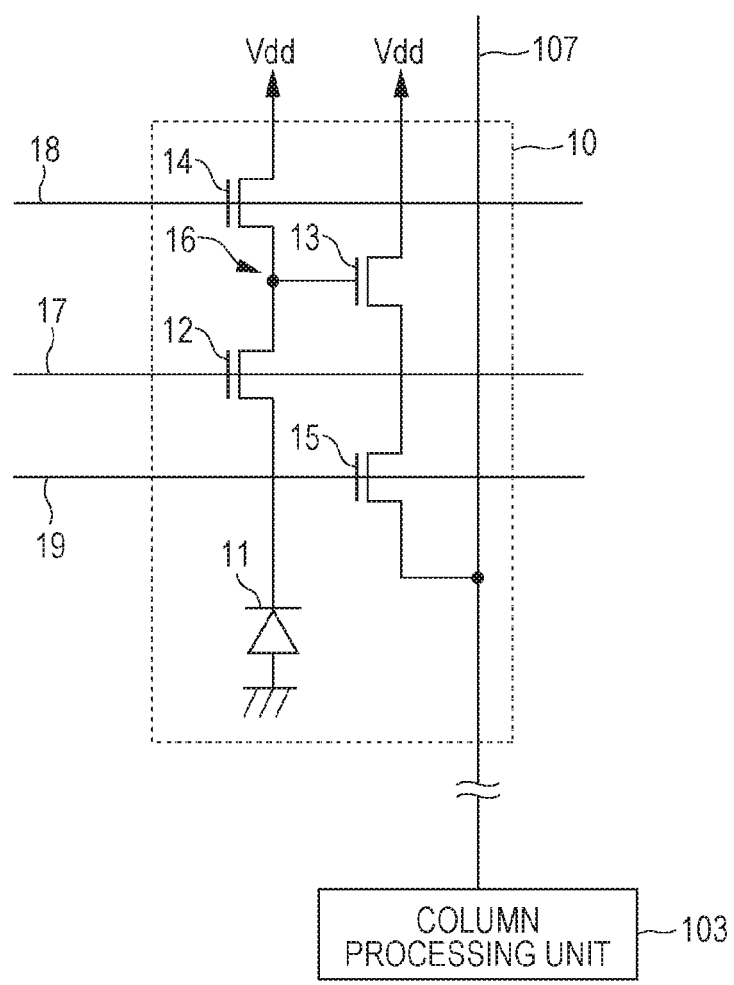
FIG. 2 is an equivalent circuit diagram of a unit pixel in a 4-transistor-type solid-state imaging device.

The configuration of the shared pixel unit part in the pixel array unit 101 of the present embodiment will be described. Before that, for comparison purposes, the configuration of each pixel in a case where the pixel sharing technology is not used in a 4-transistor-type CMOS image sensor will be described. FIG. 2 illustrates an equivalent circuit of a pixel in a case where the pixel sharing technology is not used.

The pixel 10 usually includes one photodiode 11 (photoelectric conversion element), various active elements formed of MOS transistors provided for the photodiode 11, and a floating diffusion area 16 (referred to as an FD area 16). In the example shown in FIG. 2, the pixel 10 includes, as various active elements, a transfer transistor 12, an amplification transistor 13, a reset transistor 14, and a selection transistor 15. Here, an example in which various transistors are formed by MOS transistors whose carrier polarity is N-type is shown.

Furthermore, in the example shown in FIG. 2, three signal wires (pixel driving lines 106), that is, a transfer wire 17, a reset wire 18, and a selection wire 19, are provided in the row direction (in FIG. 2, in the right and left direction) for one pixel 10, and the vertical signal line 107 is provided in the column direction (in FIG. 2, in the up and down direction). Although not shown in FIG. 2, the pixel 10 is provided with two-dimensional wiring to be used as a light-shielding film in the pixel boundary portion and the black level detection pixel.

The photodiode 11 converts (photoelectrically converts) incident light into electric charge (here, electrons) of the amount corresponding to the amount of light of the incident light. The anode of the photodiode 11 is grounded.

The transfer transistor 12 is provided between the cathode of the photodiode 11 and the FD area 16. The transfer transistor 12 is turned on when a high-level signal is input to the gate from the vertical driving unit 102 through the transfer wire 17, and transfers the electric charge (electrons) that has been photoelectrically converted by the photodiode 11 to the FD area 16. The electric charge transferred to the FD area 16 is converted into a voltage (electrical potential) in the FD area 16.

The gate of the amplification transistor 13 is connected to the FD area 16. Furthermore, the drain of the amplification transistor 13 is connected to the supply terminal of the power-supply voltage Vdd, and the source of the amplification transistor 13 is connected to the vertical signal line 107 through the selection transistor 15. The amplification transistor 13 amplifies the electrical potential (voltage signal) of the FD area 16, and outputs the amplified signal, as a light storage signal (pixel signal), to the selection transistor 15.

The reset transistor 14 is provided between the supply terminal of the power-supply voltage Vdd and the FD area 16. The reset transistor 14 is turned on when a high-level signal is input to the gate thereof from the vertical driving unit 102 through the reset wire 18, and the electrical potential of the FD area 16 is reset to the power-supply voltage Vdd.

The selection transistor 15 is provided between the amplification transistor 13 and the vertical signal line 107. The selection transistor 15 is turned on when a high-level signal is input to the gate thereof from the vertical driving unit 102 through the selection wire 19, and outputs the voltage signal amplified by the amplification transistor 13 to the vertical signal line 107. That is, in the 4-transistor-type CMOS image sensor 100, the switching between the selection and the non-selection of a pixel is controlled by the selection transistor 15. The voltage signal of each pixel output to the vertical signal line 107 is transferred to the column processing unit 103.

Figure 3:
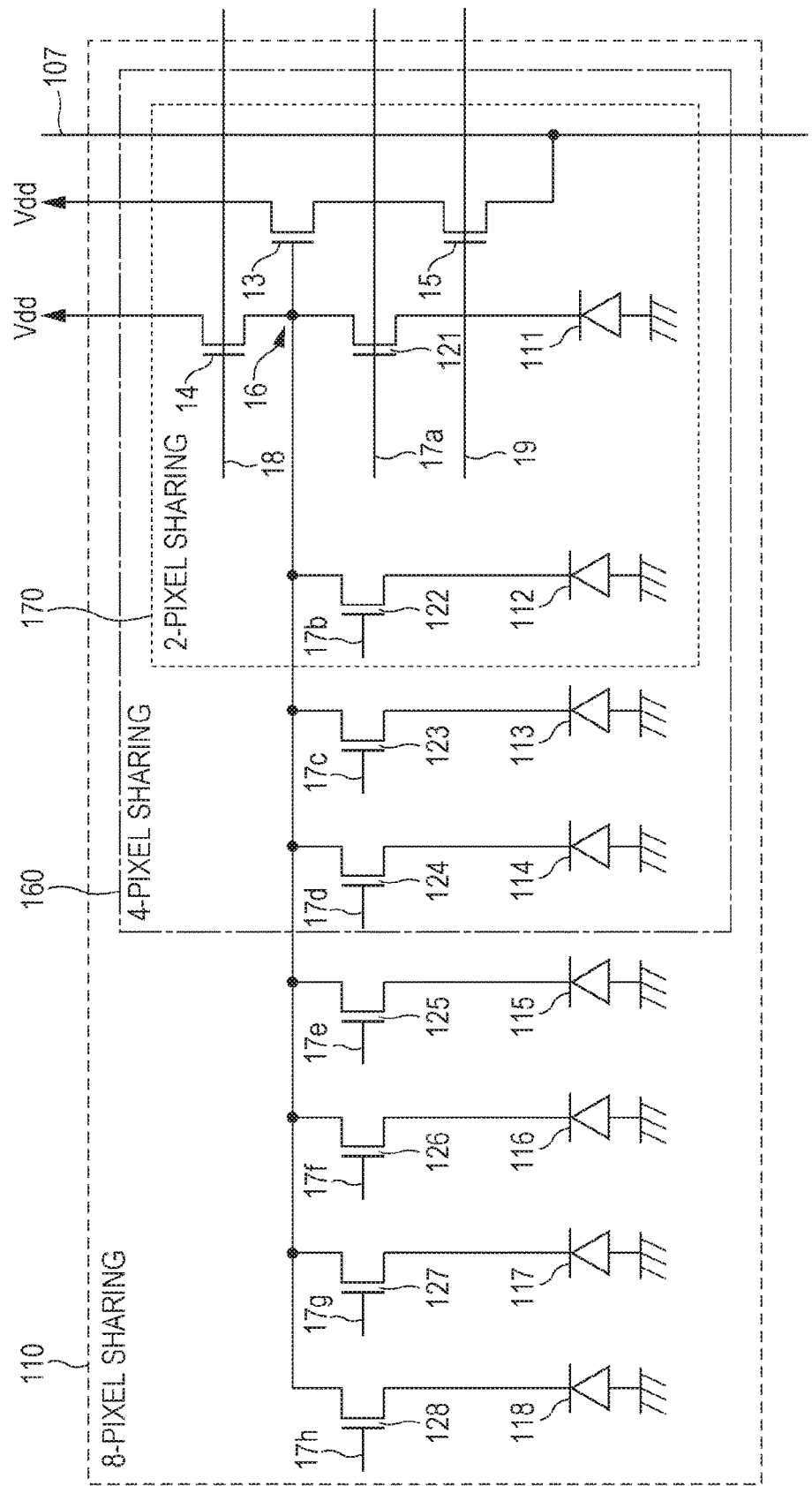
FIG. 3 is an equivalent circuit diagram of a shared pixel unit part in a case where pixels are shared in the 4-transistor-type solid-state imaging device.

Next, the configuration of the shared pixel unit part in a case where the pixel sharing technology is used in the 4-transistor-type CMOS image sensor will be described. FIG. 3 illustrates an equivalent circuit of a shared pixel unit part within the pixel array unit 101. FIG. 3 illustrates an example in which one shared pixel unit part 110 shares eight pixels. Furthermore, in the shared pixel unit part 110 shown in FIG. 3, components, which are the same as those of the pixel 10 shown in FIG. 2, are designated with the same reference numerals.

The shared pixel unit part 110 includes eight photodiodes (first photodiode 111 to eighth photodiode 118). Furthermore, the shared pixel unit part 110 includes eight transfer transistors (first transfer transistor 121 to eighth transfer transistor 128), which are provided in such a manner as to correspond to the first photodiode 111 to the eighth photodiode 118, respectively. In addition, the shared pixel unit part 110 includes the amplification transistor 13, the reset transistor 14, the selection transistor 15, and the FD area 16 which are shared among the eight pixels.

The amplification transistor 13, the reset transistor 14, the selection transistor 15, and the FD area 16 are configured in the same way as those corresponding to the pixel 10 described with reference to FIG. 2, and have the same functions. Furthermore, the first photodiodes 111 to the eighth photodiode 118 can be configured in the same way as the photodiode 11 described with reference to FIG. 2. The anode of each photodiode is grounded, and the cathode of each photodiode is connected to the source of the transfer transistor.

The first transfer transistor 121 to the eighth transfer transistor 128 can be configured in the same way as the transfer transistor 12 described with reference to FIG. 2. The first transfer transistor 121 to the eighth transfer transistor 128 are connected to the eight corresponding transfer wires 17*a* to 17*h*. In addition, each transfer transistor is provided between the corresponding photodiode and the FD area 16, and the drain of each transfer transistor is connected to the FD area 16. That is, in the case where eight pixels are shared as in the present embodiment, eight circuits each formed of a transfer transistor and a photodiode corresponding thereto are provided in the shared pixel unit part 110, and the eight circuits are connected in parallel between the FD area 16 and the ground.

Layout of Shared Pixel Unit Part (1) Layout of Entire Shared Pixel Unit Part

Figure 4:
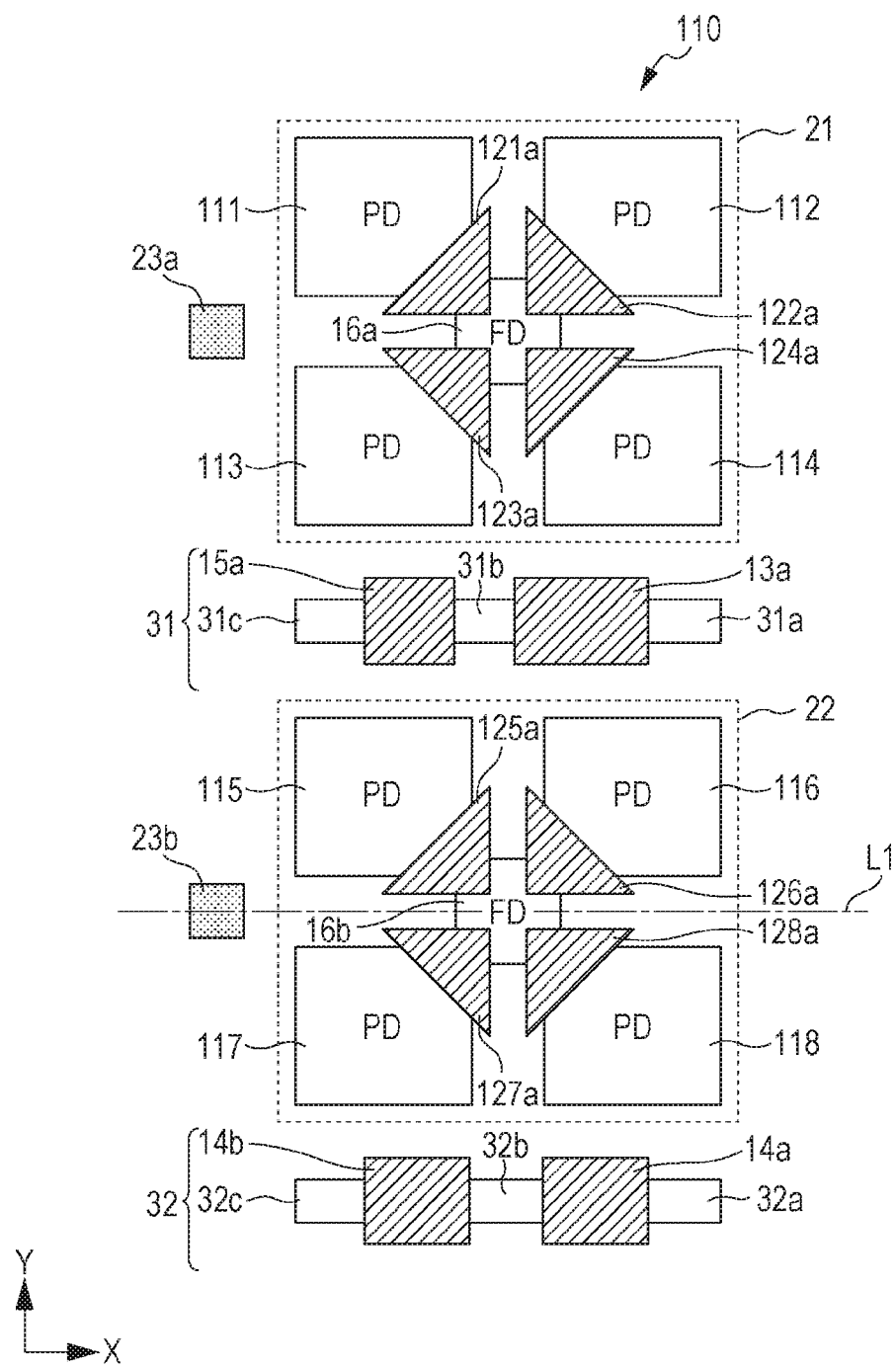
FIG. 4 is a schematic layout plan view of a shared pixel unit part in the solid-state imaging device according to the first embodiment.

FIG. 4 illustrates a schematic plan view of a layout configuration of a shared pixel unit part 110 in the CMOS image sensor 100 (solid-state imaging device) of the present embodiment. In the layout configuration of the shared pixel unit part 110 shown in FIG. 4, components corresponding to the components within the equivalent circuit of the shared pixel unit part 110 shown in FIG. 3 are designated with the same reference numerals.

The shared pixel unit part 110 includes a first light-receiving unit 21 and a second light-receiving unit 22. The first light-receiving unit 21 and the second light-receiving unit 22 are arranged in the vertical direction (in the Y direction in FIG. 4) within the shared pixel unit part 110. As will be described later, in the present embodiment, the FD area 16 (floating diffusion unit) that is shared by eight pixels is provided separately in respective light-receiving units (a first FD area 16a and a second FD area 16b).

Furthermore, the shared pixel unit part 110 includes a first transistor group 31 and a second transistor group 32. That is, in the present embodiment, various transistors that are shared among the eight pixels are arranged separately in two transistor groups. In the present embodiment, the amplification transistor 13 and the selection transistor 15 are arranged in the first transistor group 31, and the reset transistor 14 is arranged in the second transistor group 32.

Furthermore, as shown in FIG. 4, the first transistor group 31 is arranged between the first light-receiving unit 21 and the second light-receiving unit 22. The second transistor group 32 is arranged in an area on a side opposite to the arrangement side of the first transistor group 31 of the second light-receiving unit 22 in the surrounding area of the second light-receiving unit 22.

In the present embodiment, each transistor group is formed to extend along the horizontal direction (in the X direction in FIG. 4) from a position in the vicinity of one of the end portions of the light-receiving unit to a position in the vicinity of the other of the end portions. In the present embodiment, the transistor groups are arranged so that the positions at both ends of the first transistor group 31 in the horizontal direction become substantially the same positions at both ends of the second transistor group 32.

In addition, the shared pixel unit part 110 includes a first well contact 23a and a second well contact 23b. Although not shown in FIG. 4, the first light-receiving unit 21, the second light-receiving unit 22, the first transistor group 31, and the second transistor group 32 are formed in a predetermined well area formed in a Si substrate. In the present embodiment, a well contact that electrically connects the well area and the internal wiring is provided separately in two portions. Specifically, in the present embodiment, a first well contact 23a and a second well contact 23b are provided for the first light-receiving unit 21 and the second light-receiving unit 22, respectively.

In the surrounding area of the first light-receiving unit 21, the first well contact 23a is arranged in an area in one of the sides (the left side in FIG. 4) in the horizontal direction (in the X direction in FIG. 4) of the first light-receiving unit 21), and is arranged at a position opposing the first FD area 16a (the center of the first light-receiving unit 21. Furthermore, in the surrounding area of the second light-receiving unit 22, the second well contact 23b is arranged in an area in one of the sides in the horizontal direction of the second light-receiving unit 22, and is arranged at a position opposing the second FD area 16b (the center of the second light-receiving unit 22). However, the arrangement position of each well contact is not limited to the example shown in FIG. 4. For example, in the surrounding area of the corresponding light-receiving unit, each well contact may be arranged at a position of the other side (in FIG. 4, the right side) in the horizontal direction (in the X direction in FIG. 4) of the light-receiving unit, and may be arranged at a position opposing the FD area (the center of the corresponding light-receiving unit).

Furthermore, the above-mentioned each unit within the shared pixel unit part 110 is electrically connected by using various contacts and internal wiring (not shown) so that the connection relationship of each unit in the equivalent circuit shown in FIG. 3 is satisfied. In the present embodiment, the shared pixel unit parts 110 of the layout configuration shown in FIG. 4 are two-dimensionally arranged in a matrix, thereby forming the pixel array unit 101.

(2) Layout of Each Unit of Shared Pixel Unit Part

The layout configuration of each unit within the shared pixel unit part 110 will be described with reference to FIG. 4.

The first light-receiving unit 21 includes a first photodiode 111 to a fourth photodiode 114 (photoelectric conversion units), which are arranged by 2×2 in the vertical direction (in the Y direction in FIG. 4) and in the horizontal direction (in the X direction in FIG. 4), and a first transfer transistor 121 to a fourth transfer transistor 124 (transfer unit). Furthermore, the first light-receiving unit 21 includes the first FD area 16a shared in the pixels. In FIG. 4, for simplicity of description, only respective gates (a first transfer gate 121a to a fourth transfer gate 124a) of the first transfer transistor 121 to the fourth transfer transistor 124 are shown.

In the present embodiment, as shown in FIG. 4, the first FD area 16a is arranged in the center of the formation area of the first photodiodes 111 to the fourth photodiode 114, which are arranged by 2×2, that is, in the center of the first light-receiving unit 21. The first transfer gate 121a to the fourth transfer gate 124a are arranged between the first FD area 16a and the first photodiodes 111 to the fourth photodiode 114. At this time, the first transfer gate 121a to the fourth transfer gate 124a are arranged in such a manner as to be directly connected to the first photodiode 111 to the fourth photodiode 114, respectively.

The second light-receiving unit 22 includes a fifth photodiode 115 to an eighth photodiode 118 (photoelectric conversion units), which are arranged by 2×2 in the vertical direction and in the horizontal direction, and a fifth transfer transistor 125 to an eighth transfer transistor 128 (transfer unit). Furthermore, the second light-receiving unit 22 includes the second FD area 16b shared among four pixels. In FIG. 4, for simplicity of description, respective gates (fifth transfer gate 125a to eighth transfer gate 128a) of the fifth transfer transistor 125 to the eighth transfer transistor 128 are shown.

In the present embodiment, as shown in FIG. 4, the second FD area 16b is arranged in the center of the formation area of the fifth photodiode 115 to the eighth photodiode 118, which are arranged by 2×2, that is, in the center of the second light-receiving unit 22. The second FD area 16b is electrically connected to the first FD area 16a through contacts and internal wiring (not shown). Furthermore, the fifth transfer gate 125a to the eighth transfer gate 128a are arranged between the second FD area 16b and the fifth photodiode 115 to the eighth photodiode 118, respectively. At this time, the fifth transfer gate 125a to the eighth transfer gate 128a are arranged in such a manner as to be directly connected to the fifth photodiode 115 to the eighth photodiode 118, respectively. That is, the arrangement of each unit forming the second light-receiving unit 22 is the same as that of the first light-receiving unit 21.

The first transistor group 31 includes a gate 13a of an amplification transistor 13 (hereinafter, referred to as an amplification gate), a gate 15a of the selection transistor 15

(hereinafter, referred to as a selection gate), and a first source/drain 31a to a third source/drain 31c. In the present embodiment, along the horizontal direction (in the X direction in FIG. 4), the first source/drain 31a, the amplification gate 13a, the second source/drain 31b, the selection gate 15a, and the third source/drain 31c are arranged in this order. At this time, each gate and each source/drain are arranged so that the third source/drain 31c is positioned on the side of the first well contact 23a in the horizontal direction.

In the first transistor group 31, the first source/drain 31a, the amplification gate 13a, and the second source/drain 31b constitute the amplification transistor 13. The first source/drain 31a and the second source/drain 31b act as the drain and the source of the amplification transistor 13, respectively. Furthermore, in the first transistor group 31, the second source/drain 31b, the selection gate 15a, and the third source/drain 31c constitute the selection transistor 15. The second source/drain 31b and the third source/drain 31c act as the drain and the source of the selection transistor 15, respectively. That is, in the first transistor group 31, the second source/drain 31b is shared as the source of the amplification transistor 13 and the drain of the selection transistor 15.

Furthermore, in the CMOS image sensor 100 of the present embodiment, in order to obtain more satisfactory characteristics, it is preferable that the area of the amplification gate 13a be increased further. Accordingly, the area of the amplification gate 13a is increased to more than the area of the selection gate 15a as shown in FIG. 4, because. Specifically, the extension length in the horizontal direction (X direction) of the amplification gate 13a is lengthened more than that of the selection gate 15a.

The second transistor group 32 is constituted by two reset transistors 14, and the two reset transistors 14 are arranged along the horizontal direction (in the X direction in FIG. 4). That is, in the CMOS image sensor 100 of the present embodiment, in the shared pixel unit part 110, one reset transistor 14 is added.

In this case, it is necessary to secure an area for adding one reset transistor in the formation area of the second transistor group 32. However, in the present embodiment, as shown in FIG. 4, the well contact is arranged at a position in one of the sides (left side) in the horizontal direction (X direction) of the light-receiving unit in the surroundings of the formation area of the light-receiving unit, and is not arranged in the surroundings of the transistor. Therefore, in the layout configuration of the shared pixel unit part 110 of the present embodiment, it is possible to efficiently secure an area for adding one reset transistor in the formation area of the second transistor group 32.

Furthermore, the second transistor group 32 includes a gate 14a of the first reset transistor (hereinafter, referred to as a first reset gate), and a gate 14b of the second reset transistor (hereinafter, referred to as a second reset gate). In addition, the second transistor group 32 includes a fourth source/drain 32a to a sixth source/drain 32c.

Then, in the present embodiment, along the horizontal direction (in the X direction in FIG. 4), the fourth source/drain 32a, the first reset gate 14a, the fifth source/drain 32b, the second reset gate 14b, and the sixth source/drain 32c are arranged in this order. At this time, in order that the sixth source/drain 32c is positioned on the second well contact 23b side in the horizontal direction, each gate and each source/drain are arranged. Furthermore, at this time, the first reset gate 14a and the second reset gate 14b are arranged at positions substantially opposing the amplification gate 13a and the selection gate 15a, respectively, with the second light-receiving unit 22 in between.

In the second transistor group 32, the fourth source/drain 32a, the first reset gate 14a, and the fifth source/drain 32b constitute a first reset transistor. Furthermore, in the second transistor group 32, the fifth source/drain 32b, the second reset gate 14b, and the sixth source/drain 32c constitute a second reset transistor.

In the present embodiment, two reset transistors are connected in parallel between the power-supply voltage Vdd and the FD area 16. Therefore, in the second transistor group 32, the fifth source/drain 32b is shared as the source or the drain of the two reset transistors. In the case where the fifth source/drain 32b is used as the source of the two reset transistors, the fourth source/drain 32a and the sixth source/drain 32c act as the drain. In contrast, in the case where the fifth source/drain 32b is used as the drain of the two reset transistors, the fourth source/drain 32a and the sixth source/drain 32c act as the source.

In the present embodiment, the area of the first reset gate 14a is made equal to the area of the second reset gate 14b. In the present embodiment, the area of each reset gate is made smaller than the area of the amplification gate 13a. However, at this time, the area and the shape of each gate and source/drain are set so that the total sum of the area of the amplification gate 13a and the area of the selection gate 15a becomes substantially the same as the total sum of the area of the first reset gate 14a and the area of the second reset gate 14b. That is, the area and the shape of each gate and source/drain are set so that the occupation area of the gate and the source/drain in the first transistor group 31 becomes substantially the same as the occupation area of the gate and the source/drain of the second transistor group 32, respectively.

In the case where each transistor group is configured in the manner described above, the layout configuration of the first transistor group 31 (first layout configuration: the pattern and the size of the gate and source/drain) becomes substantially symmetrical to the layout configuration of the second transistor group 32 (second layout configuration). In more detail, as shown in FIG. 4, the layout configurations of both the transistor groups become substantially symmetrical to each other with respect to the straight line L1 that extends in the direction (X direction) passing the center between the first transistor group 31 and the second transistor group 32 and intersecting at right angles to the arrangement direction (Y direction) between both the transistor groups.

Therefore, in the CMOS image sensor 100 of the present embodiment, the problems that arise due to the asymmetry of the layout configurations between the first transistor group 31 and the second transistor group 32 can be solved. Specifically, the influence of the gate and/or various sources/drains of various transistors on the output (sensitivity) of each photodiode can be made uniform among a plurality of photodiodes that are shared. As a result, in the layout configuration of the first transistor group 31 and the second transistor group 32 of the present embodiment, it is possible to suppress variations in characteristics, such as, for example, sensitivity (output), among eight photodiodes in the shared pixel unit part 110.

As a technique for improving the symmetry of the layout configuration of the first transistor group and that of second transistor group, for example, in other than the technique of the present embodiment, a technique is also considered in which the transistor group of a large size is reduced in accordance with the transistor group of a small size. However, in this technique, in the case where it is necessary to make pixels fine, such problems as the characteristics of the transistors becoming undesirable or processing becoming difficult, occur. In the present embodiment, on the contrary, in the transistor group having a small occupation area (size) of the gate and the source/drain, a transistor is added to increase the occupation area, and the resultant occupation area is made substantially equal to the occupation area of the transistor group of the large size. Therefore, in the present embodiment, the problem that can occur in the reduction technique may be solved.

Furthermore, as in the present embodiment, even if the symmetry of the layout configuration between two transistor groups is improved, in the case where the layout of the internal wiring that is connected to each transistor group is made to be asymmetrical (for example, the spacing of internal wiring is made non-uniform), there is a probability that variations occur in the interwiring capacitance. In particular, when there are variations in the interwiring capacitance with respect to the transfer gate, there is a probability that variations occur in the amount of signal saturated among a plurality of photodiodes within the shared pixel unit part. Therefore, in the present embodiment, it is preferable that the layout of the internal wiring connected to each transistor group be symmetrical (for example, the spacing of internal wiring is made uniform).

In the present embodiment, an example in which both reset transistors provided in the second transistor group 32 act as transistors has been described. However, the present disclosure is not limited to this. For example, one of the reset transistors may be made not to function (act) as a transistor. At this time, as a technique for making one of the reset transistors not function as a transistor, for example, a technique in which a contact, wires or the like is not connected to the reset transistor (technique of not being electrically connected), a technique of not supplying a driving signal to the gate, or the like can be used. Furthermore, as a technique of making one of the reset transistors not function as a transistor, a technique of applying a certain constant voltage to the gate so as to cause the reset transistor to be constantly placed in an OFF state may be used.

Furthermore, in the embodiment, an example in which the first transistor group 31 is provided with the amplification transistor 13 and the selection transistor 15, and the second transistor group 32 is provided with reset transistor 14 has been described. However, the present disclosure is not limited to this. The assignment of the type (functions) of the transistors to be provided in each transistor group can be set as desired. For example, the first transistor group 31 may be provided with the amplification transistor 13 and the reset transistor 14, and the second transistor group 32 may be provided with the selection transistor 15. However, in the transistor group in which only one type of transistor is arranged, similarly to FIG. 4, one transistor of the same type is added, so that the layout configurations of the two transistor groups become substantially symmetrical to each other.

2. Various Modifications of First Embodiment

The layout configuration of the shared pixel unit part according to the present disclosure is not limited to the configuration example described in the first embodiment (FIG. 4), and various modifications are considered. Here, various modifications of the layout configuration of the shared pixel unit part 110 of the first embodiment will be described.

Modification 1

In the first embodiment, an example in which one kind of transistor (reset transistor) among three transistors that are shared is added has been described. However, the present disclosure is not limited to this. In the plural kinds of transistors, two or more types of transistors may be added. In modification 1, as an example of the configuration, an example in which the amplification transistor 13, the reset transistor 14, and the selection transistor 15, which are shared, are each added (example in which a total of three transistors are added) will be described.

Figure 5:
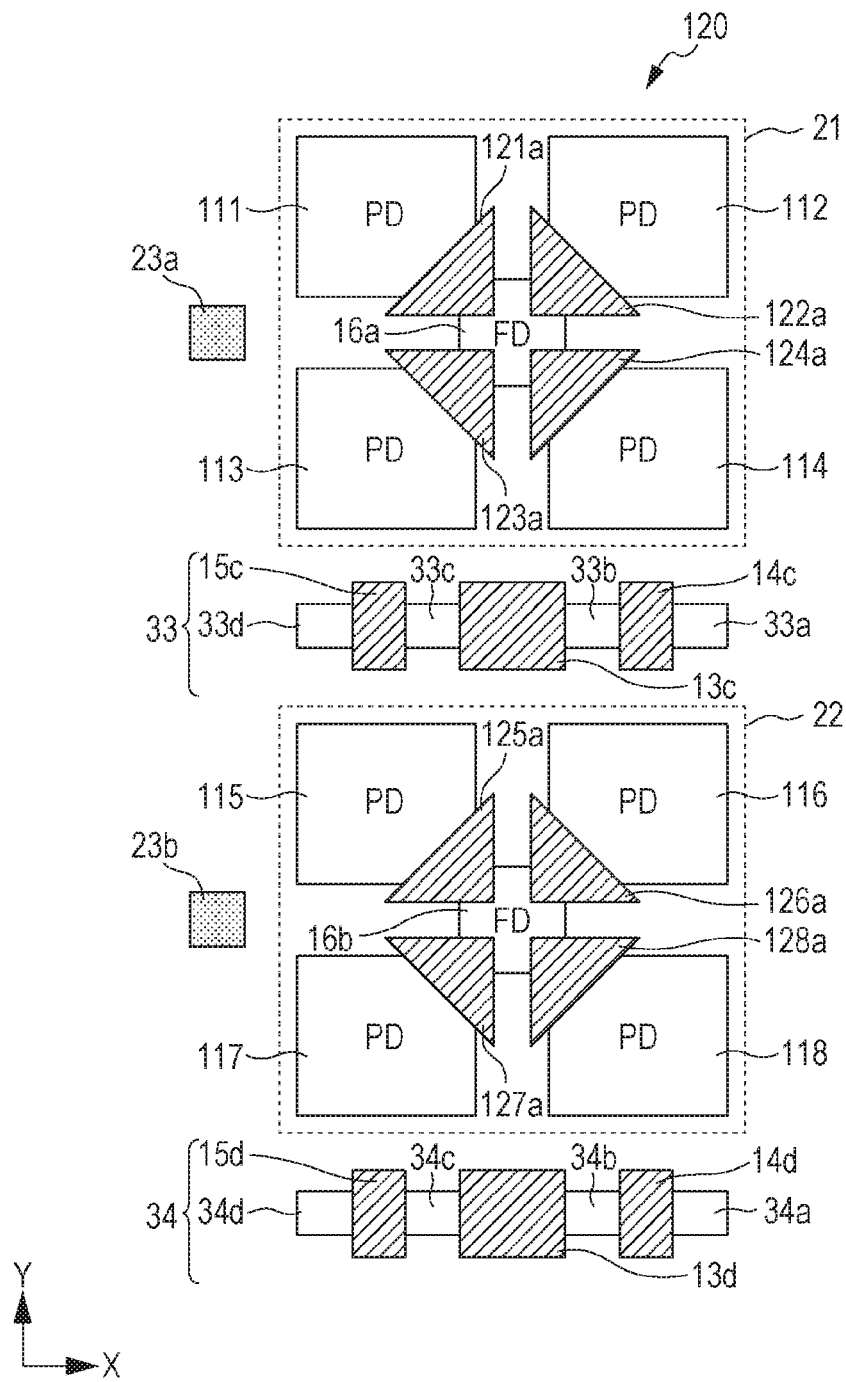
FIG. 5 is a schematic layout plan view of a shared pixel unit part of modification 1.

FIG. 5 illustrates a schematic plan view of the layout configuration of the shared pixel unit part in a CMOS image sensor of modification 1. In a shared pixel unit part 120 of modification 1 shown in FIG. 5, components, which are the same as the components of the shared pixel unit part 110 of the first embodiment shown in FIG. 4, are designated with the same reference numerals.

The shared pixel unit part 120 is a shared pixel unit part in which eight pixels are shared, and is constituted by the first light-receiving unit 21, the second light-receiving unit 22, the first well contact 23a, the second well contact 23b, a first transistor group 33, and a second transistor group 34.

As is clear from the comparison between FIG. 5 and FIG. 4, the shared pixel unit part 120 of this example is prepared such that the configuration of the first transistor group and the second transistor group in the shared pixel unit part 110 of the first embodiment is changed. The configuration other than the first transistor group 33 and the second transistor group 34 in this example is the same as the corresponding configuration of the first embodiment. Therefore, here, only the configuration of the first transistor group 33 and the second transistor group 34 will be described.

As shown in FIG. 5, the first transistor group 33 is arranged between the first light-receiving unit 21 and the second light-receiving unit 22. Furthermore, the second transistor group 34 is arranged in an area on a side opposite to the arrangement side of the first transistor group 33 of the second light-receiving unit 22 in the surrounding area of the second light-receiving unit 22.

Also, in this example, similarly to the first embodiment, each transistor group is formed so as to extend from a position in the vicinity of one of the ends of the light-receiving unit to the other of the end portions along the horizontal direction (in the X direction in FIG. 5). Furthermore, at this time, in this example, each transistor group is arranged so that the positions at both ends of the first transistor group 33 in the horizontal direction become substantially the same as the positions at both ends of the second transistor group 34, respectively.

As shown in FIG. 5, the first transistor group 33 includes a first amplification gate 13c of the first amplification transistor, a first reset gate 14c of the first reset transistor, and a first selection gate 15c of the first selection transistor. Furthermore, the first transistor group 33 includes a first source/drain 33a to a fourth source/drain 33d. The first source/drain 33a, the first reset gate 14c, the second source/drain 33b, the first amplification gate 13c, the third source/drain 33c, the first selection gate 15c, and the fourth source/drain 33d are arranged in this order along the horizontal direction (X direction). At this time, each gate and each source/drain are arranged so that the fourth source/drain 33d is positioned on the first well contact 23a side in the horizontal direction (X direction).

Furthermore, in this example, as shown in FIG. 5, similarly to the first embodiment, the area of the first amplification gate 13c is increased to more than the area of the first reset gate 14c and the first selection gate 15c. Specifically, the extension length in the horizontal direction (X direction) of the first amplification gate 13c is lengthened more than that of the first reset gate 14c and the first selection gate 15c. In addition, in this example, in the horizontal direction (X direction), the first reset gate 14c and the first selection gate 15c are arranged at a position substantially symmetrical to the first amplification gate 13c.

In the first transistor group 33 of this example, the first source/drain 33a, the first reset gate 14c, and the second source/drain 33b constitute the first reset transistor. The first source/drain 33a and the second source/drain 33b act as the source and the drain of the first reset transistor, respectively.

Furthermore, in the first transistor group 33, the second source/drain 33b, the first amplification gate 13c, and the third source/drain 33c constitute the first amplification transistor. The second source/drain 33b and the third source/drain 33c act as the drain and the source of the first amplification transistor, respectively. That is, in the first transistor group 33, the second source/drain 33b is shared as the drain of the first reset transistor and the drain of the amplification transistor. In this case, the second source/drain 33b is connected to the supply terminal of the power-supply voltage Vdd.

In addition, in the first transistor group 33, the third source/drain 33c, the first selection gate 15c, and the fourth source/drain 33d constitute the first selection transistor. The third source/drain 33c and the fourth source/drain 33d act as the drain and the source of the first selection transistor, respectively. That is, in the first transistor group 33, the third source/drain 33c is shared as the source of the first amplification transistor and the drain of the first selection transistor.

As shown in FIG. 5, the second transistor group 34 includes a second amplification gate 13d of a second amplification transistor, a second reset gate 14d of a second reset transistor, and a second selection gate 15d of a second selection transistor. Furthermore, the second transistor group 34 includes a fifth source/drain 34a to an eighth source/drain 34d. The fifth source/drain 34a, the second reset gate 14d, the sixth source/drain 34b, the second amplification gate 13d, the seventh source/drain 34c, the second selection gate 15d, and the eighth source/drain 34d are arranged in this order along the horizontal direction (X direction). At this time, each gate and each source/drain are arranged so that the eighth source/drain 34d is positioned on the second well contact 23b side in the horizontal direction (X direction).

In this example, the second amplification gate 13d, the second reset gate 14d, and the second selection gate 15d of the second transistor group 34 are configured in the same way as the first amplification gate 13c, the first reset gate 14c, and the first selection gate 15c of the first transistor group 33. Furthermore, in this example, the fifth source/drain 34a to the eighth source/drain 34d of the second transistor group 34 are configured in the same way as the first source/drain 33a to the fourth source/drain 33d of the first transistor group 33. That is, in this example, the layout pattern and the size (area) of the various gates and various sources/drains of the second transistor group 34 become the same as those of the first transistor group 33.

In the shared pixel unit part 120 of this example, in order that the equivalent circuit shown in FIG. 3 is obtained, various gates and various sources/drains in the first transistor group 33 are electrically connected to those in the second transistor group 34 by using contacts and internal wiring (not shown). At this time, the first amplification transistor in the first transistor group 33 and the second amplification transistor in the second transistor group 34 are connected in parallel with each other through contacts and internal wiring (not shown). Furthermore, the first reset transistor in the first transistor group 33 and the second reset transistor in the second transistor group 34 are connected in parallel with each other through contacts and internal wiring (not shown). In addition, the first selection transistor in the first transistor group 33 and the second selection transistor in the second transistor group 34 are connected in parallel with each other through contacts and internal wiring (not shown).

In the case where each transistor group is configured in the manner described above, also, in this example, the layout configuration of the first transistor group 33 becomes symmetrical to that of the second transistor group 34 in the shared pixel unit part 120. In this example, not only the size (occupation area) of various gates and various sources/drains of the first transistor group 33, but also the layout pattern thereof becomes the same as that of the second transistor group 34. Therefore, also, in the CMOS image sensor of this example, it is possible to solve the problem that occur due to the asymmetry of the layout configurations between the first transistor group 33 and the second transistor group 34, and thus, the same advantages as those of the first embodiment are obtained.

Also, in this example, one of the two transistors having the same functions may be made not to function as a transistor.

Furthermore, in this example, an example in which the second source/drain 33b of the first transistor group 33 and the sixth source/drain 34b of the second transistor group 34 are connected to the supply terminal of the power-supply voltage Vdd and are shared between the amplification transistor 13 and the reset transistor 14 has been described. However, the present disclosure is not limited to this. In a case where the second source/drain 33b and the sixth source/drain 34b are not shared between the amplification transistor 13 and the reset transistor 14, these sources/drains may be divided into two portions. In this case, the source/drain on the amplification gate side among the sources/drains that have been divided into two portions may be used as the drain of the amplification transistor 13 and the source/drain on the reset gate side may be used as the source of the reset transistor 14.

Modification 2

In the manner described above, as factors of problems that occur due to the asymmetry of the layout configurations between two transistor groups, two factors, that is, influence of gate, and influence of source/drain are considered. In the first embodiment, influences due to two factors can be made uniform among a plurality of photodiodes. The present disclosure is not limited to this. The influence due to one of the two factors may be made uniform among a plurality of photodiodes. In modification 2, a configuration example in which the influence of the gate on the output characteristics (sensitivity characteristics) of the photodiode is made uniform among a plurality of photodiodes will be described.

Figure 6:
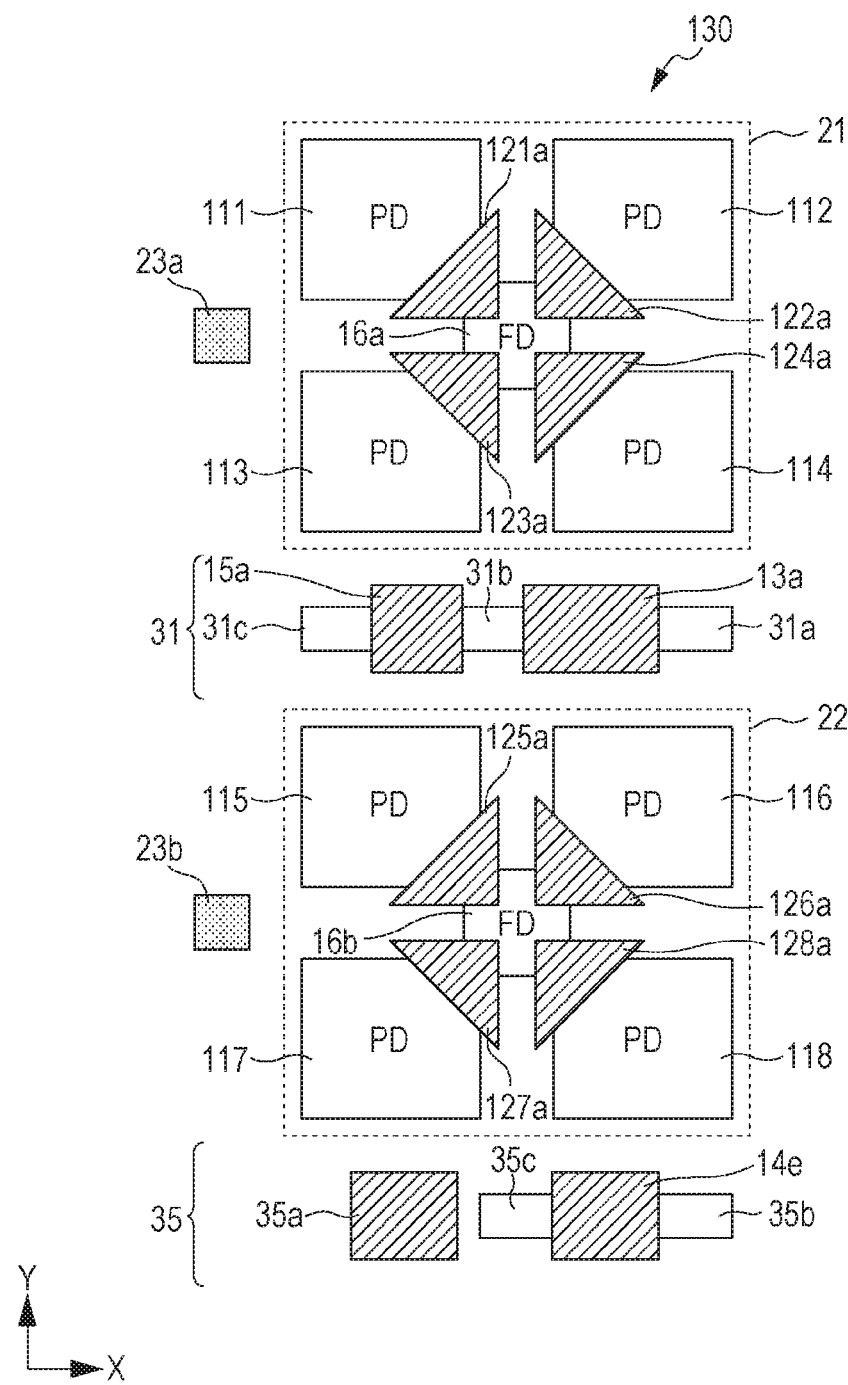
FIG. 6 is a schematic layout plan view of a shared pixel unit part of modification 2.

FIG. 6 illustrates a schematic plan view of the layout configuration of the shared pixel unit part in a CMOS image sensor of modification 2. In a shared pixel unit part 130 of modification 2 shown in FIG. 6, components, which are the same as those of the shared pixel unit part 110 of the first embodiment shown in FIG. 4, are designated with the same reference numerals.

The shared pixel unit part 130 is a shared pixel unit part in which eight pixels are shared, and is constituted by the first light-receiving unit 21, the second light-receiving unit 22, the first well contact 23a, the second well contact 23b, the first transistor group 31, and a second transistor group 35.

As is clear from the comparison between FIG. 6 and FIG. 4, the shared pixel unit part 130 of this example is prepared such that the configuration of the second transistor group in the shared pixel unit part 110 of the first embodiment is changed. The configuration other than the second transistor group 35 in this example is the same as the configuration corresponding to the first embodiment. Therefore, here, only the configuration of the second transistor group 35 will be described.

As shown in FIG. 6, the second transistor group 35 is arranged in an area on a side opposite to the arrangement side of the first transistor group 31 of the second light-receiving unit 22 in the surrounding area of the second light-receiving unit 22. Furthermore, the second transistor group 35 includes a reset gate 14e of the reset transistor 14, a dummy gate 35a, a fourth source/drain 35b, and a fifth source/drain 35c.

In this example, as shown in FIG. 6, the fourth source/drain 35b, the reset gate 14e, the fifth source/drain 35c, and the dummy gate 35a are arranged in this order along the horizontal direction (X direction). At this time, each gate and each source/drain are arranged so that the dummy gate 35a is arranged separately by a predetermined distance from the fifth source/drain 35c in the horizontal direction and is positioned on the second well contact 23b side. Furthermore, at this time, the reset gate 14e and the dummy gate 35a are arranged at a position substantially opposing the amplification gate 13a and the selection gate 15a of the first transistor group 31, respectively, with the second light-receiving unit 22 in between.

In the second transistor group 35, the fourth source/drain 35b, the reset gate 14e, and the fifth source/drain 35c constitute the reset transistor 14. The fourth source/drain 35b acts as one of the source and the drain of the reset transistor 14, and the fifth source/drain 35c acts as the other of the source and the drain of the reset transistor 14.

Furthermore, in the shared pixel unit part 130 of this example, in order that the equivalent circuit shown in FIG. 3 is obtained, various gates and various sources/drains in the first transistor group 31, and those in the second transistor group 35 are electrically connected with each other by using contacts and internal wiring (not shown). However, in this example, internal wiring is not connected to the dummy gate 35a, and an electrically floating state is achieved.

Then, in this example, the area of the dummy gate 35a is made approximately the same as the area of the reset gate 14e. In addition, in this example, the areas and the shapes of the dummy gate 35a and the reset gate 14e are set so that the total sum of the areas of various gates in the first transistor group 31 becomes substantially the same as the total sum of the areas of various gates in the second transistor group 35.

In the case where each transistor group is configured in the manner described above, the occupation area of the gate in the first transistor group 31 becomes substantially symmetrical to the occupation area of the gate in the second transistor group 35. That is, also, in this example, in the shared pixel unit part 130, the layout configuration of the first transistor group 31 becomes substantially symmetrical to that of the second transistor group 35.

In this case, the influence by the absorption and/or the reflection of light, which occurs in the gate when the vicinity of the gate is irradiated with light, on the output characteristics of the photodiode can be made uniform among a plurality of photodiodes. Therefore, also, in the CMOS image sensor of this example, it is possible to solve the problem that occurs due to the asymmetry of the layout configurations between the first transistor group 31 and the second transistor group 35 and thus, the same advantages as those of the first embodiment can be obtained.

Modification 3

In modification 3, a description will be given of a configuration example in which the influences of the source/drain on the output characteristics (sensitivity characteristics) of the photodiode are made uniform among a plurality of photodiodes.

Figure 7:
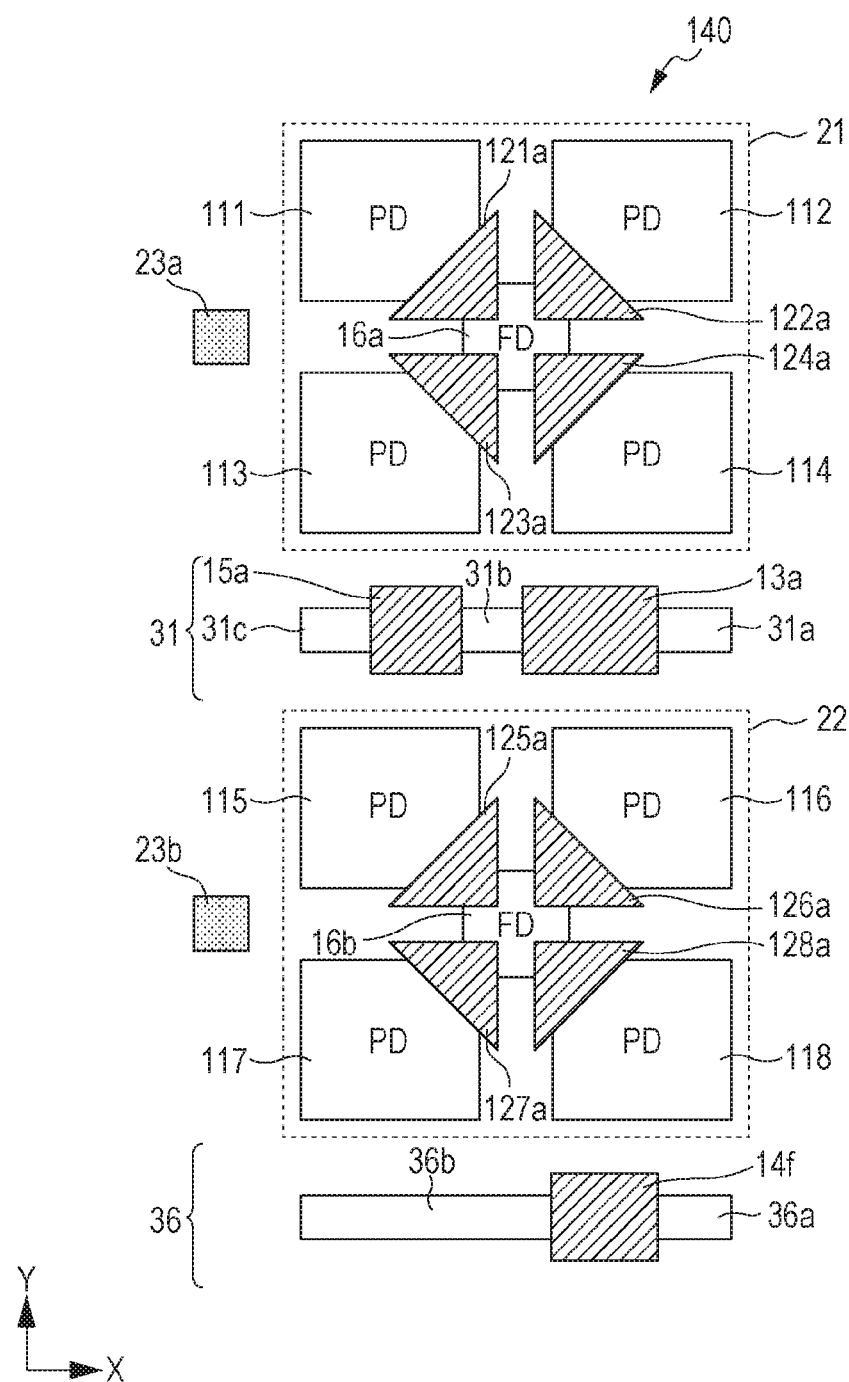
FIG. 7 is a schematic layout plan view of a shared pixel unit part of modification 3.

FIG. 7 illustrates a schematic plan view of the layout configuration of the shared pixel unit part in a CMOS image sensor of modification 3. In a shared pixel unit part 140 of modification 3 shown in FIG. 7, components, which are the same as those of the shared pixel unit part 110 of the first embodiment shown in FIG. 4, are designated with the same reference numerals.

The shared pixel unit part 140 is a shared pixel unit part in which eight pixels are shared, and is constituted by the first light-receiving unit 21, the second light-receiving unit 22, the first well contact 23a, the second well contact 23b, the first transistor group 31, and a second transistor group 36.

As is clear from the comparison between FIG. 7 and FIG. 4, the shared pixel unit part 140 of this example is prepared such that the configuration of the second transistor group in the shared pixel unit part 110 of the first embodiment is changed. The configuration other than the second transistor group 36 in this example is the same as the corresponding configuration of the first embodiment. Therefore, here, only the configuration of the second transistor group 36 will be described.

As shown in FIG. 7, the second transistor group 36 is arranged in an area on a side opposite to the arrangement side of the first transistor group 31 of the second light-receiving unit 22 in the surrounding area of the second light-receiving unit 22. Furthermore, each transistor group is formed so as to extend from a position in the vicinity of one of the end portions of the light-receiving unit to the other of the end portions along the horizontal direction (X direction). Each transistor group is arranged so that positions at both ends of the second transistor group 36 in the horizontal direction become substantially the same positions at both ends of the first transistor group 31, respectively.

Furthermore, the second transistor group 36 includes a reset gate 14f of the reset transistor 14, a fourth source/drain 36a, and a fifth source/drain 36b. The fourth source/drain 36a, the reset gate 14f, and the fifth source/drain 36b are arranged in this order along the horizontal direction (X direction in FIG. 7). At this time, as shown in FIG. 7, each gate and each source/drain are arranged so that the fifth source/drain 36b is positioned on the second well contact 23b side in the horizontal direction. At this time, the reset gate 14f is arranged in an area substantially opposing the eighth photodiode 118 in the vertical direction (Y direction).

In the second transistor group 36, the fourth source/drain 36a, the reset gate 14f, and the fifth source/drain 36b constitute the reset transistor 14. The fourth source/drain 36a acts as one of the source and the drain of the reset transistor 14, and the fifth source/drain 36b acts as the other of the source and the drain of the reset transistor 14.

Furthermore, in the shared pixel unit part 140 of this example, in order that the equivalent circuit shown in FIG. 3 is obtained, various gates and various source/drains in the first transistor group 31 are electrically connected to those in the second transistor group 36 by using contacts and internal wiring (not shown).

In this example, the fifth source/drain 36b is formed so as to extend from an end portion on a side opposite to the fourth source/drain 36a side of the reset gate 14f to near a position of the end portion on the second well contact 23b side of the second light-receiving unit 22 along the horizontal direction (X direction in FIG. 7). That is, in this example, in the vertical direction (Y direction), only the source/drain is formed in an area where the transistor is not formed in the second transistor group 35, which opposes the seventh photodiode 117.

In a case where each transistor group is configured in the manner described above, the layout pattern of the source/drain of the first transistor group 31 becomes substantially symmetrical to the layout pattern of the source/drain of the second transistor group 36. That is, also, in this example, in the shared pixel unit part 140, the layout configuration of the first transistor group 31 becomes substantially symmetrical to that of the second transistor group 36.

In this case, influences on the output characteristics (sensitivity characteristics) of the photodiode by the source/drain can be made uniform among a plurality of photodiodes that are shared. Therefore, also, in the CMOS image sensor of this example, it is possible to solve the problems that occur due to the asymmetry of layout configurations between the first transistor group 31 and the second transistor group 36 and thus, the same advantages as those of the first embodiment are obtained.

Modification 4

In the first embodiment, an example in which, by adding one reset transistor, the symmetry of the layout configuration of the first transistor group and that of second transistor group is improved has been described. However, the present disclosure is not limited to this. The symmetry between the layout configuration of the first transistor group and that of the second transistor group may be improved without adding a transistor. In modification 4, an example thereof will be described.

Figure 8:
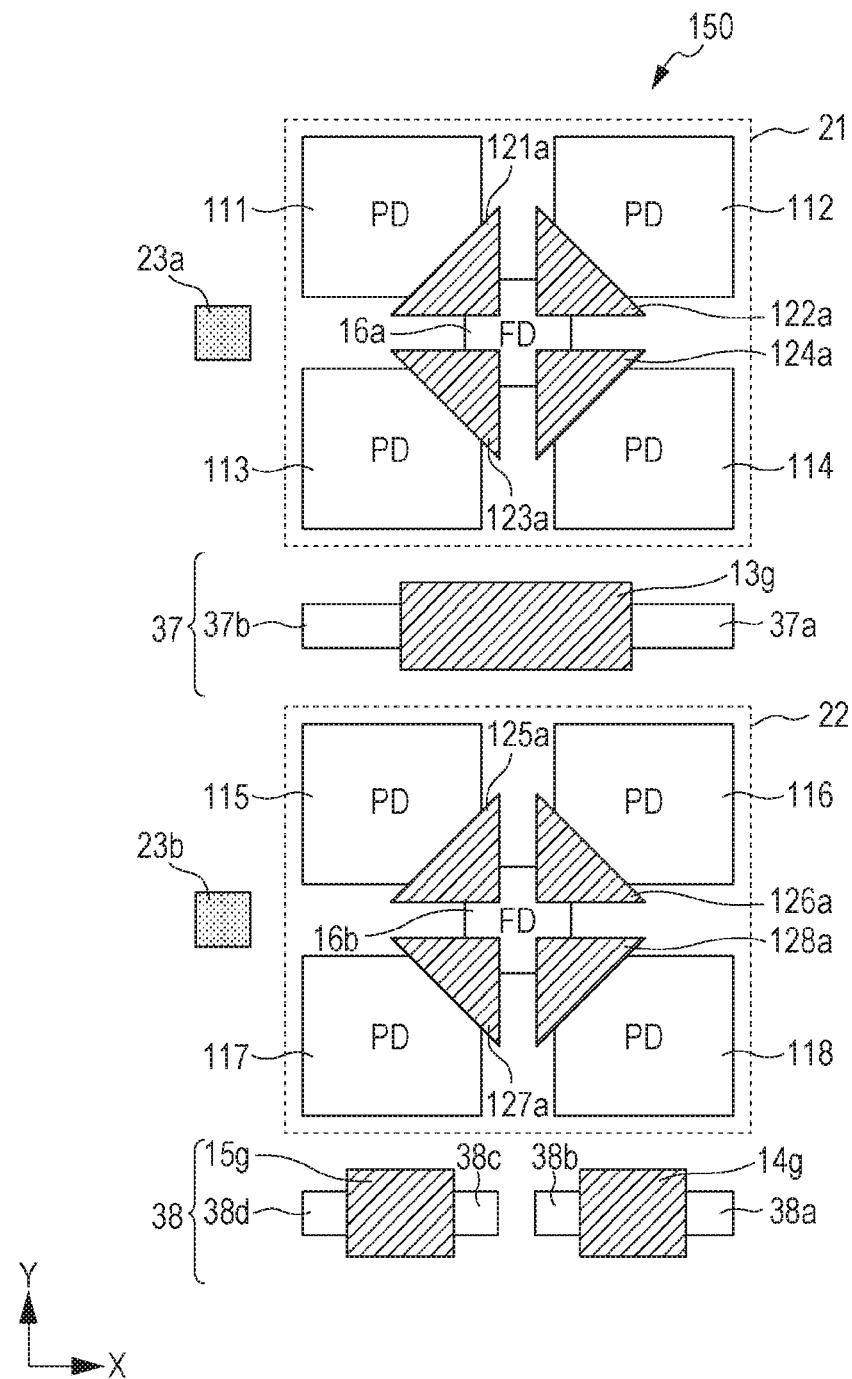
FIG. 8 is a schematic layout plan view of a shared pixel unit part of modification 4.

FIG. 8 illustrates a schematic plan view of a layout configuration of a shared pixel unit part in a CMOS image sensor of modification 4. In a shared pixel unit part 150 of modification 4 shown in FIG. 8, components, which are the same as those of the shared pixel unit part 110 of the first embodiment shown in FIG. 4, are designated with the same reference numerals.

The shared pixel unit part 150 is a shared pixel unit part in which eight pixels are shared, and is constituted by the first light-receiving unit 21, the second light-receiving unit 22, the first well contact 23a, the second well contact 23b, a first transistor group 37, and a second transistor group 38.

As is clear from the comparison between FIG. 8 and FIG. 4, the shared pixel unit part 150 of this example is prepared such that the configuration of the first transistor group and the second transistor group in the shared pixel unit part 110 of the first embodiment is changed. The configuration other than the first transistor group 37 and the second transistor group 38 in this example is the same as the corresponding configuration of the first embodiment. Therefore, here, only the configuration of the first transistor group 37 and the second transistor group 38 will be described.

As shown in FIG. 8, the first transistor group 37 is arranged between the first light-receiving unit 21 and the second light-receiving unit 22. Furthermore, the second transistor group 38 is arranged in an area on a side opposite to the arrangement side of the first transistor group 37 of the second light-receiving unit 22 in the surrounding area of the second light-receiving unit 22. Furthermore, each transistor group is formed so as to extend from a position in the vicinity of one of the end portions of the light-receiving unit along the horizontal direction (X direction) to the other of the end portions. Each transistor group is arranged so that the positions at both ends of the first transistor group 37 in the horizontal direction become substantially the same as the positions at both ends of the second transistor group 38, respectively.

Furthermore, the first transistor group 37 includes an amplification gate 13g of the amplification transistor 13, a first source/drain 37a, and a second source/drain 37b. The first source/drain 37a, the amplification gate 13g, and the second source/drain 37b are arranged in this order along the horizontal direction (X direction in FIG. 8). At this time, each gate and each source/drain are arranged so that the second source/drain 37b is positioned on the first well contact 23a side in the horizontal direction (X direction in FIG. 8). Furthermore, in this example, as shown in FIG. 8, the amplification gate 13g is arranged in approximately the center of the formation area of the first transistor group 37.

In this example, the first source/drain 37a, the amplification gate 13g, and the second source/drain 37b constitute the amplification transistor 13. One of the first source/drain 37a and the second source/drain 37b acts as the source of the amplification transistor 13, and the other thereof acts as the drain.

The second transistor group 38 includes a reset gate 14g of the reset transistor 14, a selection gate 15g of the selection transistor 15, and a third source/drain 38a to a sixth source/drain 38d. The third source/drain 38a, the reset gate 14g, the fourth source/drain 38b, the fifth source/drain 38c, the selection gate 15g, and the sixth source/drain 38d are arranged in this order along the horizontal direction (X direction in FIG. 8).

At this time, as shown in FIG. 8, the fourth source/drain 38b is arranged separately by a predetermined spacing from the fifth source/drain 38c. Furthermore, in this example, each gate and each source/drain are arranged so that the sixth source/drain 38d is positioned on the second well contact 23b side in the horizontal direction (X direction). In addition, in this example, the reset gate 14g and the selection gate 15g are arranged so as to substantially oppose the eighth photodiode 118 and the seventh photodiode 117, respectively, in the longitudinal direction (Y direction).

In the second transistor group 38, the third source/drain 38a, the reset gate 14g, and the fourth source/drain 38b constitute the reset transistor 14. One of the third source/drain 38a and the fourth source/drain 38b acts as the source of the reset transistor 14, and the other acts as the drain thereof. Furthermore, in the second transistor group 38, the fifth source/drain 38c, the selection gate 15g, and the sixth source/drain 38d constitute the selection transistor 15. One of the fifth source/drain 38c and the sixth source/drain 38d acts as the source of the selection transistor 15 and the other acts as the drain thereof. In this example, the area of the reset gate 14g is set approximately the same as the area of the selection gate 15g.

In this example, the area of the amplification gate 13g is set to be greater than the area of each gate (the reset gate 14g, the selection gate 15g) within the second transistor group 38.

Specifically, the extension length of the amplification gate 13g in the horizontal direction (X direction in FIG. 8) is lengthened more than that of each gate within the second transistor group 38. However, at this time, the area and the shape of the amplification gate 13g are set so that the area of the amplification gate 13g becomes approximately the same as the total sum of the area of the reset gate 14g and the area of the selection gate 15g within the second transistor group 38.

In the case where each transistor group is configured in the manner described above, in the shared pixel unit part 150, the occupation area of the gate (source/drain) in the first transistor group 37 and the occupation area of the gate (source/drain) in the second transistor group 38 becomes substantially symmetrical to each other. That is, in this example, also, the layout configuration of the first transistor group 37 becomes substantially symmetrical to the layout configuration of the second transistor group 38. Therefore, also, in the CMOS image sensor of this example, the problems that arise due to the asymmetry of the layout configuration between the first transistor group 37 and the second transistor group 38 can be solved. Thus, the same advantages as those of the first embodiment are obtained.

In this example, an example has been described in which the first transistor group 37 is provided with the amplification transistor 13 and the second transistor group 38 is provided with the reset transistor 14 and the selection transistor 15. However, the present disclosure is not limited to this. The assignment of the type (function) of the transistor provided in each transistor group can be set as desired. For example, the first transistor group 37 may be provided with the selection transistor 15, and the second transistor group 38 may be provided with the amplification transistor 13 and the reset transistor 14. In this example, an example in which one amplification transistor 13 is provided in the first transistor group 37 has been described. The present disclosure is not limited to this, and the first transistor group 37 may be provided with a plurality of amplification transistors 13.

3. Second Embodiment

In the second embodiment, a description will be made of a configuration example in which a single shared pixel unit part shares four pixels in the 4-transistor-type CMOS image sensor. The entire configuration of the CMOS image sensor according to the present embodiment is the same configuration according to the above-described first embodiment (FIG. 1), and thus a description thereof will be omitted here.

Configuration of Shared Pixel Unit Part

A configuration of a shared pixel unit part in a case where four pixels are shared in the 4-transistor-type CMOS image sensor will be described with reference to FIG. 3. In a case where four pixels are shared, an equivalent circuit of an area surrounded by the single dot chain line in FIG. 3 is an equivalent circuit of a shared pixel unit part 160.

The shared pixel unit part 160 includes four photodiodes (first photodiode 111 to fourth photodiode 114). Furthermore, the shared pixel unit part 160 includes four transfer transistors (first transfer transistor 121 to fourth transfer transistor 124), which are provided in such a manner as to correspond to the first photodiode 111 to the fourth photodiode 114, respectively. In addition, the shared pixel unit part 160 includes the amplification transistor 13, the reset transistor 14, the selection transistor 15, and the FD area 16 which are shared among the four pixels.

In the shared pixel unit part 160, four circuits each formed of a transfer transistor and a photodiode corresponding thereto are provided, and the four circuits are connected in parallel between the FD area 16 and the ground, as shown in FIG. 3. The present embodiment has the same configuration as the first embodiment except that the number of the circuits formed of the transfer transistors and the photodiodes connected to the FD area 16 is different from that in the first embodiment. Therefore, here, a detailed description of the connection relationships among the various photodiodes, the various transistors, and the FD area 16 in the equivalent circuit of the shared pixel unit part 160 will be omitted.

Layout of Shared Pixel Unit Part (1) Layout of Entire Shared Pixel Unit Part

Figure 9:
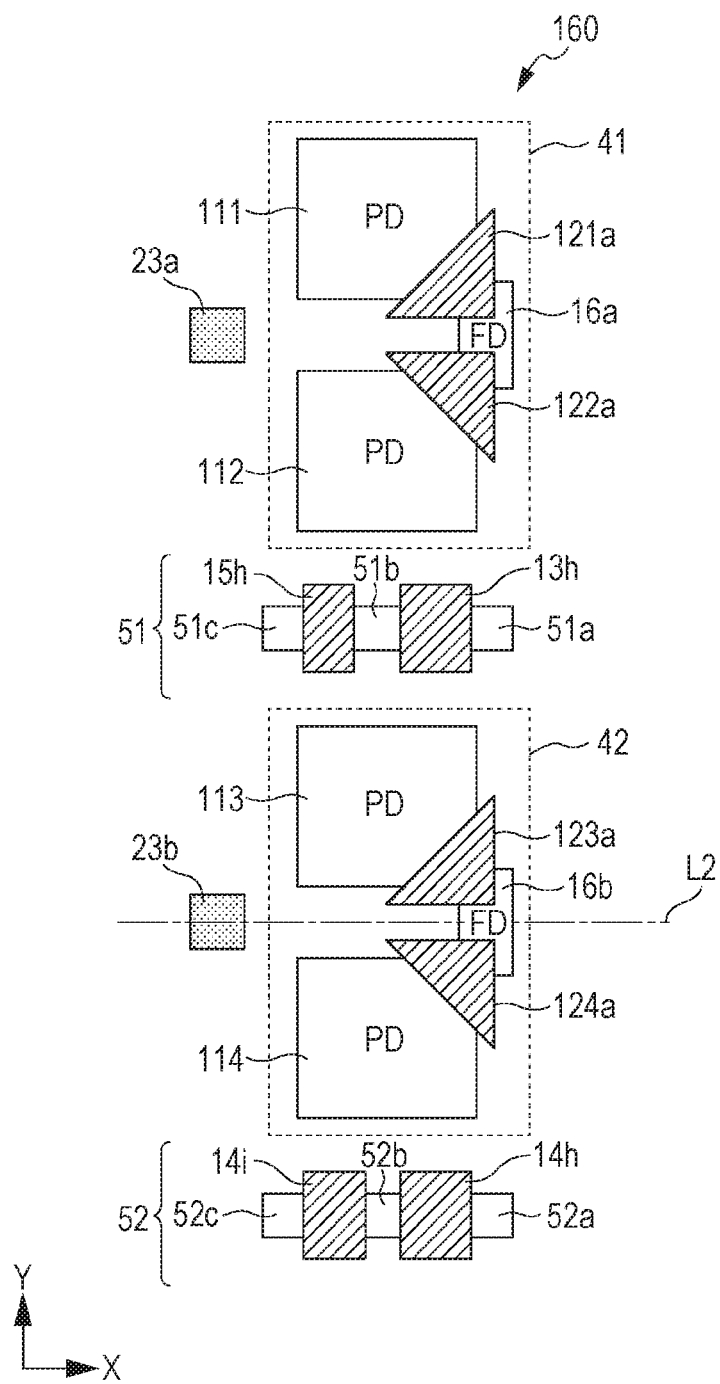
FIG. 9 is a schematic layout plan view of a shared pixel unit part in a solid-state imaging device according to a second embodiment.

FIG. 9 illustrates a schematic plan view of a layout configuration of the shared pixel unit part 160 of the present embodiment. In the layout configuration of the shared pixel unit part 160 shown in FIG. 9, components corresponding to the components within the equivalent circuit of the shared pixel unit part 160 shown in FIG. 3 are designated with the same reference numerals.

The shared pixel unit part 160 includes a first light-receiving unit 41, a second light-receiving unit 42, a first well contact 23a, a second well contact 23b, a first transistor group 51, and a second transistor group 52.

In the present embodiment, as shown in FIG. 9, the first light-receiving unit 41 and the second light-receiving unit 42 are arranged in the vertical direction (in the Y direction) within the shared pixel unit part 160. In addition, the first transistor group 51 is arranged between the first light-receiving unit 41 and the second light-receiving unit 42. In addition, the second transistor group 52 is arranged in an area on a side opposite to the arrangement side of the first transistor group 51 of the second light-receiving unit 42 in the surrounding area of the second light-receiving unit 42.

In the present embodiment, each transistor group is formed to extend along the horizontal direction (in the X direction in FIG. 9) from a position in the vicinity of one of the end portions of the light-receiving unit to a position in the vicinity of the other of the end portions. At this time, in the present embodiment, the transistor groups are arranged so that the positions at both ends of the first transistor group 51 in the horizontal direction are substantially the same positions at both ends of the second transistor group 52.

In addition, in the present embodiment, the first transistor group 51 is provided with the amplification transistor 13 and the selection transistor 15, and the second transistor group 52 is provided with the reset transistor 14. Further, in the present embodiment as well, the FD area 16 (floating diffusion unit) that is shared by four pixels is provided separately in each light-receiving unit (a first FD area 16a and a second FD area 16b).

In addition, the first well contact 23a and the second well contact 23b are respectively provided for the first light-receiving unit 41 and the second light-receiving unit 42. In the surrounding area of the first light-receiving unit 41, the first well contact 23a is arranged in an area in one of the sides (the left side in FIG. 9) in the horizontal direction (in the X direction in FIG. 9) of the first light-receiving unit 41, and is arranged at a position opposing the first FD area 16a. Furthermore, in the surrounding area of the second light-receiving unit 42, the second well contact 23b is arranged in an area in one of the sides (the left side in FIG. 9) in the horizontal direction (in the X direction in FIG. 9) of the second light-receiving unit 42, and is arranged at a position opposing the second FD area 16b. However, the arrangement position of each well contact is not limited to the example shown in FIG. 9. For example, in the surrounding area of the corresponding light-receiving unit, each well contact is arranged at a position on the other side (in FIG. 9, the right side) in the horizontal direction (in the X direction in FIG. 9) of the light-receiving unit, and is arranged at a position opposing the corresponding FD area.

In the CMOS image sensor of the present embodiment, as described above, the respective units are arranged within the shared pixel unit part 160, and the units are electrically connected to each other using various contacts and internal wiring (not shown) such that the connection relationships among the units in the equivalent circuit shown in FIG. 3 are satisfied.

In addition, in the present embodiment, one reset transistor is added in the second transistor group 52 as described later. However, in the present embodiment, since the second well contact 23b is not arranged in the surroundings of the second transistor group 52 as shown in FIG. 9, it is possible to efficiently secure an area for adding one reset transistor in the formation area of the second transistor group 52.

(2) Layout of Each Unit of Shared Pixel Unit Part

The layout configuration of each unit within the shared pixel unit part 160 will be described with reference to FIG. 9.

The first light-receiving unit 41 includes a first photodiode 111 and a second photodiode 112 (photoelectric conversion units), which are arranged in the vertical direction (in the Y direction in FIG. 9), and a first transfer transistor 121 and a second transfer transistor 122 (transfer units) so as to correspond thereto. Furthermore, the first light-receiving unit 41 includes the first FD area 16a shared by two pixels. In FIG. 9, for simplicity of description, only each gate (a first transfer gate 121a and a second transfer gate 122a) of the first transfer transistor 121 and the second transfer transistor 122 is shown.

In the present embodiment, as shown in FIG. 9, the first FD area 16a is arranged in the vicinity of end portion on a side opposite to the first well contact 23a in the opposing area between the first photodiode 111 and the second photodiode 112. The first transfer gate 121a and the second transfer gate 122a are arranged between the first FD area 16a and the first photodiode 111 and the second photodiode 112. At this time, the first transfer gate 121a and the second transfer gate 122a are arranged in such a manner as to be directly connected to the first photodiode 111 and the second photodiode 112, respectively.

The second light-receiving unit 42 includes a third photodiode 113 and a fourth photodiode 114 (photoelectric conversion units), which are arranged in the vertical direction (in the Y direction in FIG. 9), and a third transfer transistor 123 and a fourth transfer transistor 124 (transfer units) so as to correspond thereto. Furthermore, the second light-receiving unit 42 includes the second FD area 16b shared by two pixels. In FIG. 9, for simplicity of description, only each gate (a third transfer gate 123a and a fourth transfer gate 124a) of the third transfer transistor 123 and the fourth transfer transistor 124 is shown.

In the present embodiment, as shown in FIG. 9, the second FD area 16b is arranged in the vicinity of end portion on a side opposite to the second well contact 23b in the opposing area between the third photodiode 113 and the fourth photodiode 114. The third transfer gate 123a and the fourth transfer gate 124a are arranged between the second FD area 16b and the third photodiodes 113 and the fourth photodiode 114. At this time, the third transfer gate 123a and the fourth transfer gate 124a are arranged in such a manner as to be directly connected to the third photodiode 113 and the fourth photodiode 114, respectively. That is, the arrangement of each unit forming the second light-receiving unit 42 is the same as that of the first light-receiving unit 41.

The first transistor group 51 includes an amplification gate 13h of the amplification transistor 13, a selection gate 15h of the selection transistor 15, and a first source/drain 51a to a third source/drain 51c. In the present embodiment, along the horizontal direction (in the X direction in FIG. 9), the first source/drain 51a, the amplification gate 13h, the second source/drain 51b, the selection gate 15h, and the third source/drain 51c are arranged in this order. At this time, each gate and each source/drain are arranged so that the third source/drain 51c is positioned on the side of the first well contact 23a in the horizontal direction.

In the first transistor group 51, the first source/drain 51a, the amplification gate 13h, and the second source/drain 51b constitute the amplification transistor 13. The first source/drain 51a and the second source/drain 51b act as the drain and the source of the amplification transistor 13, respectively. Furthermore, in the first transistor group 51, the second source/drain 51b, the selection gate 15h, and the third source/drain 51c constitute the selection transistor 15. The second source/drain 51b and the third source/drain 51c act as the drain and the source of the selection transistor 15, respectively. That is, in the first transistor group 51, the second source/drain 51b is shared as the source of the amplification transistor 13 and the drain of the selection transistor 15.

Furthermore, in the present embodiment, as shown in FIG. 9, the area of the amplification gate 13h is increased to more than the area of the selection gate 15h. Specifically, the extension length in the horizontal direction (X direction) of the amplification gate 13h is lengthened more than that of the selection gate 15h.

The second transistor group 52 is constituted by two reset transistors, and the two reset transistors are arranged along the horizontal direction (in the X direction in FIG. 9). That is, in the present embodiment, in the same manner as the first embodiment, one reset transistor is added.

The second transistor group 52 includes a first reset gate 14h of the first reset transistor, a second reset gate 14i of the second reset transistor, and a fourth source/drain 52a to a sixth source/drain 52c. In the present embodiment, along the horizontal direction (in the X direction in FIG. 9), the fourth source/drain 52a, the first reset gate 14h, the fifth source/drain 52b, the second reset gate 14i, and the sixth source/drain 52c are arranged in this order. At this time, each gate and each source/drain are arranged so that the sixth source/drain 52c is positioned on the second well contact 23b side in the horizontal direction.

In the second transistor group 52, the fourth source/drain 52a, the first reset gate 14h, and the fifth source/drain 52b constitute the first reset transistor. Furthermore, in the second transistor group 52, the fifth source/drain 52b, the second reset gate 14i, and the sixth source/drain 52c constitute the second reset transistor.

In the present embodiment, the two reset transistors are connected in parallel between the power-supply voltage Vdd and the FD area 16. Therefore, in the second transistor group 52, the fifth source/drain 52b is shared as the source or the drain of the two reset transistors. In a case where the fifth source/drain 52b is used as the source of the two reset transistors, the fourth source/drain 52a and the sixth source/drain 52c act as the drain. In contrast, in a case where the fifth source/drain 52b is used as the drain of the two reset transistors, the fourth source/drain 52a and the sixth source/drain 52c act as the source.

In the present embodiment, the area of the first reset gate 14h is made equal to the area of the second reset gate 14i. In the present embodiment, the area of each reset gate is made smaller than the area of the amplification gate 13h. However, at this time, the area and the shape of each gate and source/drain are set so that the sum total of the area of the amplification gate 13h and the area of the selection gate 15h becomes substantially the same as the sum total of the area of the first reset gate 14h and the area of the second reset gate 14i. That is, the area and the shape of each gate and source/drain are set so that the occupation area of the gate and the source/drain in the first transistor group 51 becomes substantially the same as the occupation area of the gate and the source/drain of the second transistor group 52, respectively.

In the case where each transistor group is configured in the manner described above, the layout configuration of the first transistor group 51 (first layout configuration: the pattern and the size of the gate and source/drain) becomes substantially symmetrical to the layout configuration of the second transistor group 52 (second layout configuration). More specifically, as shown in FIG. 9, the layout configurations of both the transistor groups become substantially symmetrical to each other with respect to the straight line L2 that extends in the direction (X direction) passing the center between the first transistor group 51 and the second transistor group 52 and intersecting at right angles to the arrangement direction (Y direction) between both the transistor groups.

Therefore, in the present embodiment, the problems that arise due to the asymmetry of the layout configurations between the first transistor group 51 and the second transistor group 52 can be solved, and thus it is possible to achieve the same effects as in the first embodiment.

In the present embodiment as well, one of the two reset transistors provided in the second transistor group 52 may be made not to function as a transistor. In addition, in the present embodiment as well, the assignment of the type (functions) of the transistors to be provided in each transistor group can be set as desired. However, in the transistor group in which only one type of transistor is arranged, similarly to FIG. 9, one transistor of the same type is added, so that the layout configurations of the two transistor groups become substantially symmetrical to each other.

In addition, the layout configuration of the shared pixel unit part 160 is not limited to the example shown in FIG. 9. For example, the layout configuration of each transistor group described in the above-described modified examples 1 to 4 (FIGS. 5 to 8) may be applied to the layout configuration of each transistor group of the shared pixel unit part 160 of the present embodiment.

4. Third Embodiment

In the third embodiment, a description will be made of a configuration example in which a single shared pixel unit part shares two pixels in the 4-transistor-type CMOS image sensor. In addition, the entire configuration of the CMOS image sensor according to the present embodiment is the same configuration according to the above-described first embodiment (FIG. 1), and thus a description thereof will be omitted here.

Configuration of Shared Pixel Unit Part

A configuration of a shared pixel unit part in a case where two pixels are shared in the 4-transistor-type CMOS image sensor will be described with reference to FIG. 3. In a case where two pixels are shared, an equivalent circuit of an area surrounded by the dotted line in FIG. 3 is an equivalent circuit of a shared pixel unit part 170.

The shared pixel unit part 170 includes two photodiodes (first photodiode 111 and second photodiode 112). Furthermore, the shared pixel unit part 170 includes two transfer transistors (the first transfer transistor 121 and the second transfer transistor 122), which are provided in such a manner as to correspond to the first photodiode 111 and the second photodiode 112, respectively. In addition, the shared pixel unit part 170 includes the amplification transistor 13, the reset transistor 14, the selection transistor 15, and the FD area 16 which are shared among the two pixels.

In the shared pixel unit part 170, as shown in FIG. 3, two circuits each formed of a transfer transistor and a photodiode corresponding thereto are provided, and the two circuits are connected in parallel between the FD area 16 and the ground. The present embodiment has the same configuration as the first embodiment except that the number of the circuits formed of the transfer transistors and the photodiodes connected to the FD area 16 is different from that in the first embodiment. Therefore, here, a detailed description of the connection relationships among the various photodiodes, the various transistors, and the FD area 16 in the equivalent circuit of the shared pixel unit part 170 will be omitted.

Layout of Shared Pixel Unit Part (1) Layout of Entire Shared Pixel Unit Part

Figure 10:
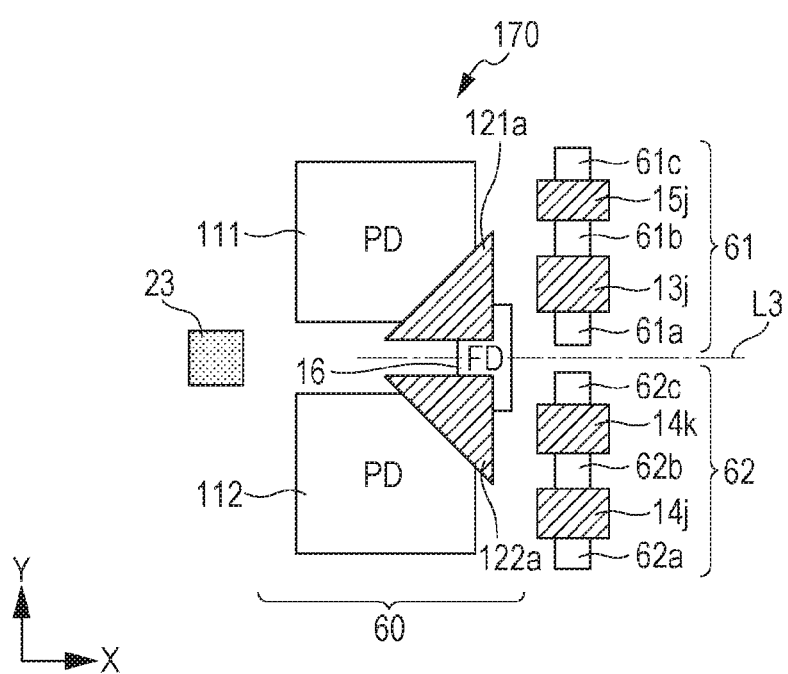
FIG. 10 is a schematic layout plan view of a shared pixel unit part in a solid-state imaging device according to a third embodiment.

FIG. 10 illustrates a schematic plan view of a layout configuration of the shared pixel unit part 170 of the present embodiment. In the layout configuration of the shared pixel unit part 170 shown in FIG. 10, components corresponding to the components within the equivalent circuit of the shared pixel unit part 170 shown in FIG. 3 are designated with the same reference numerals.

The shared pixel unit part 170 includes a light-receiving unit 60, a well contact 23, a first transistor group 61, and a second transistor group 62. That is, the single well contact 23 and the single light-receiving unit 60 are provided within the shared pixel unit part 170 of the present embodiment.

In the present embodiment, in the horizontal direction (in the X direction in FIG. 10) of the light-receiving unit 60, the well contact 23 is arranged in a surrounding area in one of the sides (the left side in FIG. 10) of the light-receiving unit 60, and each transistor group is arranged in a surrounding area of the other side (the right side in FIG. 10) of the light-receiving unit 60. At this time, the well contact 23 is arranged at a position opposing the FD area 16 in the light-receiving unit 60. However, the arrangement positions of the well contact 23 and each of the transistor groups are not limited to the example shown in FIG. 10, and an arrangement relationship of the well contact 23 and each transistor group with respect to the light-receiving unit 60 may be opposite to the arrangement relationship shown in FIG. 10.

The first transistor group 61 and the second transistor group 62 are arranged so as to be spaced apart from each other with a predetermined gap along the vertical direction (the Y direction in FIG. 10) of the light-receiving unit 60. In addition, at this time, the first transistor group 61 and the second transistor group 62 are respectively arranged at positions opposing the first photodiode 111 and the second photodiode 112 of the light-receiving unit 60.

In the present embodiment, each transistor group is formed to extend along the vertical direction (in the Y direction in FIG. 10) from a position in the vicinity of one of the end portions of the corresponding photodiode to a position in the vicinity of the other of the end portions. In addition, in the present embodiment, the first transistor group 61 is provided with the amplification transistor 13 and the selection transistor 15, and the second transistor group 62 is provided with the reset transistor 14.

In the CMOS image sensor of the present embodiment, the respective units within the shared pixel unit part 170 are arranged as described above, and the units are electrically connected to each other using various contacts and internal wiring (not shown) such that the connection relationships among the units in the equivalent circuit shown in FIG. 3 are satisfied.

In addition, in the present embodiment, one reset transistor is added in the second transistor group 62 as described later. However, in the present embodiment, since the well contact 23 is not arranged in the surroundings of the transistor groups as shown in FIG. 10, it is possible to efficiently secure an area for adding one reset transistor in the formation area of the second transistor group 62.

(2) Layout of Each Unit of Shared Pixel Unit Part

The layout configuration of each unit within the shared pixel unit part 170 will be described with reference to FIG. 10.

The light-receiving unit 60 includes the first photodiode 111 and the second photodiode 112 (photoelectric conversion units), which are arranged in the vertical direction (in the Y direction in FIG. 10), and a first transfer transistor 121 and a second transfer transistor 122 (transfer units) so as to correspond thereto. Furthermore, the light-receiving unit 60 includes the FD area 16 (floating diffusion unit) shared by two pixels. In FIG. 10, for simplicity of description, only each gate (a first transfer gate 121a and a second transfer gate 122a) of the first transfer transistor 121 and the second transfer transistor 122 is shown.

In the present embodiment, the FD area 16 is arranged in the vicinity of end portion on a side opposite to the well contact 23 in the opposing area between the first photodiode 111 and the second photodiode 112. The first transfer gate 121a and the second transfer gate 122a are arranged between the FD area 16 and the first photodiodes 111 and the second photodiode 112. At this time, the first transfer gate 121a and the second transfer gate 122a are arranged in such a manner as to be directly connected to the first photodiode 111 and the second photodiode 112, respectively.

The first transistor group 61 includes an amplification gate 13j of the amplification transistor 13, a selection gate 15j of the selection transistor 15, and a first source/drain 61a to a third source/drain 61c. In the present embodiment, along the vertical direction (in the Y direction in FIG. 10), the first source/drain 61a, the amplification gate 13j, the second source/drain 61b, the selection gate 15j, and the third source/drain 61c are arranged in this order. At this time, each gate and each source/drain are arranged so that the first source/drain 61a is positioned on the side of the FD area 16 in the vertical direction.

In the first transistor group 61, the first source/drain 61a, the amplification gate 13j, and the second source/drain 61b constitute the amplification transistor 13. The first source/drain 61a and the second source/drain 61b act as the drain and the source of the amplification transistor 13, respectively. Furthermore, in the first transistor group 61, the second source/drain 61b, the selection gate 15j, and the third source/drain 61c constitute the selection transistor 15. Then, the second source/drain 61b and the third source/drain 61c act as the drain and the source of the selection transistor 15, respectively. That is, in the first transistor group 61, the second source/drain 61b is used as the source of the amplification transistor 13 and the drain of the selection transistor 15.

Furthermore, in the present embodiment, as shown in FIG. 10, the area of the amplification gate 13j is increased to more than the area of the selection gate 15j. Specifically, the extension length in the vertical direction (Y direction) of the amplification gate 13j is lengthened more than that of the selection gate 15j.

The second transistor group 62 is constituted by two reset transistors, and the two reset transistors are arranged along the vertical direction (in the Y direction in FIG. 10). That is, in the present embodiment, in the same manner as the first embodiment, one reset transistor is added.

The second transistor group 62 includes a first reset gate 14j of the first reset transistor, a second reset gate 14k of the second reset transistor, and a fourth source/drain 62a to a sixth source/drain 62c. In the present embodiment, along the vertical direction (in the Y direction in FIG. 10), the fourth source/drain 62a, the first reset gate 14j, the fifth source/drain 62b, the second reset gate 14k, and the sixth source/drain 62c are arranged in this order. At this time, each gate and each source/drain are arranged so that the sixth source/drain 62c is positioned on the FD area 16 side in the vertical direction.

In the second transistor group 62, the fourth source/drain 62a, the first reset gate 14j, and the fifth source/drain 62b constitute the first reset transistor. Furthermore, in the second transistor group 62, the fifth source/drain 62b, the second reset gate 14k, and the sixth source/drain 62c constitute the second reset transistor.

In the present embodiment, the two reset transistors are connected in parallel between the power-supply voltage Vdd and the FD area 16. Therefore, in the second transistor group 62, the fifth source/drain 62b is shared as the source or the drain of the two reset transistors. In a case where the fifth source/drain 62b is used as the source of the two reset transistors, the fourth source/drain 62a and the sixth source/drain 62c act as the drain. In contrast, in a case where the fifth source/drain 62b is used as the drain of the two reset transistors, the fourth source/drain 62a and the sixth source/drain 62c act as the source.

In the present embodiment, the area of the first reset gate 14j is made equal to the area of the second reset gate 14k. In the present embodiment, the area of each reset gate is made smaller than the area of the amplification gate 13j. However, at this time, the area and the shape of each gate and source/drain are set so that the sum total of the area of the amplification gate 13j and the area of the selection gate 15j becomes substantially the same as the sum total of the area of the first reset gate 14j and the area of the second reset gate 14k. That is, the area and the shape of each gate and source/drain are set so that the occupation area of the gate and the source/drain in the first transistor group 61 becomes substantially the same as the occupation area of the gate and the source/drain of the second transistor group 62, respectively.

In the case where each transistor group is configured in the manner described above, the layout configuration of the first transistor group 61 (first layout configuration: the pattern and the size of the gate and source/drain) becomes substantially symmetrical to the layout configuration of the second transistor group 62 (second layout configuration). More specifically, as shown in FIG. 10, the layout configurations of both the transistor groups become substantially symmetrical to each other with respect to the straight line L3 that extends in the direction (X direction) passing the center between the first transistor group 61 and the second transistor group 62 and intersecting at right angles to the arrangement direction (Y direction) between both the transistor groups.

Therefore, in the present embodiment, the problems that arise due to the asymmetry of the layout configurations between the first transistor group 61 and the second transistor group 62 can be solved, and thus it is possible to achieve the same effects as in the first embodiment.

In the present embodiment as well, one of the two reset transistors provided in the second transistor group 62 may be made not to function as a transistor. In addition, in the present embodiment as well, the assignment of the type (functions) of the transistors to be provided in each transistor group can be set as desired. However, in the transistor group in which only one type of transistor is arranged, similarly to FIG. 10, one transistor of the same type is added, so that the layout configurations of the two transistor groups become substantially symmetrical to each other.

In addition, the layout configuration of the shared pixel unit part 170 is not limited to the example shown in FIG. 10. For example, the layout configuration of each transistor group described in the above-described modified examples 1 to 4 (FIGS. 5 to 8) may be applied to the layout configuration of each transistor group of the shared pixel unit part 170 of the present embodiment.

5. Fourth Embodiment

In the first to third embodiments, although the configuration examples of the 4-transistor-type back-illuminated CMOS image sensor have been described, in the fourth embodiment, a configuration example of the 3-transistor-type back-illuminated CMOS image sensor will be described. The entire configuration of the CMOS image sensor according to the present embodiment is the same configuration according to the above-described first embodiment (FIG. 1), and thus a description thereof will be omitted here.

Configuration of Shared Pixel Unit Part

Figure 11:
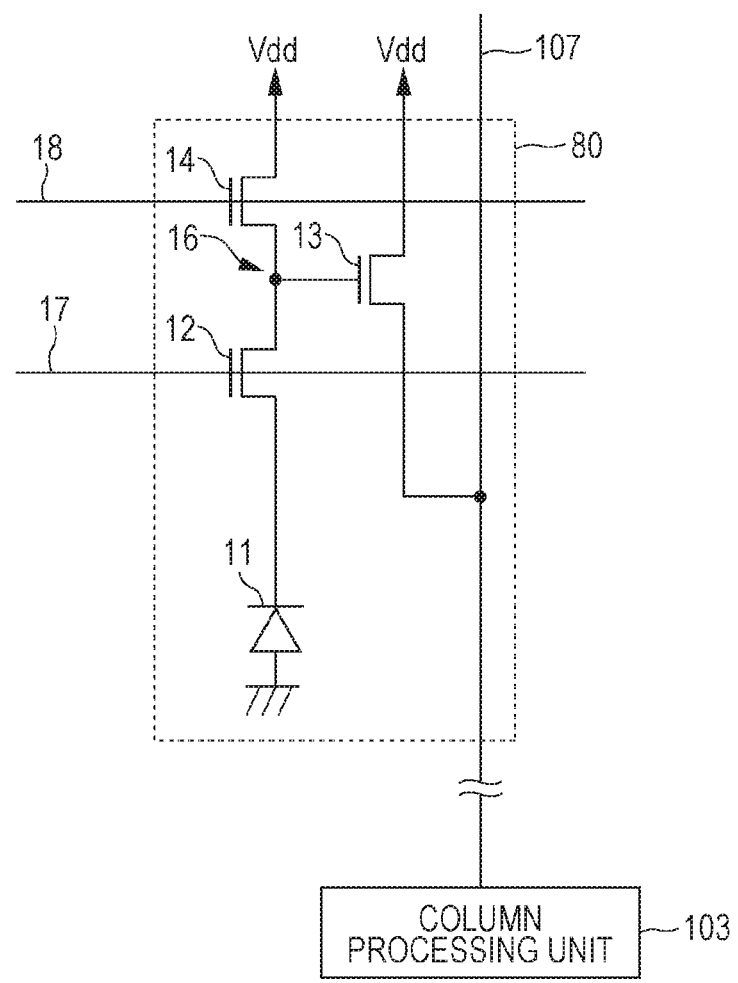
FIG. 11 is an equivalent circuit diagram of a unit pixel in a 3-transistor-type solid-state imaging device.

First, before a configuration of the shared pixel unit part of the present embodiment is described, for comparison purposes, a configuration of each pixel in a case where the pixel sharing technology is not used in a 3-transistor-type CMOS image sensor will be described. FIG. 11 illustrates an equivalent circuit of a pixel in a case where the pixel sharing technology is not used. In the equivalent circuit of a pixel 80 shown in FIG. 11, components, which are the same as in the equivalent circuit of the pixel 10 of the 4-transistor-type CMOS image sensor shown in FIG. 2, are designated with the same reference numerals.

In the 3-transistor-type CMOS image sensor, the pixel 80 includes a photodiode 11, a transfer transistor 12, an amplification transistor 13, a reset transistor 14, and an FD area 16. As is clear from the comparison between FIG. 11 and FIG. 2, the pixel 80 of the 3-transistor-type CMOS image sensor has a configuration in which the selection transistor 15 in the pixel 10 of the 4-transistor-type CMOS image sensor shown in FIG. 2 is omitted.

In the pixel 80, the configuration other than the omitted selection transistor 15 is the same as that of the pixel 10 of the 4-transistor-type CMOS image sensor. In addition, the photodiode 11, the FD area 16, and the various transistors have the same configurations as those corresponding thereto in the pixel 10 of the 4-transistor-type CMOS image sensor. In the 3-transistor-type CMOS image sensor, discrimination between the selection and the non-selection of the pixel 80 is performed in accordance with a potential of the FD area 16.

Figure 12:
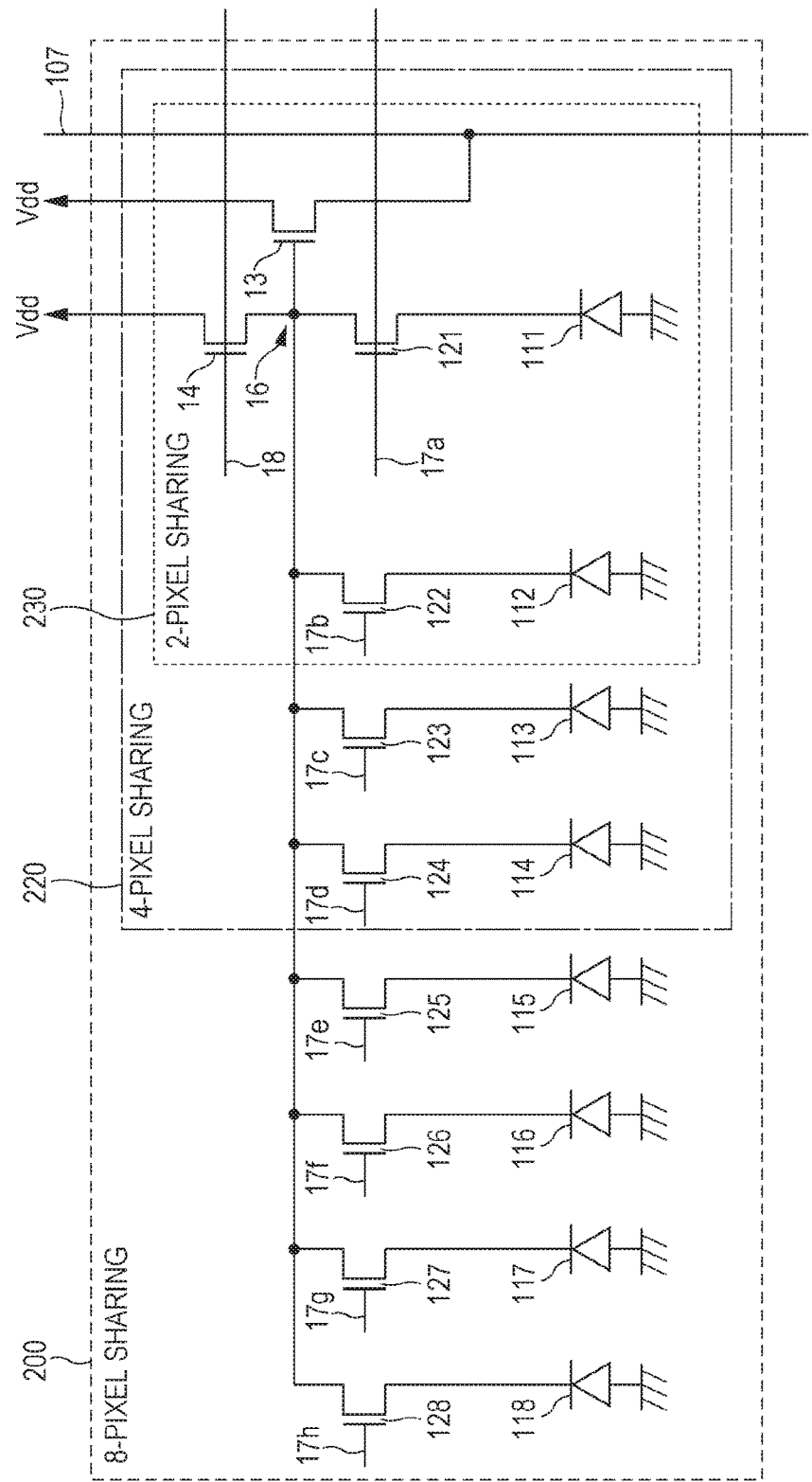
FIG. 12 is an equivalent circuit diagram of a shared pixel unit part in a case where pixels are shared in a 3-transistor-type solid-state imaging device.

Next, the configuration of the shared pixel unit part in a case where the pixel sharing technology is used in the 3-transistor-type CMOS image sensor will be described. FIG. 12 illustrates an equivalent circuit of a shared pixel unit part in the 3-transistor-type CMOS image sensor. FIG. 12 illustrates an example in which one shared pixel unit part 200 shares eight pixels. Furthermore, in the shared pixel unit part 200 shown in FIG. 12, components, which are the same as those of the pixel 80 shown in FIG. 11, are designated with the same reference numerals.

The shared pixel unit part 200 includes eight photodiodes (first photodiode 111 to eighth photodiode 118). Furthermore, the shared pixel unit part 200 includes eight transfer transistors (first transfer transistor 121 to eighth transfer transistor 128), which are provided in such a manner as to correspond to the first photodiode 111 to the eighth photodiode 118, respectively. In addition, the shared pixel unit part 200 includes the amplification transistor 13, the reset transistor 14, and the FD area 16, which are shared among the eight pixels.

As is clear from the comparison between FIG. 12 and FIG. 3, the shared pixel unit part 200 of the 3-transistor-type CMOS image sensor has a configuration in which the selection transistor 15 in the shared pixel unit part 110 of the 4-transistor-type CMOS image sensor shown in FIG. 3 is omitted. In the shared pixel unit part 200, the configuration other than the omitted selection transistor 15 is the same as that of the shared pixel unit part 110 of the 4-transistor-type CMOS image sensor. Therefore, here, a detailed description of the connection relationships among the various photodiodes, the various transistors, and the FD area 16 in the equivalent circuit of the shared pixel unit part 200 will be omitted.

Layout of Shared Pixel Unit Part (1) Layout of Entire Shared Pixel Unit Part

Figure 13:
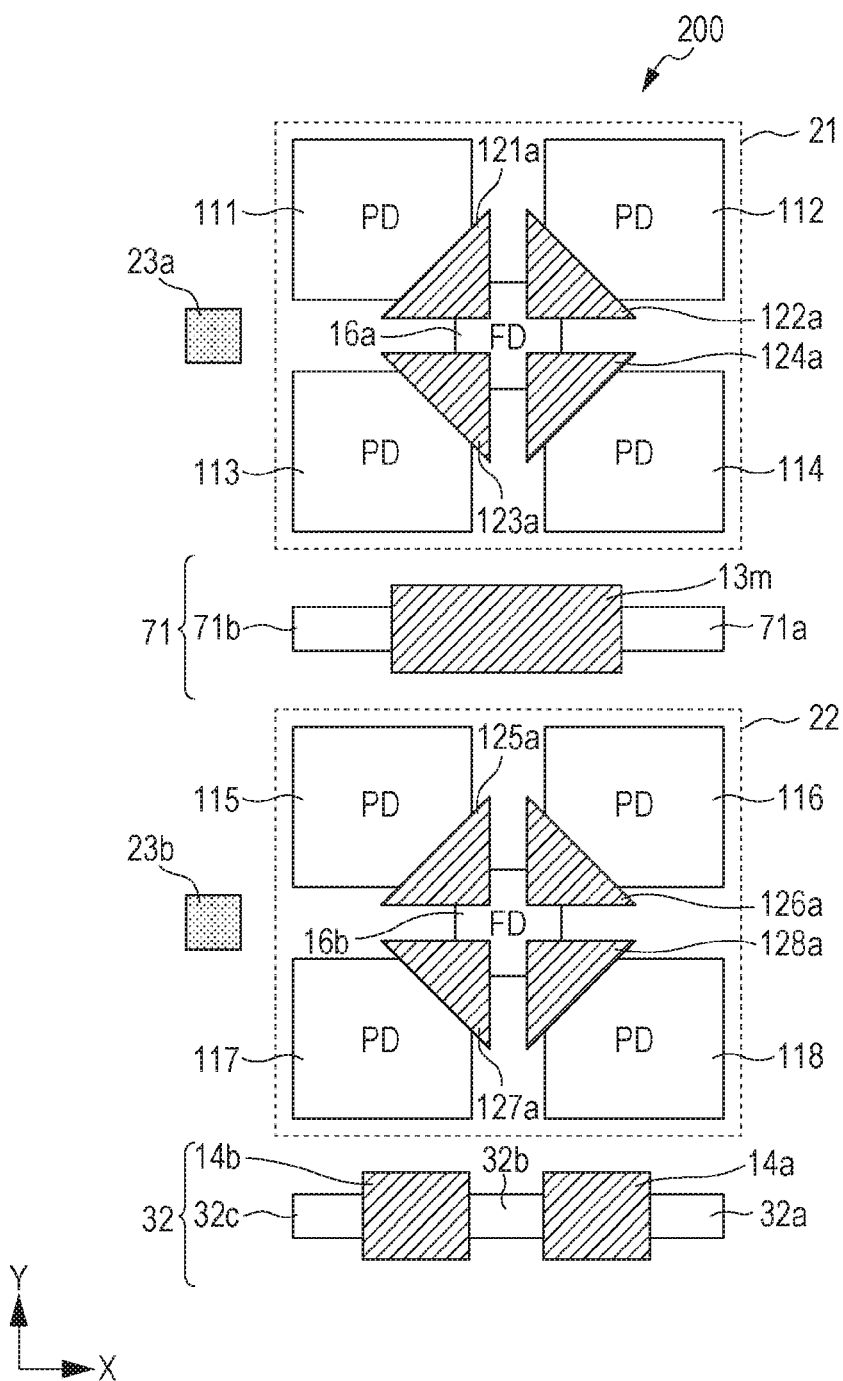
FIG. 13 is a schematic layout plan view of a shared pixel unit part in a solid-state imaging device according to a fourth embodiment.

FIG. 13 illustrates a schematic plan view of a layout configuration of the shared pixel unit part 200 of the present embodiment. In the layout configuration of the shared pixel unit part 200 shown in FIG. 13, components corresponding to the components within the equivalent circuit of the shared pixel unit part 200 shown in FIG. 12 are designated with the same reference numerals. In addition, in the layout configuration of the shared pixel unit part 200 shown in FIG. 13, components, which are the same as the components of the shared pixel unit part 110 of the first embodiment shown in FIG. 4, are designated with the same reference numerals.

The shared pixel unit part 200 includes a first light-receiving unit 21, a second light-receiving unit 22, a first well contact 23a, a second well contact 23b, a first transistor group 71, and a second transistor group 32.

As is clear from the comparison between FIG. 13 and FIG. 4, configurations of the first light-receiving unit 21, the second light-receiving unit 22, the first well contact 23a, and the second well contact 23b are the same as the configurations of the corresponding units of the first embodiment. Therefore, here, a description of the layout configuration of each unit will be omitted.

Since the CMOS image sensor of the present embodiment is the 3-transistor-type CMOS image sensor, a selection transistor, which is provided in the first embodiment, is not provided in the shared pixel unit part 200. Therefore, in the present embodiment, the amplification transistor 13 is arranged in the first transistor group 71 and the reset transistor 14 is provided in the second transistor group 32.

As shown in FIG. 13, the first transistor group 71 is arranged between the first light-receiving unit 21 and the second light-receiving unit 22, in the same manner as the first embodiment. In addition, the second transistor group 32 is arranged in an area on a side opposite to the arrangement side of the first transistor group 71 of the second light-receiving unit 22 in the surrounding area of the second light-receiving unit 22.

In the present embodiment, each transistor group is formed to extend along the horizontal direction (in the X direction in FIG. 13) from a position in the vicinity of one of the end portions of the light-receiving unit to a position in the vicinity of the other of the end portions, in the same manner as the first embodiment. At this time, in the present embodiment, the transistor groups are arranged so that the positions at both ends of the first transistor group 71 in the horizontal direction become substantially the same positions at both ends of the second transistor group 32.

In the CMOS image sensor of the present embodiment, the respective units are arranged within the shared pixel unit part 200 as described above, and the units are electrically connected to each other using various contacts and internal wiring (not shown) such that the connection relationships among the units in the equivalent circuit shown in FIG. 12 are satisfied.

(2) Layout of Each Unit of Shared Pixel Unit Part

The layout configuration of each unit within the shared pixel unit part 200 will be described with reference to FIG. 13.

The second transistor group 32 has the same configuration as that of the first embodiment and is constituted by two reset transistors. That is, in the present embodiment, in the same manner as the first embodiment, one reset transistor is added. The two reset transistors are arranged along the horizontal direction (in the X direction in FIG. 13).

The first transistor group 71 is constituted by a single amplification transistor 13, and includes an amplification gate 13m of the amplification transistor 13, a first source/drain 71a and a second source/drain 71b. In the present embodiment, along the horizontal direction (in the X direction in FIG. 13), the first source/drain 71a, the amplification gate 13m, and the second source/drain 71b are arranged in this order. At this time, each gate and each source/drain are arranged so that the second source/drain 71b is positioned on the side of the first well contact 23a in the horizontal direction. In addition, at this time, the amplification gate 13m is arranged substantially at the center of the formation area of the first transistor group 71.

In the first transistor group 71, the first source/drain 71a, the amplification gate 13m, and the second source/drain 71b constitute the amplification transistor 13. In the first transistor group 71, one of the first source/drain 71a and the second source/drain 71b acts as the source of the amplification transistor 13, and the other thereof acts as the drain.

In the present embodiment, the area of the amplification gate 13m is set to be greater than the area of each reset gate within the second transistor group 32. Specifically, the extension length of the amplification gate 13m in the horizontal direction (X direction in FIG. 13) is lengthened more than that of each reset gate. However, at this time, the area and the shape of the amplification gate 13m are set so that the area of the amplification gate 13m becomes approximately the same as the sum total of the area of the first reset gate 14a and the area of the second reset gate 14b within the second transistor group 32. In other words, the area and the shape of each gate and source/drain are set so that the occupation area of the gate and the source/drain in the first transistor group 71 becomes substantially the same as the occupation area of the gate and the source/drain of the second transistor group 32, respectively.

In the case where each transistor group is configured in the manner described above, in the present embodiment as well, in the same manner as the first embodiment, the layout configuration of the first transistor group 71 (first layout configuration: the pattern and the size of the gate and source/drain) becomes substantially symmetrical to the layout configuration of the second transistor group 32 (second layout configuration). Therefore, in the present embodiment, the problems that arise due to the asymmetry of the layout configurations between the first transistor group 71 and the second transistor group 32 can be solved, and thus it is possible to achieve the same effect as in the first embodiment.

In the present embodiment as well, one of the two reset transistors provided in the second transistor group 32 may be made not to function as a transistor. In addition, the layout configuration of the shared pixel unit part 200 is not limited to the example shown in FIG. 13. For example, the layout configuration of each transistor group described in the above-described modified examples 1 to 3 (FIGS. 5 to 7) may be applied to the layout configuration of each transistor group of the shared pixel unit part 200 of the present embodiment. In addition, although an example in which a single amplification transistor 13 is provided in the first transistor group 71 has been described in the present embodiment, the present disclosure is not limited thereto, and a plurality of amplification transistors 13 may be provided in the first transistor group 71.

6. Fifth Embodiment

In the fifth embodiment, in the 3-transistor-type CMOS image sensor, a configuration example in which a single shared pixel unit part shares four pixels will be described. The entire configuration of the CMOS image sensor according to the present embodiment is the same configuration according to the above-described first embodiment (FIG. 1), and thus a description thereof will be omitted here. Configuration of shared pixel unit part A configuration of a shared pixel unit part in a case where four pixels are shared in the 3-transistor-type CMOS image sensor will be described with reference to FIG. 12. In a case where four pixels are shared, an equivalent circuit of an area surrounded by the single dot chain line in FIG. 12 is an equivalent circuit of a shared pixel unit part 220.

The shared pixel unit part 220 includes four photodiodes (first photodiode 111 to fourth photodiode 114). Furthermore, the shared pixel unit part 220 includes four transfer transistors (first transfer transistor 121 to fourth transfer transistor 124), which are provided in such a manner as to correspond to the first photodiode 111 to the fourth photodiode 114, respectively. In addition, the shared pixel unit part 220 includes the amplification transistor 13, the reset transistor 14, and the FD area 16 which are shared among the four pixels.

In the shared pixel unit part 220, four circuits each formed of a transfer transistor and a photodiode corresponding thereto are provided, and the four circuits are connected in parallel between the FD area 16 and the ground, as shown in FIG. 12. The present embodiment has the same configuration as the fourth embodiment except that the number of the circuits formed of the transfer transistors and the photodiodes connected to the FD area 16 is different from that in the fourth embodiment. Therefore, here, a detailed description of the connection relationships among the various photodiodes, the various transistors, and the FD area 16 in the equivalent circuit of the shared pixel unit part 220 will be omitted.

Layout of Shared Pixel Unit Part (1) Layout of Entire Shared Pixel Unit Part

Figure 14:
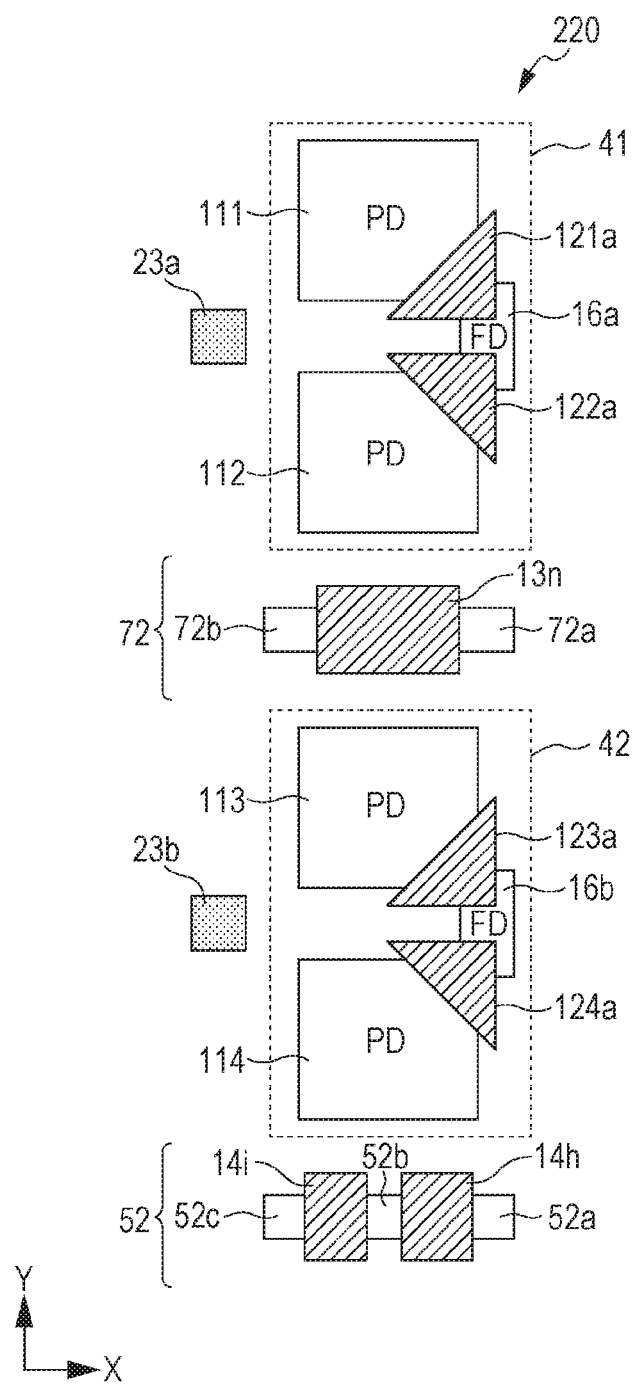
FIG. 14 is a schematic layout plan view of a shared pixel unit part in a solid-state imaging device according to a fifth embodiment.

FIG. 14 illustrates a schematic plan view of a layout configuration of the shared pixel unit part 220 of the present embodiment. In the layout configuration of the shared pixel unit part 220 shown in FIG. 14, components corresponding to the components within the equivalent circuit of the shared pixel unit part 220 shown in FIG. 12 are designated with the same reference numerals. In addition, in the layout configuration of the shared pixel unit part 220 shown in FIG. 14, components, which are the same as the components of the shared pixel unit part 160 of the second embodiment shown in FIG. 9, are designated with the same reference numerals.

The shared pixel unit part 220 includes a first light-receiving unit 41, a second light-receiving unit 42, a first well contact 23a, a second well contact 23b, a first transistor group 72, and a second transistor group 52.

As is clear from the comparison between FIG. 14 and FIG. 9, configurations of the first light-receiving unit 41, the second light-receiving unit 42, the first well contact 23a, and the second well contact 23b are the same as the configurations of the corresponding units of the second embodiment. Therefore, here, a description of the configuration of each unit will be omitted. In addition, in the present embodiment, the amplification transistor 13 is arranged in the first transistor group 72 and the reset transistor 14 is provided in the second transistor group 52.

The first transistor group 72 is arranged between the first light-receiving unit 41 and the second light-receiving unit 42, as shown in FIG. 14, in the same manner as the second embodiment. In addition, the second transistor group 52 is arranged in an area on a side opposite to the arrangement side of the first transistor group 72 of the second light-receiving unit 42 in the surrounding area of the second light-receiving unit 42.

In the present embodiment, in the same manner as the second embodiment, each transistor group is formed to extend along the horizontal direction (in the X direction in FIG. 14) from a position in the vicinity of one of the end portions of the light-receiving unit to a position in the vicinity of the other of the end portions. At this time, in the present embodiment, the transistor groups are arranged so that the positions at both ends of the first transistor group 72 in the horizontal direction become substantially the same positions at both ends of the second transistor group 52.

In the CMOS image sensor of the present embodiment, the respective units are arranged within the shared pixel unit part 220 as described above, and the units are electrically connected to each other using various contacts and internal wiring (not shown) such that the connection relationships among the units in the equivalent circuit shown in FIG. 12 are satisfied.

(2) Layout of Each Unit of Shared Pixel Unit Part

The layout configuration of each unit within the shared pixel unit part 220 will be described with reference to FIG. 14.

The second transistor group 52 has the same configuration as that of the second embodiment and is constituted by two reset transistors. That is, in the present embodiment, in the same manner as the second embodiment, one reset transistor is added. The two reset transistors are arranged along the horizontal direction (in the X direction in FIG. 14).

The first transistor group 72 includes a single amplification transistor 13, and includes an amplification gate 13n of the amplification transistor 13, a first source/drain 72a and a second source/drain 72b. In the present embodiment, along the horizontal direction (in the X direction in FIG. 14), the first source/drain 72a, the amplification gate 13n, and the second source/drain 72b are arranged in this order. At this time, each gate and each source/drain are arranged so that the second source/drain 72b is positioned on the side of the first well contact 23a in the horizontal direction. In addition, at this time, the amplification gate 13n is arranged substantially at the center of the formation area of the first transistor group 72.

In the first transistor group 72, the first source/drain 72a, the amplification gate 13n, and the second source/drain 72b constitute the amplification transistor 13. In the first transistor group 72, one of the first source/drain 72a and the second source/drain 72b acts as the source of the amplification transistor 13, and the other thereof acts as the drain.

In the present embodiment, the area of the amplification gate 13n is set to be greater than the area of each reset gate within the second transistor group 52. Specifically, the extension length of the amplification gate 13n in the horizontal direction (X direction in FIG. 14) is lengthened more than that of each reset gate. However, at this time, the area and the shape of the amplification gate 13n are set so that the area of the amplification gate 13n becomes approximately the same as the sum total of the area of the first reset gate 14h and the area of the second reset gate 14i within the second transistor group 52. In other words, the area and the shape of each gate and source/drain are set so that the occupation area of the gate and the source/drain in the first transistor group 72 becomes substantially the same as the occupation area of the gate and the source/drain of the second transistor group 52, respectively.

In the case where each transistor group is configured in the manner described above, in the present embodiment as well, the layout configuration of the first transistor group 72 (first layout configuration: the pattern and the size of the gate and source/drain) becomes substantially symmetrical to the layout configuration of the second transistor group 52 (second layout configuration). Therefore, in the present embodiment, the problems that arise due to the asymmetry of the layout configurations between the first transistor group 72 and the second transistor group 52 can be solved, and thus it is possible to achieve the same effect as in the first embodiment.

In the present embodiment as well, one of the two reset transistors provided in the second transistor group 52 may be made not to function as a transistor. In addition, the layout configuration of the shared pixel unit part 220 is not limited to the example shown in FIG. 14. For example, the layout configuration of each transistor group described in the above-described modified examples 1 to 3 (FIGS. 5 to 7) may be applied to the layout configuration of each transistor group of the shared pixel unit part 220 of the present embodiment. In addition, although an example in which a single amplification transistor 13 is provided in the first transistor group 72 has been described in the present embodiment, the present disclosure is not limited thereto, and a plurality of amplification transistors 13 may be provided in the first transistor group 72.

7. Sixth Embodiment

In the sixth embodiment, in the 3-transistor-type CMOS image sensor, a configuration example in which a single shared pixel unit part shares two pixels will be described. The entire configuration of the CMOS image sensor according to the present embodiment is the same configuration according to the above-described first embodiment (FIG. 1), and thus a description thereof will be omitted here.

Configuration of Shared Pixel Unit Part

A configuration of a shared pixel unit part in a case where two pixels are shared in the 3-transistor-type CMOS image sensor will be described with reference to FIG. 12. In a case where two pixels are shared, an equivalent circuit of an area surrounded by the dotted line in FIG. 12 is an equivalent circuit of a shared pixel unit part 230.

The shared pixel unit part 230 includes two photodiodes (first photodiode 111 and second photodiode 112). Furthermore, the shared pixel unit part 230 includes two transfer transistors (the first transfer transistor 121 and the second transfer transistor 122), which are provided in such a manner as to correspond to the first photodiode 111 and the second photodiode 112, respectively. In addition, the shared pixel unit part 230 includes the amplification transistor 13, the reset transistor 14, and the FD area 16 which are shared among the two pixels.

In the shared pixel unit part 230, as shown in FIG. 12, two circuits each formed of a transfer transistor and a photodiode corresponding thereto are provided, and the two circuits are connected in parallel between the FD area 16 and the ground. The present embodiment has the same configuration as the fourth embodiment except that the number of the circuits formed of the transfer transistors and the photodiodes connected to the FD area 16 is different from that in the fourth embodiment. Therefore, here, a detailed description of the connection relationships among the various photodiodes, the various transistors, and the FD area 16 in the equivalent circuit of the shared pixel unit part 230 will be omitted.

Layout of Shared Pixel Unit Part (1) Layout of Entire Shared Pixel Unit Part

Figure 15:
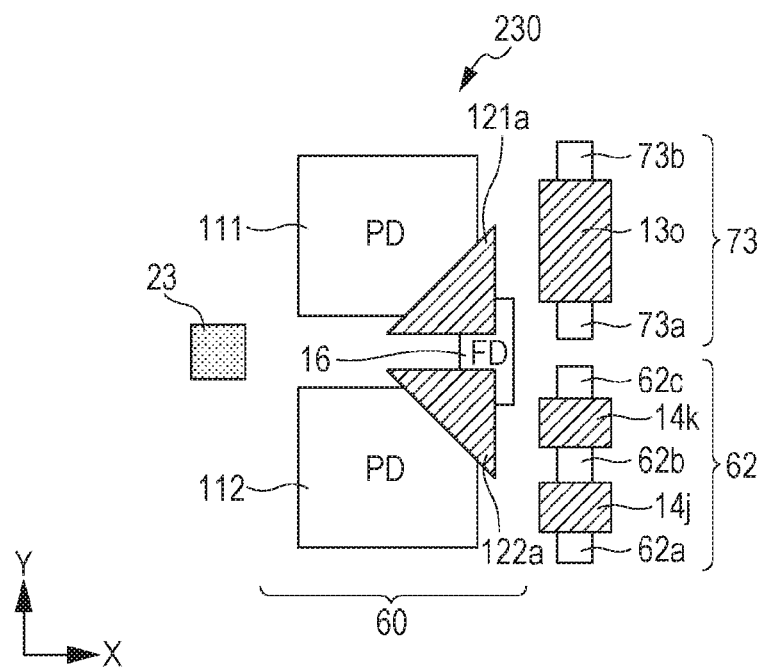
FIG. 15 is a schematic layout plan view of a shared pixel unit part in a solid-state imaging device according to a sixth embodiment.

FIG. 15 illustrates a schematic plan view of a layout configuration of the shared pixel unit part 230 of the present embodiment. In the layout configuration of the shared pixel unit part 230 shown in FIG. 15, components corresponding to the components within the equivalent circuit of the shared pixel unit part 230 shown in FIG. 12 are designated with the same reference numerals. In addition, in the layout configuration of the shared pixel unit part 230 shown in FIG. 15, components, which are the same as the components of the shared pixel unit part 170 of the third embodiment shown in FIG. 10, are designated with the same reference numerals.

The shared pixel unit part 230 includes a light-receiving unit 60, a well contact 23, a first transistor group 73, and a second transistor group 62.

As is clear from the comparison between FIG. 15 and FIG. 10, configurations of the light-receiving unit 60 and the well contact 23 are the same as the configurations of the corresponding units of the third embodiment. Therefore, here, a description of the configuration of each unit will be omitted. In addition, in the present embodiment, the amplification transistor 13 is arranged in the first transistor group 73 and the reset transistor 14 is provided in the second transistor group 62.

The first transistor group 73 and the second transistor group 62 are arranged in a surrounding area on a side opposing the well contact 23 side of the light-receiving unit 60 and are arranged so as to be spaced apart from each other with a predetermined gap along the vertical direction (the Y direction in FIG. 15). In addition, at this time, the first transistor group 73 and the second transistor group 62 are respectively arranged at positions opposing the first photodiode 111 and the second photodiode 112 of the light-receiving unit 60. Further, each transistor group is formed to extend along the vertical direction (in the Y direction in FIG. 15) of the light-receiving unit 60 from a position in the vicinity of one of the end portions of the corresponding photodiode to a position in the vicinity of the other of the end portions.

In the CMOS image sensor of the present embodiment, as described above, the respective units are arranged within the shared pixel unit part 230, and the units are electrically connected to each other using various contacts and internal wiring (not shown) such that the connection relationships among the units in the equivalent circuit shown in FIG. 12 are satisfied.

(2) Layout of Each Unit of Shared Pixel Unit Part

The layout configuration of each unit within the shared pixel unit part 230 will be described with reference to FIG. 15.

The second transistor group 62 has the same configuration as that of the third embodiment and is constituted by two reset transistors. That is, in the present embodiment, in the same manner as the third embodiment, one reset transistor is added. The two reset transistors are arranged along the vertical direction (in the Y direction in FIG. 15).

The first transistor group 73 is constituted by a single amplification transistor 13, and includes an amplification gate 13o of the amplification transistor 13, a first source/drain 73a and a second source/drain 73b. In the present embodiment, along the vertical direction (in the Y direction in FIG. 15), the first source/drain 73a, the amplification gate 13o, and the second source/drain 73b are arranged in this order. At this time, each gate and each source/drain are arranged so that the first source/drain 73a is positioned on the FD area 16 side in the vertical direction. In addition, at this time, the amplification gate 13o is arranged substantially at the center of the formation area of the first transistor group 73.

In the first transistor group 73, the first source/drain 73a, the amplification gate 13o, and the second source/drain 73b constitute the amplification transistor 13. In the first transistor group 73, one of the first source/drain 73a and the second source/drain 73b acts as the source of the amplification transistor 13, and the other thereof acts as the drain.

In the present embodiment, the area of the amplification gate 13o is set to be greater than the area of each reset gate within the second transistor group 62. Specifically, the extension length of the amplification gate 13o in the vertical direction (Y direction in FIG. 15) is lengthened more than that of each reset gate. However, at this time, the area and the shape of the amplification gate 13o are set so that the area of the amplification gate 13o becomes approximately the same as the sum total of the area of the first reset gate 14j and the area of the second reset gate 14k within the second transistor group 62. In other words, the area and the shape of each gate and source/drain are set so that the occupation area of the gate and the source/drain in the first transistor group 73 becomes substantially the same as the occupation area of the gate and the source/drain of the second transistor group 62, respectively.

In the case where each transistor group is configured in the manner described above, in the present embodiment as well, the layout configuration of the first transistor group 73 (first layout configuration: the pattern and the size of the gate and source/drain) becomes substantially symmetrical to the layout configuration of the second transistor group 62 (second layout configuration). Therefore, in the present embodiment, the problems that arise due to the asymmetry of the layout configurations between the first transistor group 73 and the second transistor group 62 can be solved, and thus it is possible to achieve the same effect as in the first embodiment.

In the present embodiment as well, one of the two reset transistors provided in the second transistor group 62 may be made not to function as a transistor. In addition, the layout configuration of the shared pixel unit part 230 is not limited to the example shown in FIG. 15. For example, the layout configuration of each transistor group described in the above-described modified examples 1 to 3 (FIGS. 5 to 7) may be applied to the layout configuration of each transistor group of the shared pixel unit part 230 of the present embodiment. In addition, although an example in which a single amplification transistor 13 is provided in the first transistor group 73 has been described in the present embodiment, the present disclosure is not limited thereto, and a plurality of amplification transistors 13 may be provided in the first transistor group 73.

8. Seventh Embodiment

In the seventh embodiment, a configuration example of the 4-transistor-type back-illuminated CMOS image sensor different from that of the first to third embodiments will be described. The entire configuration of the CMOS image sensor according to the present embodiment is the same configuration according to the above-described first embodiment (FIG. 1), and thus a description thereof will be omitted here.

Configuration of Shared Pixel Unit Part

In the present embodiment, the shared pixel unit part has a configuration in which one amplification transistor is added in the configuration of the shared pixel unit part of the first embodiment shown in FIG. 3 and thus two amplification transistors are provided as described later in detail.

Layout of Shared Pixel Unit Part

Figure 16:
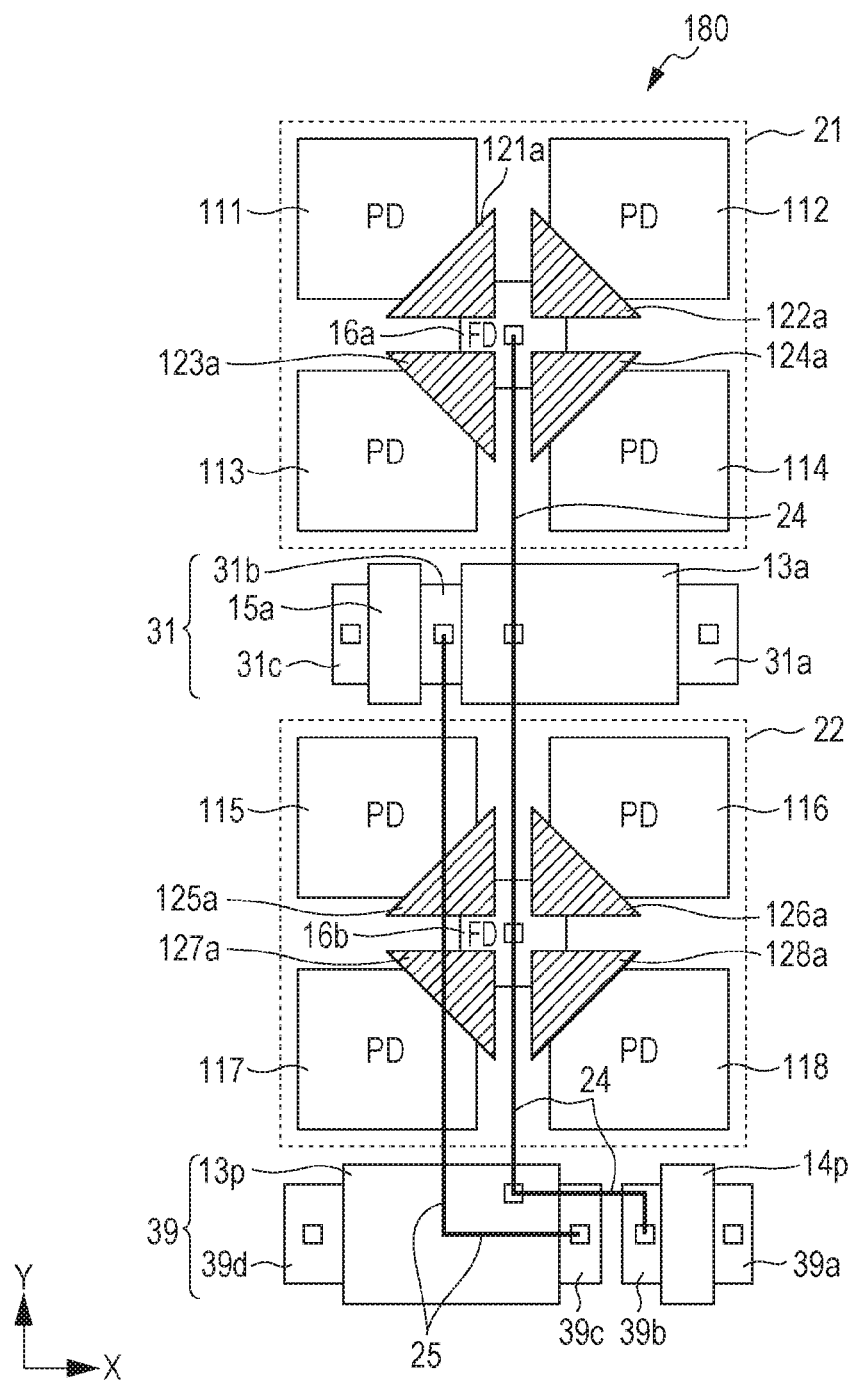
FIG. 16 is a schematic layout plan view of a shared pixel unit part in a solid-state imaging device according to a seventh embodiment.

FIG. 16 illustrates a schematic plan view of a layout configuration of the shared pixel unit part in the CMOS image sensor (solid-state imaging device) of the present embodiment. In the layout configuration of a shared pixel unit part 180 shown in FIG. 16, components corresponding to the components of the shared pixel unit part 110 of the first embodiment shown in FIG. 4 are designated with the same reference numerals.

The shared pixel unit part 180 is a shared pixel unit part which shares eight pixels, and includes a first light-receiving unit 21, a second light-receiving unit 22, a first transistor group 31, and a second transistor group 39. Although not shown in FIG. 16, well contacts are provided in the same manner as the first well contact 23a and the second well contact 23b shown in FIG. 4. On the other hand, in FIG. 16, wires 24 and 25 connecting FD areas 16a and 16b and the transistor groups 31 and 39 to each other, which are not shown in FIG. 4, are shown.

As shown in FIG. 16, the shared pixel unit part 180 includes the first transistor group 31 which has the same configuration as in the first embodiment, and the second transistor group 39 which has a configuration different from that in the first embodiment with respect to the shared pixel unit part 110 of the first embodiment. In the present embodiment, configurations of the first light-receiving unit 21 and the second light-receiving unit 22 are the same as those of the first embodiment shown in FIG. 4, and, here, configurations of the first transistor group 31 and the second transistor group 39 will be described.

As shown in FIG. 16, the first transistor group 31 is arranged between the first light-receiving unit 21 and the second light-receiving unit 22. In addition, the second transistor group 39 is arranged in an area on a side opposite to the arrangement side of the first transistor group 31 of the second light-receiving unit 22 in the surrounding area of the second light-receiving unit 22.

In the present embodiment as well, in the same manner as the first embodiment, each transistor group is formed to extend along the horizontal direction (in the X direction in FIG. 16) from a position in the vicinity of one of the end portions of the light-receiving unit to a position in the vicinity of the other of the end portions.

Further, although not shown in FIG. 16, the first light-receiving unit 21, the second light-receiving unit 22, the first transistor group 31, and the second transistor group 39 are formed in a predetermined well area formed in a Si substrate. In the present embodiment, in the same manner as the first embodiment, although not shown, well contacts that electrically connect the well area to the internal wiring are provided separately in two portions.

The first transistor group 31 includes, as shown in FIG. 16, a first amplification gate 13a of a first amplification transistor 13a, a selection gate 15a of the selection transistor, and a first source/drain 31a to a third source/drain 31c. In the present embodiment, along the horizontal direction (in the X direction in FIG. 16) from the right to the left, the first source/drain 31a, the first amplification gate 13a, the second source/drain 31b, the selection gate 15a, and the third source/drain 31c are arranged in this order. In FIG. 16, the lengths in the horizontal direction (X direction) and the widths in the vertical direction (Y direction) of the gates 13a and 15a and the sources/drains 31a, 31b and 31c are different from those in the first embodiment of FIG. 4. On the other hand, the arrangements of the gates 13a and 15a and the sources/drains 31a, 31b and 31c are the same as the arrangements of the first embodiment of FIG. 4. In addition, in FIG. 16, the contacts between wires and the amplification gate 13a and the sources/drains 31a, 31b and 31c, which are not shown in FIG. 4, are shown. The first amplification gate 13a is connected to the wire 24 via the contact. The first source/drain 31a is connected to a wire (refer to FIG. 17) for supplying the power-supply voltage Vdd via the contact. The second source/drain 31b is connected to the wire 25 via the contact. The third source/drain 31c is connected to a vertical signal line 107 (refer to FIG. 17) via the contact. In addition, the wire 24 is connected to the FD area 16a and the FD area 16b via the contact.

The second transistor group 39 is constituted by a reset transistor and a second amplification transistor, and includes, as shown in FIG. 16, a reset gate 14p, a second amplification gate 13p of the second amplification transistor, and a fourth source/drain 39a to a seventh source 39d. In addition, the fourth source/drain 39a, the reset gate 14p, the fifth source/drain 39b, the sixth source/drain 39c, the second amplification gate 13p, and the seventh source/drain 39d are arranged in this order along the horizontal direction (X direction in FIG. 16) from the right to the left. In FIG. 16, contacts between the wires and the amplification gate 13p and the sources/drains 39a, 39b, 39c and 39d, which are not shown in FIG. 4, are shown. The fourth source/drain 39a is connected to the wire for supplying the power-supply voltage Vdd via the contact. The fifth source/drain 39b is connected to the wire 24 via the contact. The sixth source/drain 39c is connected to the wire 25 via the contact. The second amplification gate 13p is connected to the wire 24 via the contact. The seventh source/drain 39d is connected to the wire for supplying the power-supply voltage Vdd via the contact.

Furthermore, at this time, the fifth source/drain 39b is arranged so as to be spaced apart with a predetermined gap from the sixth source/drain 39c as shown in FIG. 16.

In the second transistor group 39, the fourth source/drain 39a, the reset gate 14p, and the fifth source/drain 39b constitute the reset transistor. In addition, the sixth source/drain 39c, the second amplification gate 13p, and the seventh source/drain 39d constitute the second amplification transistor.

Figure 17:
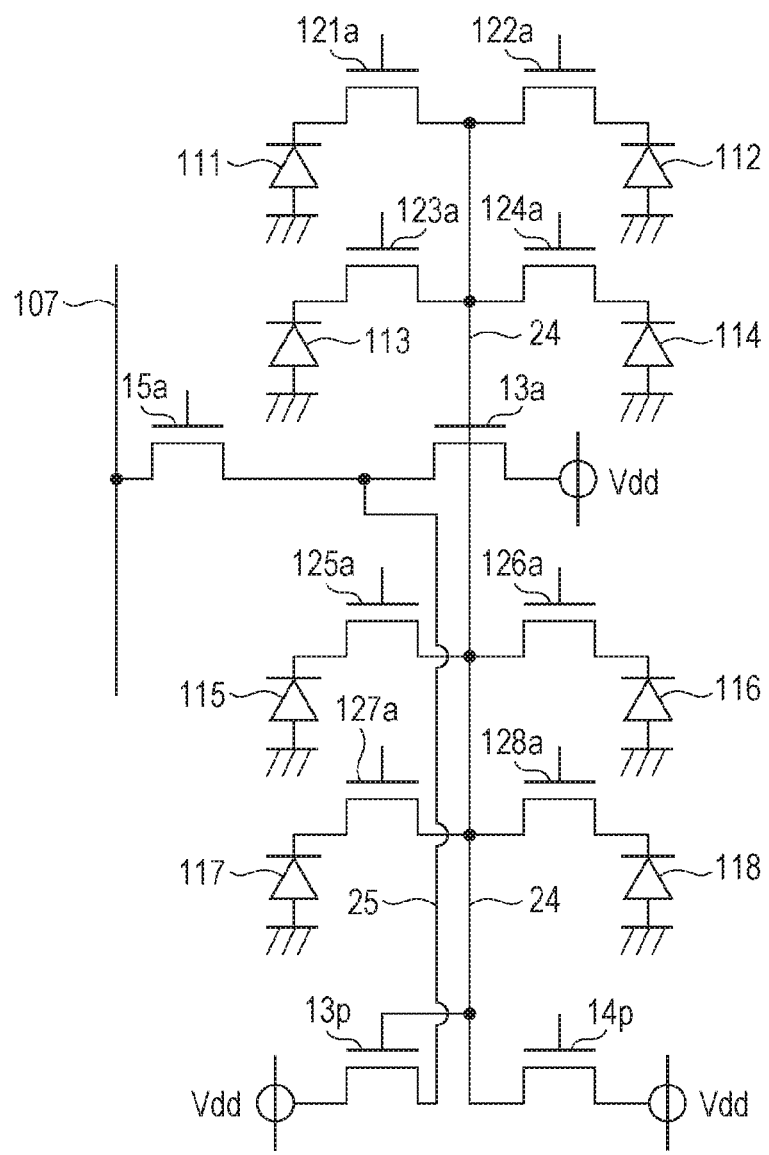
FIG. 17 is an equivalent circuit diagram of a shared pixel unit part in a solid-state imaging device according to the seventh embodiment.

FIG. 17 illustrates an equivalent circuit diagram of the shared pixel unit part of the solid-state imaging device of the present embodiment.

In FIG. 17, the first amplification transistor and the second amplification transistor are connected in parallel between the wire 25 which is connected to the selection transistor formed of the selection gate 15a, and the wire for supplying the power-supply voltage Vdd. In other words, the equivalent circuit diagram of FIG. 17 provides a configuration in which the two amplification transistors are connected in parallel between the selection transistor 15 and the wire for supplying the power-supply voltage Vdd in the equivalent circuit diagram of FIG. 3 described in the first embodiment. In addition, the source/drain of the selection transistor formed of the selection gate 15a, on a side opposite to the wire 25, is connected to the vertical signal line 107.

In the present embodiment, the first amplification gate 13a of the first transistor group 31 has the dimension and the area equivalent to those of the second amplification gate 13p of the second transistor group 39. In addition, in the present embodiment, the area of the amplification gates 13a and 13p is made greater than the area of the selection gate 15a or the second reset gate 14p.

In FIG. 16, since the selection gate 15a and the reset gate 14p have the equivalent dimension and area, the sum total of the area of the gates of the first transistor group 31 is approximately the same as that of the second transistor group 39. Therefore, in the shared pixel unit part 180, the occupation area of the gates in the first transistor group 31 is approximately symmetrical to the occupation area of the gate in the second transistor group 39. That is, in the present embodiment as well, the layout configuration of the first transistor group 31 becomes substantially symmetrical to the layout configuration of the second transistor group 39. Therefore, in the CMOS image sensor of the present embodiment as well, the problems that arise due to the asymmetry of the layout configurations between the first transistor group 31 and the second transistor group 39 can be solved, and thus it is possible to achieve the same effect as in the first embodiment.

Figure 18:
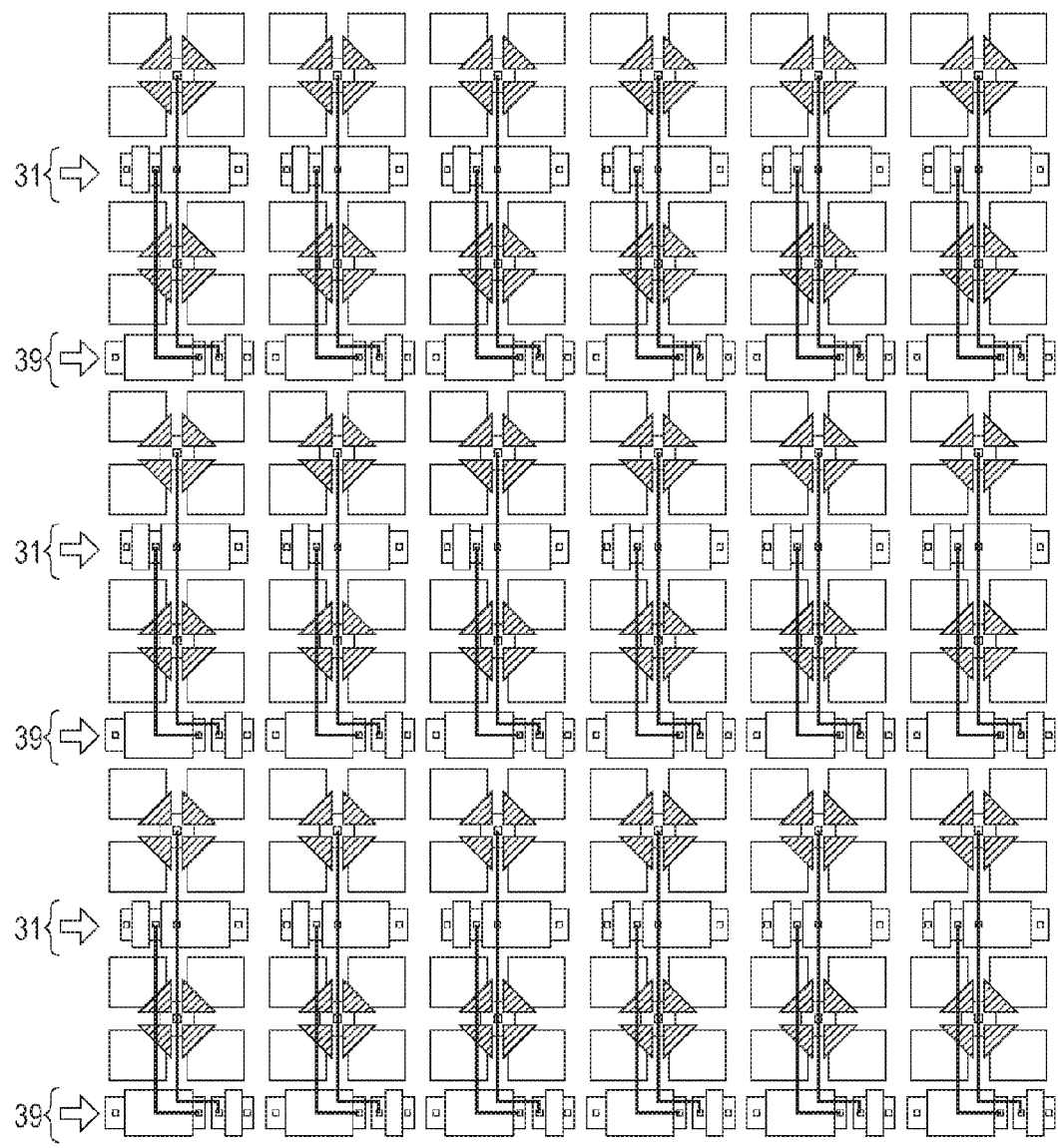
FIG. 18 is a schematic layout plan view of a pixel array unit in a solid-state imaging device according to the seventh embodiment.

Here, FIG. 18 is a schematic layout plan view of a pixel array unit in a solid-state imaging device according to the present embodiment. FIG. 18 shows the configuration of the eight pixels shown in FIG. 16 by arranging three in the vertical direction and six in the horizontal direction. In the present embodiment, since the layout configuration of the first transistor group 31 is substantially symmetrical to the layout configuration of the second transistor group 39, as can be seen from FIG. 18, the density of films (for example, polycrystalline silicon films) forming the gates of the transistors is equivalent in the first transistor group 31 and the second transistor group 39. Accordingly, the sensitivity in the photodiodes PD between the transistors is substantially the same.

Figure 27:
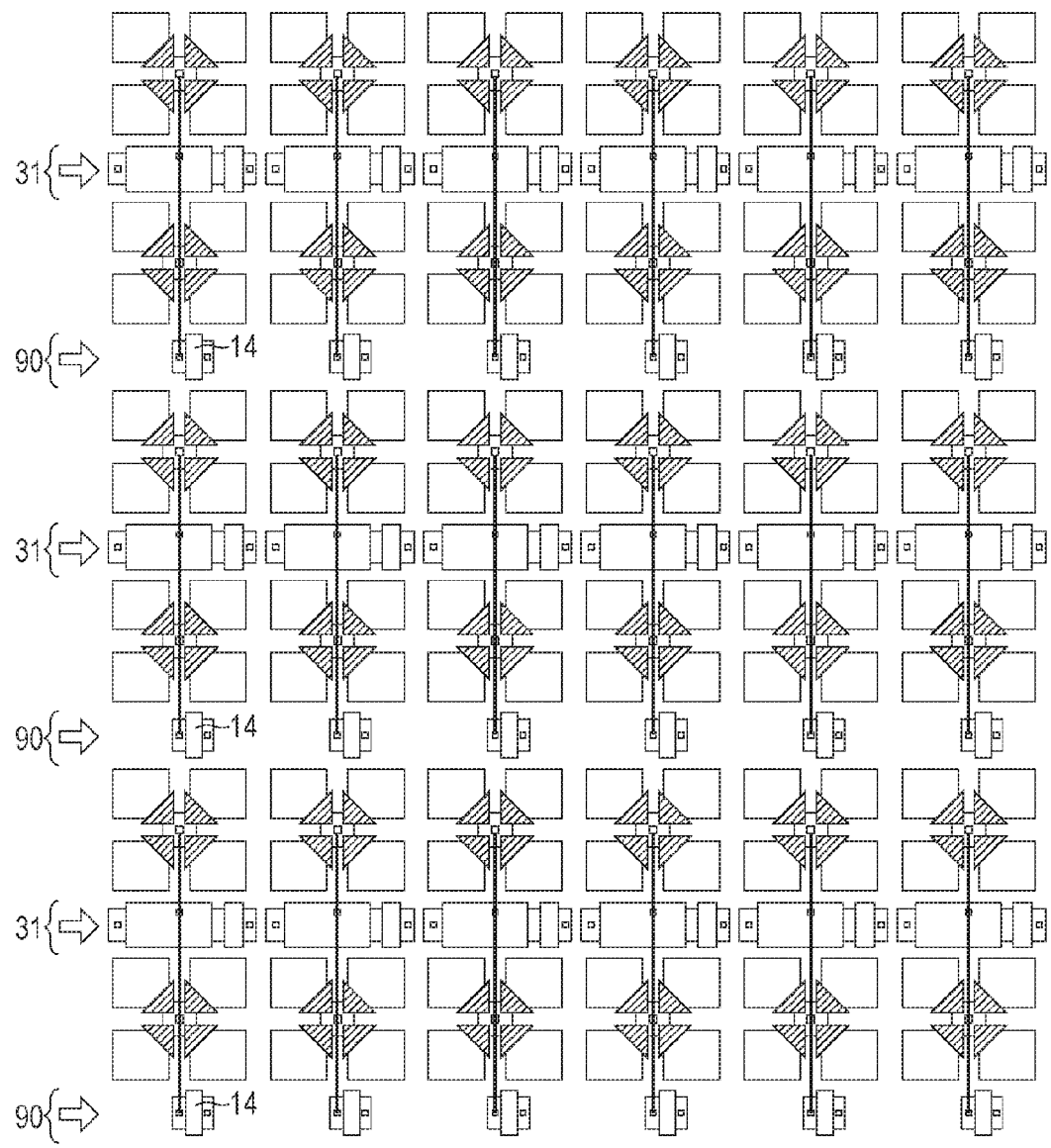
FIG. 27 is a schematic layout plan view of a pixel array unit in a case where only reset transistors are used for a second transistor group.

In addition, as a comparative example, FIG. 27 is a schematic layout plan view of a pixel array unit in a case where only reset transistors are provided in a second transistor group. In FIG. 27, only the reset transistor 14 is used for the second transistor group 90. The first transistor group 31 is the same as that of FIG. 16 and FIG. 18. As illustrated in FIG. 27, in the case where only the reset transistor is provided in the second transistor group 90, the reset transistor is small, and thus other portions of the second transistor group 90 is vacant. For this reason, the density of films (for example, polycrystalline silicon films) forming the gates of the transistors is lower in the second transistor group 90 than in the first transistor group 31. There are cases in which a sensitivity difference occurs in the photodiodes PD between the transistor groups due to this density difference, and thereby a stripe-shaped brightness variation occurs in an image.

Upon comparison with FIG. 27, in FIG. 18, the second amplification transistor is provided in the second transistor group 39 along with the reset transistor, and thus the symmetry of the layout configuration between the first transistor group 31 and the second transistor group 39 is considerably improved.

In addition, in the present embodiment, in the shared pixel unit part 180 in which eight pixels are shared, the two amplification transistors are provided, and thus the entire area of the amplification transistors can be increased as compared with the case where only a single amplification transistor is provided. Accordingly, it is possible to reduce random noise. Further, the mutual conductance gm which increases according to W/L can be increased by increasing the width W of the amplification transistor by using the two amplification transistors which are connected in parallel, and thereby improving a driving performance of the amplification transistors and achieving high speed and improving compatibility. Further, since the two amplification transistors which are connected in parallel are provided in the first transistor group 31 and the second transistor group 39, it is possible to improve symmetry of the layout configuration of the transistor groups as compared with a configuration in which the two amplification transistors which are connected in parallel are formed in the same transistor group.

9. Eighth Embodiment

In the eighth embodiment, another configuration example of the 4-transistor-type back-illuminated CMOS image sensor different from that of the first to third embodiments will be described. The entire configuration of the CMOS image sensor according to the present embodiment is the same configuration according to the above-described first embodiment (FIG. 1), and thus a description thereof will be omitted here.

Configuration of Shared Pixel Unit Part

In the present embodiment, the shared pixel unit part has a configuration in which one amplification transistor is added in the configuration of the shared pixel unit part of the first embodiment shown in FIG. 3 and thus two amplification transistors are provided in the same manner as the seventh embodiment.

Layout of Shared Pixel Unit Part

Figure 19:
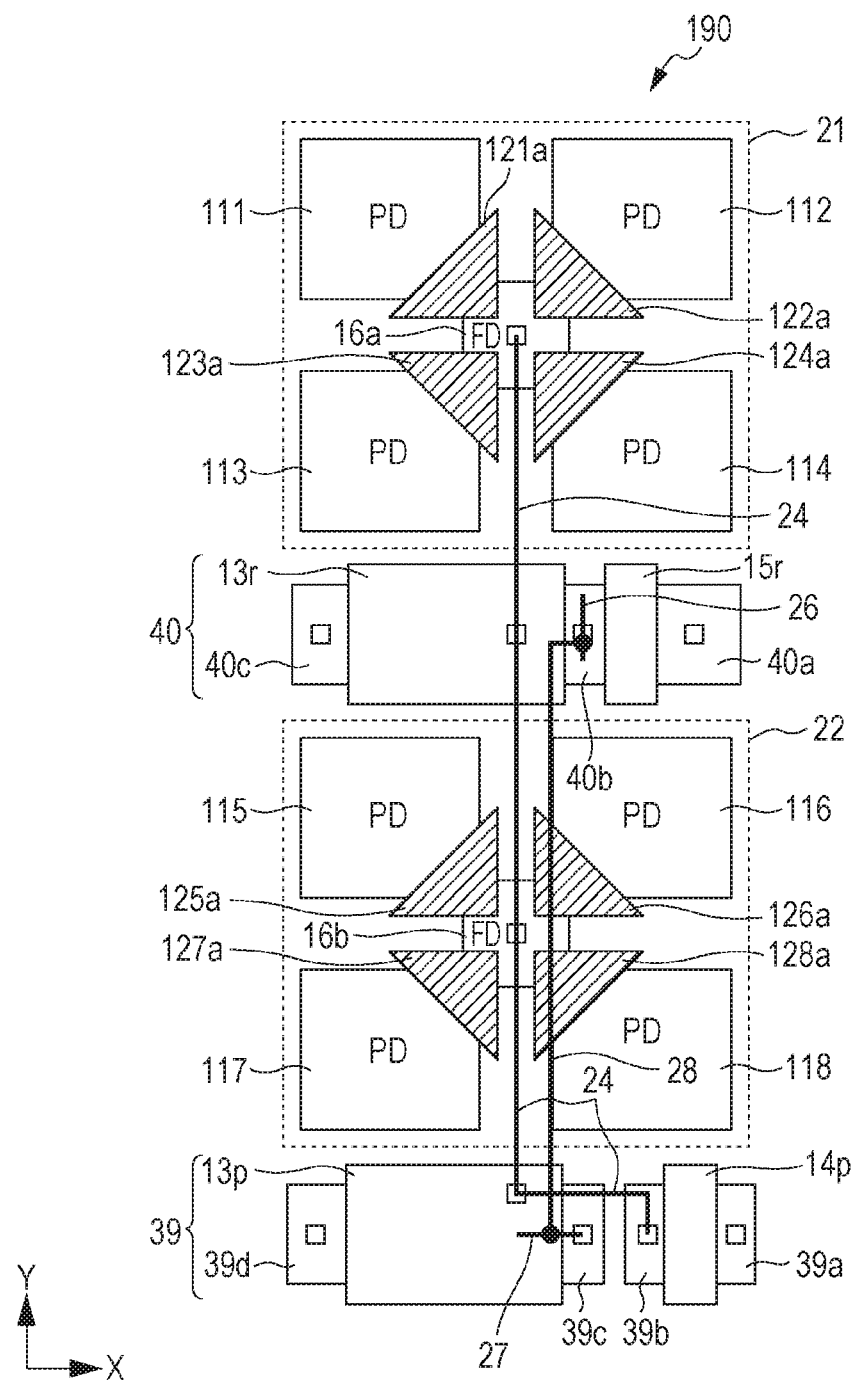
FIG. 19 is a schematic layout plan view of a shared pixel unit part in a solid-state imaging device according to an eighth embodiment.

FIG. 19 illustrates a schematic plan view of a layout configuration of the shared pixel unit part in the CMOS image sensor (solid-state imaging device) of the present embodiment. In the layout configuration of a shared pixel unit part 190 shown in FIG. 19, components corresponding to the components of the shared pixel unit part 110 of the first embodiment shown in FIG. 4 or the components of the shared pixel unit part 180 of the seventh embodiment shown in FIG. 16, are designated with the same reference numerals.

The shared pixel unit part 190 is a shared pixel unit part which shares eight pixels, and includes a first light-receiving unit 21, a second light-receiving unit 22, a first transistor group 40, and a second transistor group 39. Although not shown in FIG. 19, well contacts are provided in the same manner as the first well contact 23a and the second well contact 23b shown in FIG. 4. On the other hand, in FIG. 19, wires 24 and 28 connecting FD areas 16a and 16b and the transistor groups 40 and 39 to each other, which are not shown in FIG. 4, are shown.

As shown in FIG. 19, the shared pixel unit part 190 includes the first transistor group 40 which has a configuration in which arrangement of left and right of the transistors is opposite to the arrangement of the first transistor group of the shared pixel unit part 180 of the seventh embodiment, and the second transistor group 39 which has the same configuration as that of the second transistor group of the shared pixel unit part 180 of the seventh embodiment. In addition, in the present embodiment, configurations of the first light-receiving unit 21 and the second light-receiving unit 22 are the same as those of the first embodiment shown in FIG. 4, and, here, configurations of the first transistor group 40 and the second transistor group 39 will be described.

As shown in FIG. 19, the first transistor group 40 is arranged between the first light-receiving unit 21 and the second light-receiving unit 22. In addition, the second transistor group 39 is arranged in an area on a side opposite to the arrangement side of the first transistor group 40 of the second light-receiving unit 22 in the surrounding area of the second light-receiving unit 22.

In the present embodiment as well, in the same manner as the first embodiment, each transistor group is formed to extend along the horizontal direction (in the X direction in FIG. 19) from a position in the vicinity of one of the end portions of the light-receiving unit to a position in the vicinity of the other of the end portions.

Further, although not shown in FIG. 19, the first light-receiving unit 21, the second light-receiving unit 22, the first transistor group 40, and the second transistor group 39 are formed in a predetermined well area formed in a Si substrate. In the present embodiment, although not shown, well contacts that electrically connect the well area to the internal wiring are provided separately in two portions, similarly to the first embodiment.

The first transistor group 40 includes, as shown in FIG. 19, a selection gate 15r of a selection transistor, a first amplification gate 13r of a first amplification transistor, and a first source/drain 40a to a third source/drain 40c. In the present embodiment, along the horizontal direction (in the X direction in FIG. 19) from the right to the left, the first source/drain 40a, the selection gate 15r, the second source/drain 40b, the first amplification gate 13r, and the third source/drain 40c are arranged in this order. In FIG. 19, the lengths in the horizontal direction (X direction) and the widths in the vertical direction (Y direction) of the gates 13r and 15r and the sources/drains 40a, 40b and 40c are almost equivalent to those in the seventh embodiment of FIG. 16. On the other hand, the arrangements of the gates 13r and 15r and the sources/drains 40a, 40b and 40c are opposite to those of the seventh embodiment of FIG. 16 on the left and right sides. In addition, in FIG. 19, the contacts between the wires and the amplification gate 13r and the sources/drains 40a, 40b and 40c, which are not shown in FIG. 4, are shown.

The first amplification gate 13r is connected to the wire 24 via the contact. The first source/drain 40a is connected to a vertical signal line 107 (refer to FIG. 20) via the contact. The second source/drain 40b is connected to a wire 26 of the first layer via the contact. The third source/drain 40c is connected to a wire (refer to FIG. 20) for supplying the power-supply voltage Vdd via the contact. In addition, the wire 24 is connected to the FD area 16a and the FD area 16b via the contact. The wire 26 of the first layer is connected to the wire 28 of the second layer.

The second transistor group 39 is constituted by a reset transistor and a second amplification transistor, and includes, as shown in FIG. 19, a reset gate 14p, a second amplification gate 13p of the second amplification transistor, and fourth source/drain 39a to seventh source 39d. In addition, the fourth source/drain 39a, the reset gate 14p, the fifth source/drain 39b, the sixth source/drain 39c, the second amplification gate 13p, and the seventh source/drain 39d are arranged in this order along the horizontal direction (X direction in FIG. 19) from the right to the left. In FIG. 19, contacts between the wires and the amplification gate 13p and the sources/drains 39a, 39b, 39c and 39d, which are not shown in FIG. 4, are shown. The fourth source/drain 39a is connected to the wire for supplying the power-supply voltage Vdd via the contact. The fifth source/drain 39b is connected to the wire 24 via the contact. The sixth source/drain 39c is connected to the wire 27 of the first layer via the contact. The second amplification gate 13p is connected to the wire 24 via the contact. The seventh source/drain 39d is connected to the wire for supplying the power-supply voltage Vdd via the contact. The wire 27 of the first layer is connected to the wire 28 of the second layer.

Furthermore, at this time, the fifth source/drain 39b is arranged so as to be spaced apart with a predetermined gap from the sixth source/drain 39c as shown in FIG. 19.

In the second transistor group 39, the fourth source/drain 39a, the reset gate 14p, and the fifth source/drain 39b constitute the reset transistor. In addition, the sixth source/drain 39c, the second amplification gate 13p, and the seventh source/drain 39d constitute the second amplification transistor.

Figure 20:
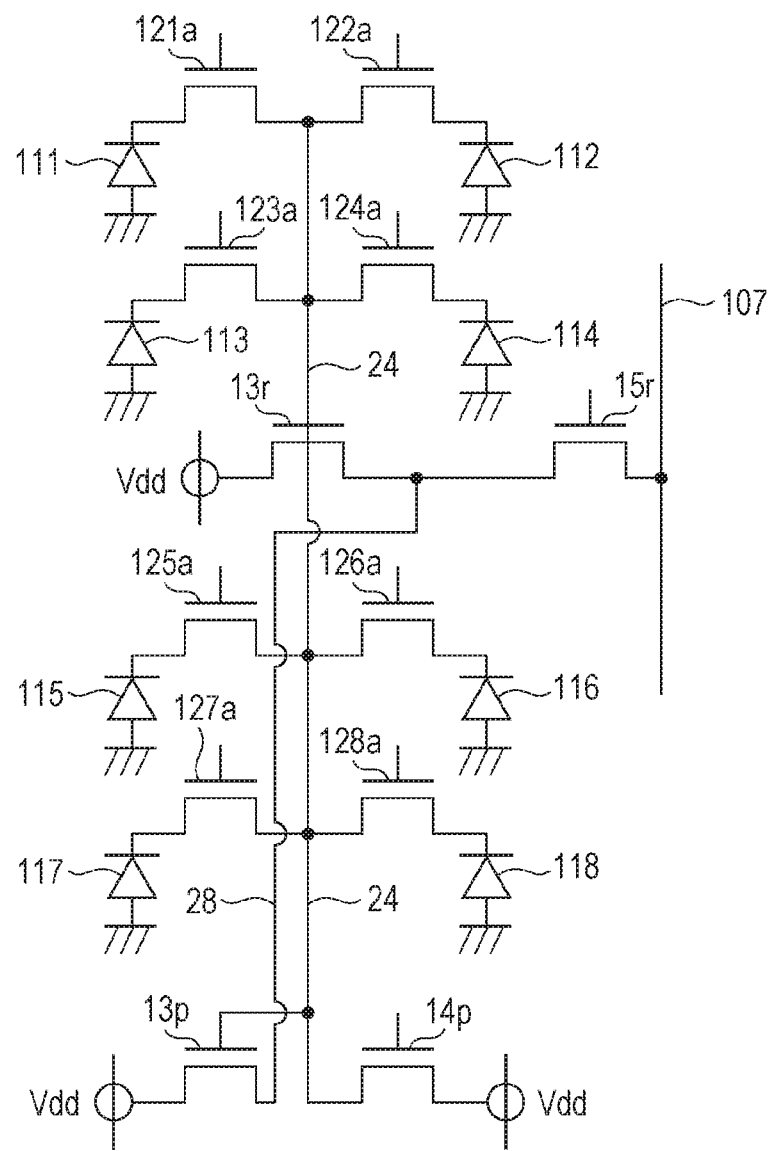
FIG. 20 is an equivalent circuit diagram of a shared pixel unit part in a solid-state imaging device according to the eighth embodiment.

FIG. 20 illustrates an equivalent circuit diagram of the shared pixel unit part of the solid-state imaging device of the present embodiment.

In FIG. 20, the first amplification transistor and the second amplification transistor are connected in parallel between the wire 28 of the second layer which is connected to the selection transistor formed of the selection gate 15r, and the wire for supplying the power-supply voltage Vdd. In other words, the equivalent circuit diagram of FIG. 20 provides a configuration in which the two amplification transistors are connected in parallel between the selection transistor 15 and the wire for supplying the power-supply voltage Vdd in the equivalent circuit diagram of FIG. 3 described in the first embodiment. In addition, the source/drain of the selection transistor formed of the selection gate 15r, on a side opposite to the wire 28, is connected to the vertical signal line 107.

In the present embodiment, the first amplification gate 13r of the first transistor group 40 has the dimension and the area equivalent to those of the second amplification gate 13p of the second transistor group 39. In addition, in the present embodiment, each area of the amplification transistors 13r and 13p is made greater than each area of the selection gate 15r and the reset gate 14p.

In FIG. 19, since the selection gate 15r and the reset gate 14p have the equivalent dimension and area, the sum total of the area of the gates of the first transistor group 40 is approximately the same as that of the second transistor group 39. Accordingly, in the shared pixel unit part 190, the occupation area of the gates in the first transistor group 40 is approximately symmetrical to the occupation area of the gate in the second transistor group 39. That is, in the present embodiment as well, the layout configuration of the first transistor group 40 becomes substantially symmetrical to the layout configuration of the second transistor group 39. Therefore, in the CMOS image sensor of the present embodiment as well, the problems that arise due to the asymmetry of the layout configurations between the first transistor group 40 and the second transistor group 39 can be solved, and thus it is possible to achieve the same effect as in the first embodiment.

In addition, in the present embodiment, in the shared pixel unit part 190 in which eight pixels are shared, the two amplification transistors are provided, and thus the entire area of the amplification transistors can be increased as compared with the case where only a single amplification transistor is provided. Accordingly, it is possible to reduce random noise. Further, the mutual conductance gm which increases according to W/L can be increased by increasing the width W of the amplification transistor by using the two amplification transistors which are connected in parallel, and thereby improving a driving performance of the amplification transistors and achieving high speed and improving compatibility. Further, since the two amplification transistors which are connected in parallel are provided in the first transistor group 40 and the second transistor group 39, it is possible to improve symmetry of the layout configuration of the transistor groups as compared with a configuration in which the two amplification transistors which are connected in parallel are formed in the same transistor group.

10. Ninth Embodiment

In the ninth embodiment, a configuration example of the 3-transistor-type back-illuminated CMOS image sensor different from that of the fourth to sixth embodiments will be described. The entire configuration of the CMOS image sensor according to the present embodiment is the same configuration according to the above-described first embodiment (FIG. 1), and thus a description thereof will be omitted here.

Configuration of Shared Pixel Unit Part

In the present embodiment, the shared pixel unit part has a configuration in which one amplification transistor is added in the configuration of the shared pixel unit part of the fourth embodiment shown in FIG. 12 and thus two amplification transistors are provided.

Layout of Shared Pixel Unit Part

Figure 21:
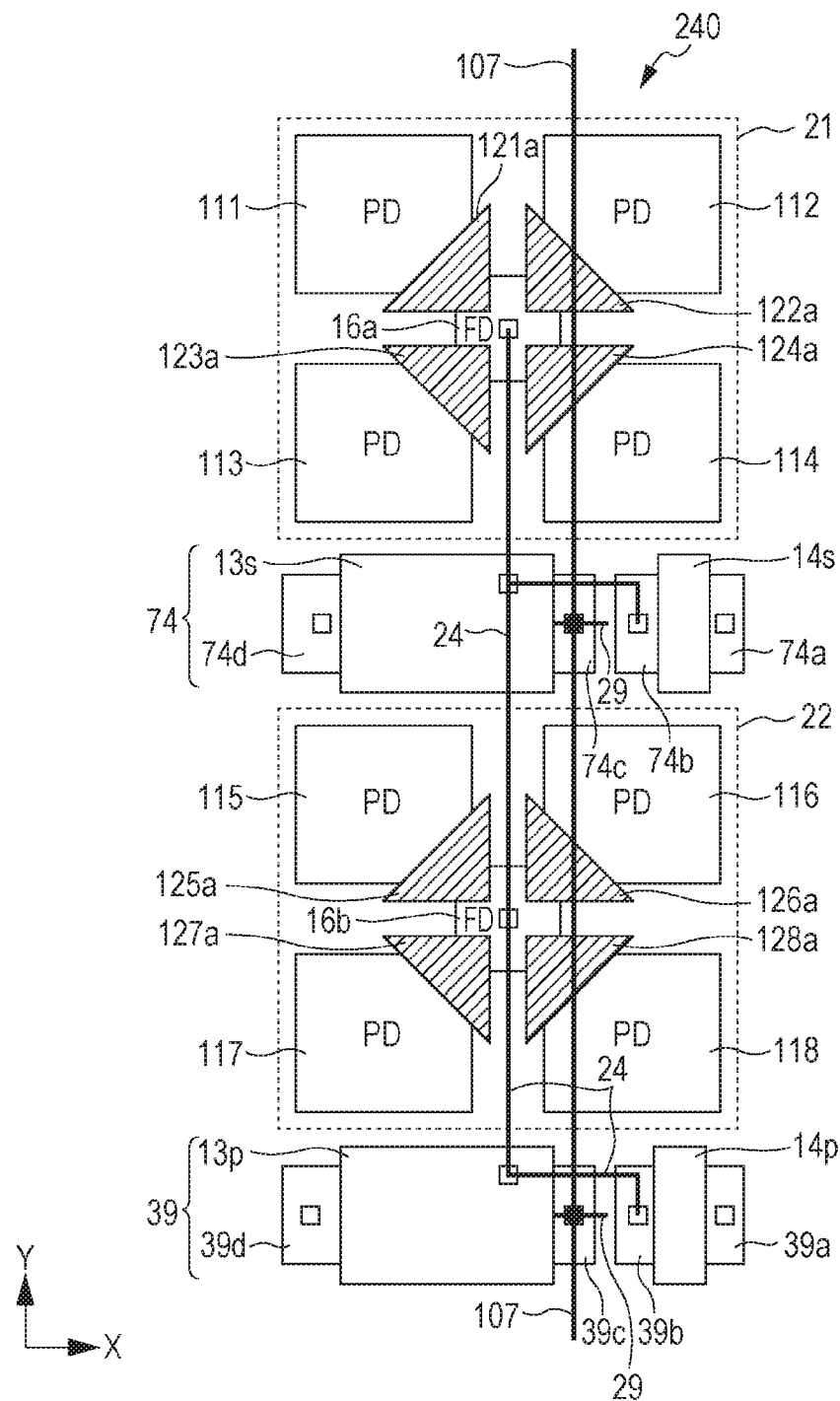
FIG. 21 is a schematic layout plan view of a shared pixel unit part in a solid-state imaging device according to a ninth embodiment.

FIG. 21 illustrates a schematic plan view of a layout configuration of the shared pixel unit part in the CMOS image sensor (solid-state imaging device) of the present embodiment. In the layout configuration of a shared pixel unit part 240 shown in FIG. 21, components corresponding to the components of the shared pixel unit part 110 of the first embodiment shown in FIG. 4 or the components of the shared pixel unit part 200 of the fourth embodiment shown in FIG. 13, are designated with the same reference numerals.

The shared pixel unit part 240 is a shared pixel unit part which shares eight pixels, and includes a first light-receiving unit 21, a second light-receiving unit 22, a first transistor group 74, and a second transistor group 39. Although not shown in FIG. 21, well contacts are provided in the same manner as the first well contact 23a and the second well contact 23b shown in FIG. 13. On the other hand, in FIG. 21, a wire 24 and a vertical signal line 107 connecting FD areas 16a and 16b, the transistor groups 74 and 39 to each other, which are not shown in FIG. 13, are shown.

As shown in FIG. 21, the shared pixel unit part 240 includes the first transistor group 74 which has a configuration in which a selection transistor is replaced with a reset transistor with respect to the shared pixel unit part 190 of the eighth embodiment, and the second transistor group 39 which has the same configuration as the shared pixel unit part 190 of the eighth embodiment. In the present embodiment, configurations of the first light-receiving unit 21 and the second light-receiving unit 22 are the same as those of the first embodiment shown in FIG. 4, and, here, configurations of the first transistor group 74 and the second transistor group 39 will be described.

As shown in FIG. 21, the first transistor group 74 is arranged between the first light-receiving unit 21 and the second light-receiving unit 22. In addition, the second transistor group 39 is arranged in an area on a side opposite to the arrangement side of the first transistor group 74 of the second light-receiving unit 22 in the surrounding area of the second light-receiving unit 22.

In the present embodiment as well, in the same manner as the first embodiment, each transistor group is formed to extend along the horizontal direction (in the X direction in FIG. 21) from a position in the vicinity of one of the end portions of the light-receiving unit to a position in the vicinity of the other of the end portions.

Further, although not shown in FIG. 21, the first light-receiving unit 21, the second light-receiving unit 22, the first transistor group 74, and the second transistor group 39 are formed in a predetermined well area formed in a Si substrate. In the present embodiment, in the same manner as the first embodiment, although not shown, well contacts that electrically connect the well area to the internal wiring are provided separately in two portions.

The first transistor group 74 includes, as shown in FIG. 21, a first reset gate 14s of a first reset transistor, a first amplification gate 13s of a first amplification transistor, and a first source/drain 74a to a fourth source/drain 74d. In the present embodiment, along the horizontal direction (X direction) from the right side, the first source/drain 74a, the first reset gate 14s, the second source/drain 74b, the third source/drain 74c, the first amplification gate 13s, and the fourth source/drain 74d are arranged in this order. In FIG. 21, the lengths in the horizontal direction (X direction) and the widths in the vertical direction (Y direction) of the gates 13s and 14s and the sources/drains 74a, 74b, 74c and 74d, and the arrangements thereof are almost equivalent to those in the second transistor group 39 of the seventh embodiment of FIG. 16. In addition, in FIG. 21, the contacts between the wires and the amplification gate 13s and the sources/drains 74a, 74b, 74c and 74d, which are not shown in FIG. 4, are shown. The first amplification gate 13s is connected to the wire 24 via the contact. The first source/drain 74a is connected to a wire (refer to FIG. 22) for supplying the power-supply voltage Vdd via the contact. The second source/drain 74b is connected to the wire 24 via the contact. The third source/drain 74c is connected to a wire 29 of the first layer via the contact. The fourth source/drain 74d is connected to the wire for supplying the power-supply voltage Vdd via the contact. In addition, the wire 24 is connected to the FD area 16a and the FD area 16b via the contact. The wire 29 of the first layer is connected to the vertical signal line 107.

Furthermore, at this time, the second source/drain 74b is arranged so as to be spaced apart with a predetermined gap from the third source/drain 74c as shown in FIG. 21.

In the first transistor group 74, the first source/drain 74a, the first reset gate 14s, and the second source/drain 74b constitute the first reset transistor. In addition, the third source/drain 74c, the first amplification gate 13s, and the fourth source/drain 74d constitute the first amplification transistor.

The second transistor group 39 is constituted by a second reset transistor and a second amplification transistor, and includes, as shown in FIG. 21, a second reset gate 14p, a second amplification gate 13p, and a fifth source/drain 39a to an eighth source/drain 39d. In addition, the fifth source/drain 39a, the second reset gate 14p, the sixth source/drain 39b, the seventh source/drain 39c, the second amplification gate 13p, and the eighth source/drain 39d are arranged in this order along the horizontal direction (X direction in FIG. 21) from the right to the left. In FIG. 21, contacts between the wires and the amplification gate 13p and the sources/drains 39a, 39b, 39c and 39d, which are not shown in FIG. 4, are shown. The fifth source/drain 39a is connected to the wire for supplying the power-supply voltage Vdd via the contact. The sixth source/drain 39b is connected to the wire 24 via the contact. The seventh source/drain 39c is connected to the wire 29 of the first layer via the contact. The second amplification gate 13p is connected to the wire 24 via the contact. The eighth source/drain 39d is connected to the wire for supplying the power-supply voltage Vdd via the contact. The wire 29 of the first layer is connected to the vertical signal line 107.

Furthermore, at this time, the sixth source/drain 39b is arranged so as to be spaced apart with a predetermined gap from the seventh source/drain 39c as shown in FIG. 21.

In the second transistor group 39, the fifth source/drain 39a, the second reset gate 14p, and the sixth source/drain 39b constitute the second reset transistor. In addition, the seventh source/drain 39c, the second amplification gate 13p, and the eighth source/drain 39d constitute the second amplification transistor.

Figure 22:
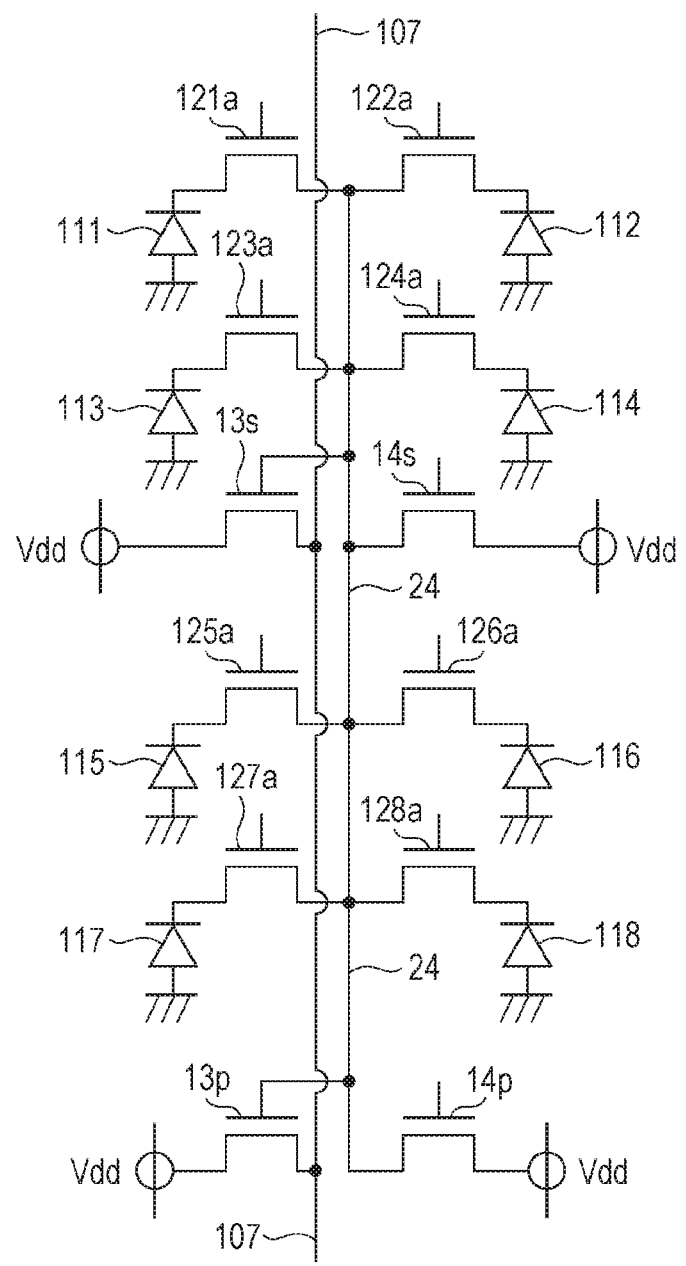
FIG. 22 is an equivalent circuit diagram of a shared pixel unit part in a solid-state imaging device according to the ninth embodiment.

FIG. 22 illustrates an equivalent circuit diagram of the shared pixel unit part of the solid-state imaging device of the present embodiment.

In FIG. 22, the first reset transistor and the second reset transistor are connected in parallel between the wire for supplying the power-supply voltage Vdd and the wire 24 connected to the FD area. In addition, the first amplification transistor and the second amplification transistor are connected in parallel between the vertical signal line 107 and the wire for supplying the power-supply voltage Vdd. In other words, the equivalent circuit diagram of FIG. 22 provides a configuration in which the two reset transistors are connected in parallel between the wire for supplying the power-supply voltage Vdd and the FD area 16 in the equivalent circuit diagram of FIG. 12 described in the fourth embodiment. In addition, the two amplification transistors are connected in parallel between the vertical signal line 107, the wire for supplying the power-supply voltage Vdd, and the FD area 16.

In the present embodiment, the first amplification gate 13s of the first transistor group 74 has the dimension and the area equivalent to those of the second amplification gate 13p of the second transistor group 39. The first reset gate 14s of the first transistor group 74 has the dimension and the area equivalent to those of the second reset gate 14p of the second transistor group 39. In addition, in the present embodiment, each area of the amplification transistors 13s and 13p is made greater than each area of the reset gates 14s and 14p.

In FIG. 21, the sum total of the area of the gates of the first transistor group 74 is approximately the same as that of the second transistor group 39. Accordingly, in the shared pixel unit part 240, the occupation area of the gates in the first transistor group 74 is approximately symmetrical to the occupation area of the gate in the second transistor group 39. That is, in the present embodiment as well, the layout configuration of the first transistor group 74 becomes substantially symmetrical to the layout configuration of the second transistor group 39. Therefore, in the CMOS image sensor of the present embodiment as well, the problems that arise due to the asymmetry of the layout configurations between the first transistor group 74 and the second transistor group 39 can be solved, and thus it is possible to achieve the same effect as in the first embodiment.

In addition, in the present embodiment, in the shared pixel unit part 240 in which eight pixels are shared, the two amplification transistors are provided, and thus the entire area of the amplification transistors can be increased as compared with the case where only a single amplification transistor is provided. Accordingly, it is possible to reduce random noise. Further, the mutual conductance gm which increases according to W/L can be increased by increasing the width W of the amplification transistor by using the two amplification transistors which are connected in parallel, and thereby improving a driving performance of the amplification transistors and thereby achieving high speed and improving compatibility. Further, the two amplification transistors which are connected in parallel and the two reset transistors which are connected in parallel are provided in the first transistor group 74 and the second transistor group 39. Therefore, it is possible to improve symmetry of the layout configuration of the transistor groups as compared with a configuration in which the two amplification transistors which are connected in parallel and the two reset transistors which are connected in parallel are formed in the same transistor group.

11. Tenth Embodiment

In the tenth embodiment, another configuration example of the 3-transistor-type back-illuminated CMOS image sensor different from that of the fourth to sixth embodiments will be described. The entire configuration of the CMOS image sensor according to the present embodiment is the same configuration according to the above-described first embodiment (FIG. 1), and thus a description thereof will be omitted here.

Configuration of Shared Pixel Unit Part

In the present embodiment, the shared pixel unit part has a configuration in which one amplification transistor is added in the configuration of the shared pixel unit part of the fourth embodiment shown in FIG. 12 and thus two amplification transistors are provided.

Layout of Shared Pixel Unit Part

Figure 23:
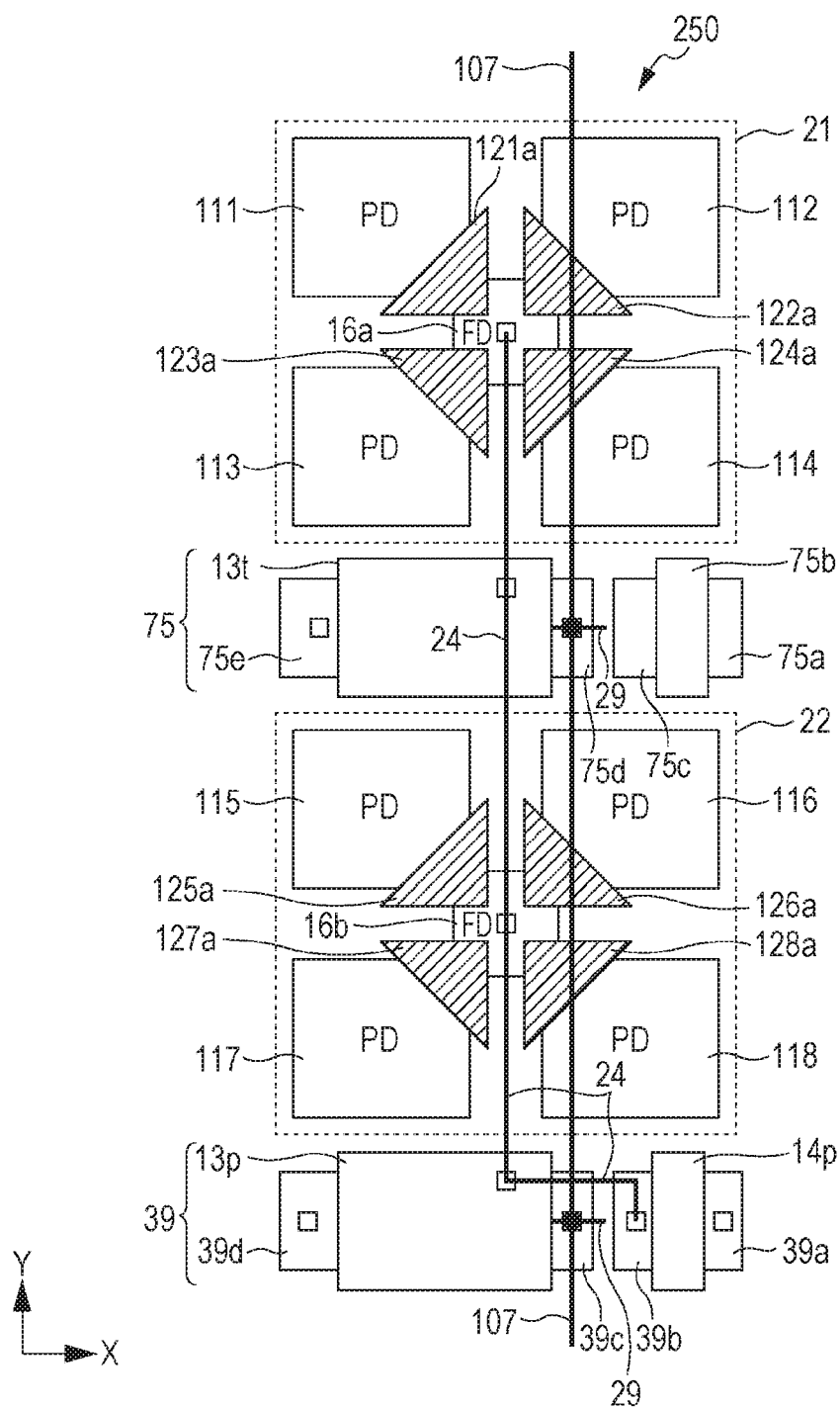
FIG. 23 is a schematic layout plan view of a shared pixel unit part in a solid-state imaging device according to a tenth embodiment.

FIG. 23 illustrates a schematic plan view of a layout configuration of the shared pixel unit part in the CMOS image sensor (solid-state imaging device) of the present embodiment. In the layout configuration of a shared pixel unit part 250 shown in FIG. 23, components corresponding to the components of the shared pixel unit part 110 of the first embodiment shown in FIG. 4 or the components of the shared pixel unit part 200 of the fourth embodiment shown in FIG. 13, are designated with the same reference numerals.

The shared pixel unit part 250 is a shared pixel unit part which shares eight pixels, and includes a first light-receiving unit 21, a second light-receiving unit 22, a first transistor group 75, and a second transistor group 39. Although not shown in FIG. 23, well contacts are provided in the same manner as the first well contact 23a and the second well contact 23b shown in FIG. 13. On the other hand, in FIG. 23, a wire 24 and a vertical signal line 107 connecting FD areas 16a and 16b, the transistor groups 75 and 39 to each other, which are not shown in FIG. 13, are shown.

As shown in FIG. 23, the shared pixel unit part 250 includes the first transistor group 75 which has a configuration in which the reset transistor of the first transistor group of the shared pixel unit part 240 of the ninth embodiment is replaced with a dummy transistor, and the second transistor group 39 which has the same configuration as that of the second transistor of the shared pixel unit part 240 of the ninth embodiment. In the present embodiment, configurations of the first light-receiving unit 21 and the second light-receiving unit 22 are the same as those of the first embodiment shown in FIG. 4, and, here, configurations of the first transistor group 75 and the second transistor group 39 will be described.

As shown in FIG. 23, the first transistor group 75 is arranged between the first light-receiving unit 21 and the second light-receiving unit 22. In addition, the second transistor group 39 is arranged in an area on a side opposite to the arrangement side of the first transistor group 75 of the second light-receiving unit 22 in the surrounding area of the second light-receiving unit 22.

In the present embodiment as well, in the same manner as the first embodiment, each transistor group is formed to extend along the horizontal direction (in the X direction in FIG. 23) from a position in the vicinity of one of the end portions of the light-receiving unit to a position in the vicinity of the other of the end portions.

Further, although not shown in FIG. 23, the first light-receiving unit 21, the second light-receiving unit 22, the first transistor group 75, and the second transistor group 39 are formed in a predetermined well area formed in a Si substrate. In the present embodiment, although not shown, well contacts that electrically connect the well area to the internal wiring are provided separately in two portions, similarly to the first embodiment.

The first transistor group 75 includes, as shown in FIG. 23, a dummy gate 75b of a dummy transistor, a first amplification gate 13t of a first amplification transistor, a first source/drain 75a, and a second source/drain 75c to a fourth source/drain 75e. In the present embodiment, along the horizontal direction (in the X direction) from the right side, the first source/drain 75a, the dummy gate 75b, the second source/drain 75c, the third source/drain 75d, the first amplification gate 13t, and the fourth source/drain 75e are arranged in this order. In FIG. 23, the lengths in the horizontal direction (X direction) and the widths in the vertical direction (Y direction) of the gates 13t and 75b and the sources/drains 75a, 75c, 75d and 75e are almost equivalent to those in the first transistor group 74 of the ninth embodiment of FIG. 21. In addition, in FIG. 23, the contacts between the wires and the amplification gate 13t and the third and fourth sources/drains 75d and 75e are shown. The first amplification gate 13t is connected to the wire 24 via the contact. The third source/drain 75d is connected to a wire 29 of the first layer via the contact. The fourth source/drain 75e is connected to a wire (refer to FIG. 24) for supplying the power-supply voltage Vdd via the contact. In addition, the wire 24 is connected to the FD area 16a and the FD area 16b via the contact. The wire 29 of the first layer is connected to the vertical signal line 107.

Furthermore, at this time, the second source/drain 75c is arranged so as to be spaced apart with a predetermined gap from the third source/drain 75d as shown in FIG. 23.

In the first transistor group 75, the first source/drain 75a, the dummy gate 75b, and the second source/drain 75c constitute the dummy transistor. The respective units 75a, 75b and 75c of the dummy transistor are not provided with contacts with the wires. In addition, the third source/drain 75d, the first amplification gate 13t, and the fourth source/drain 75e constitute the first amplification transistor.

The second transistor group 39 is constituted by a reset transistor and a second amplification transistor, and includes, as shown in FIG. 23, a reset gate 14p, a second amplification gate 13p of the second amplification transistor, and a fifth source/drain 39a to an eighth source/drain 39d. In addition, the fifth source/drain 39a, the reset gate 14p, the sixth source/drain 39b, the seventh source/drain 39c, the second amplification gate 13p, and the eighth source/drain 39d are arranged in this order along the horizontal direction (X direction in FIG. 23) from the right to the left. In FIG. 23, contacts between the wires and the amplification gate 13p and the sources/drains 39a, 39b, 39c and 39d, which are not shown in FIG. 4, are shown. The fifth source/drain 39a is connected to the wire for supplying the power-supply voltage Vdd via the contact. The sixth source/drain 39b is connected to the wire 24 via the contact. The seventh source/drain 39c is connected to the wire 29 of the first layer via the contact. The second amplification gate 13p is connected to the wire 24 via the contact. The eighth source/drain 39d is connected to the wire for supplying the power-supply voltage Vdd via the contact. The wire 29 of the first layer is connected to the vertical signal line 107.

Furthermore, at this time, the sixth source/drain 39b is arranged so as to be spaced apart with a predetermined gap from the seventh source/drain 39c as shown in FIG. 23.

In the second transistor group 39, the fifth source/drain 39a, the reset gate 14p, and the sixth source/drain 39b constitute the reset transistor. In addition, the seventh source/drain 39c, the second amplification gate 13p, and the eighth source/drain 39d constitute the second amplification transistor.

Figure 24:
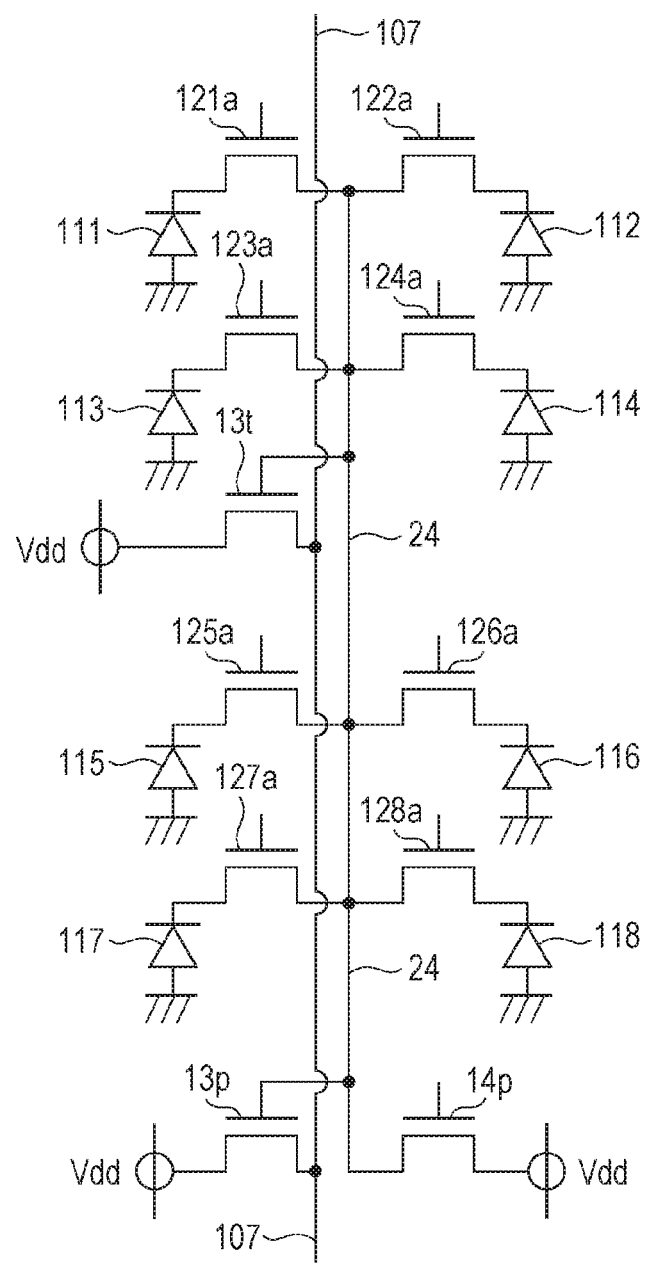
FIG. 24 is an equivalent circuit diagram of a shared pixel unit part in a solid-state imaging device according to the tenth embodiment.

FIG. 24 illustrates an equivalent circuit diagram of the shared pixel unit part of the solid-state imaging device of the present embodiment.

In FIG. 24, the first amplification transistor and the second amplification transistor are connected in parallel between the vertical signal line 107 and the wire for supplying the power-supply voltage Vdd. In other words, the equivalent circuit diagram of FIG. 24 provides a configuration in which the two amplification transistors are connected in parallel between the vertical signal line 107 and the wire for supplying the power-supply voltage Vdd in the equivalent circuit diagram of FIG. 12 described in the fourth embodiment. The dummy transistor of FIG. 23 is not connected to the wire and thus is not shown in the equivalent circuit diagram of FIG. 24. Upon comparison between FIG. 24 of the present embodiment and FIG. 22 of the ninth embodiment, since the reset transistor is replaced with the dummy transistor, one reset transistor of FIG. 22 is omitted.

In the present embodiment, the first amplification gate 13t of the first transistor group 75 has the dimension and the area equivalent to those of the second amplification gate 13p of the second transistor group 39. The dummy gate 75b of the first transistor group 75 has the dimension and the area equivalent to those of the reset gate 14p of the second transistor group 39. In addition, in the present embodiment, each area of the amplification transistors 13t and 13p is made greater than each area of the dummy gate 75b and the reset gate 14p.

In FIG. 23, the sum total of the area of the gates of the first transistor group 75 is approximately the same as that of the second transistor group 39. Accordingly, in the shared pixel unit part 250, the occupation area of the gates in the first transistor group 75 is approximately symmetrical to the occupation area of the gate in the second transistor group 39. That is, in the present embodiment as well, the layout configuration of the first transistor group 75 becomes substantially symmetrical to the layout configuration of the second transistor group 39. Therefore, in the CMOS image sensor of the present embodiment as well, the problems that arise due to the asymmetry of the layout configurations between the first transistor group 75 and the second transistor group 39 can be solved, and thus it is possible to achieve the same effect as in the first embodiment.

In addition, in the present embodiment, in the shared pixel unit part 250 in which eight pixels are shared, the two amplification transistors are provided, and thus the entire area of the amplification transistors can be increased as compared with the case where only a single amplification transistor is provided. Accordingly, it is possible to reduce random noise. Further, the mutual conductance gm which increases according to W/L can be increased by increasing the width W of the amplification transistor by using the two amplification transistors which are connected in parallel, and thereby improving a driving performance of the amplification transistors and thereby achieving high speed and improving compatibility. Further, since the two amplification transistors which are connected in parallel are provided in the first transistor group 75 and the second transistor group 39, it is possible to improve symmetry of the layout configuration of the transistor groups as compared with a configuration in which the two amplification transistors which are connected in parallel are formed in the same transistor group.

In the shared pixel unit part sharing pixels of the seventh to tenth embodiments, a configuration in which two amplification transistors are provided is not limited to the configuration in which eight pixels are shared in the embodiments. In a configuration as well in which 2n (where n is an integer equal to or greater than 2) FD areas sharing four pixels are connected, and 8n pixels are shared, similarly, a plurality of amplification transistors are provided, and thereby it is possible to increase mutual conductance. Accordingly, it is possible to improve a driving performance of the amplification transistors and to thus achieve high speed and improve compatibility.

12. Eleventh Embodiment

In the eleventh embodiment, another configuration example of the 4-transistor-type back-illuminated CMOS image sensor different from that of the first to third, and seventh and eighth embodiments will be described. The entire configuration of the CMOS image sensor according to the present embodiment is the same configuration according to the above-described first embodiment (FIG. 1), and thus a description thereof will be omitted here.

Configuration of Shared Pixel Unit Part

In the present embodiment, the shared pixel unit part has a configuration in which the eight pixels of FIG. 3 are divided by four pixels and each shares the four pixels in the configuration of the shared pixel unit part of the first embodiment shown in FIG. 3. In other words, the present embodiment has the configuration illustrated in FIG. 3, but the first photodiode 111 to the fourth photodiode 114, and the fifth photodiode 115 to the eighth photodiode 118 respectively have a configuration in which four pixels are shared independently.

Layout of Shared Pixel Unit Part

Figure 25:
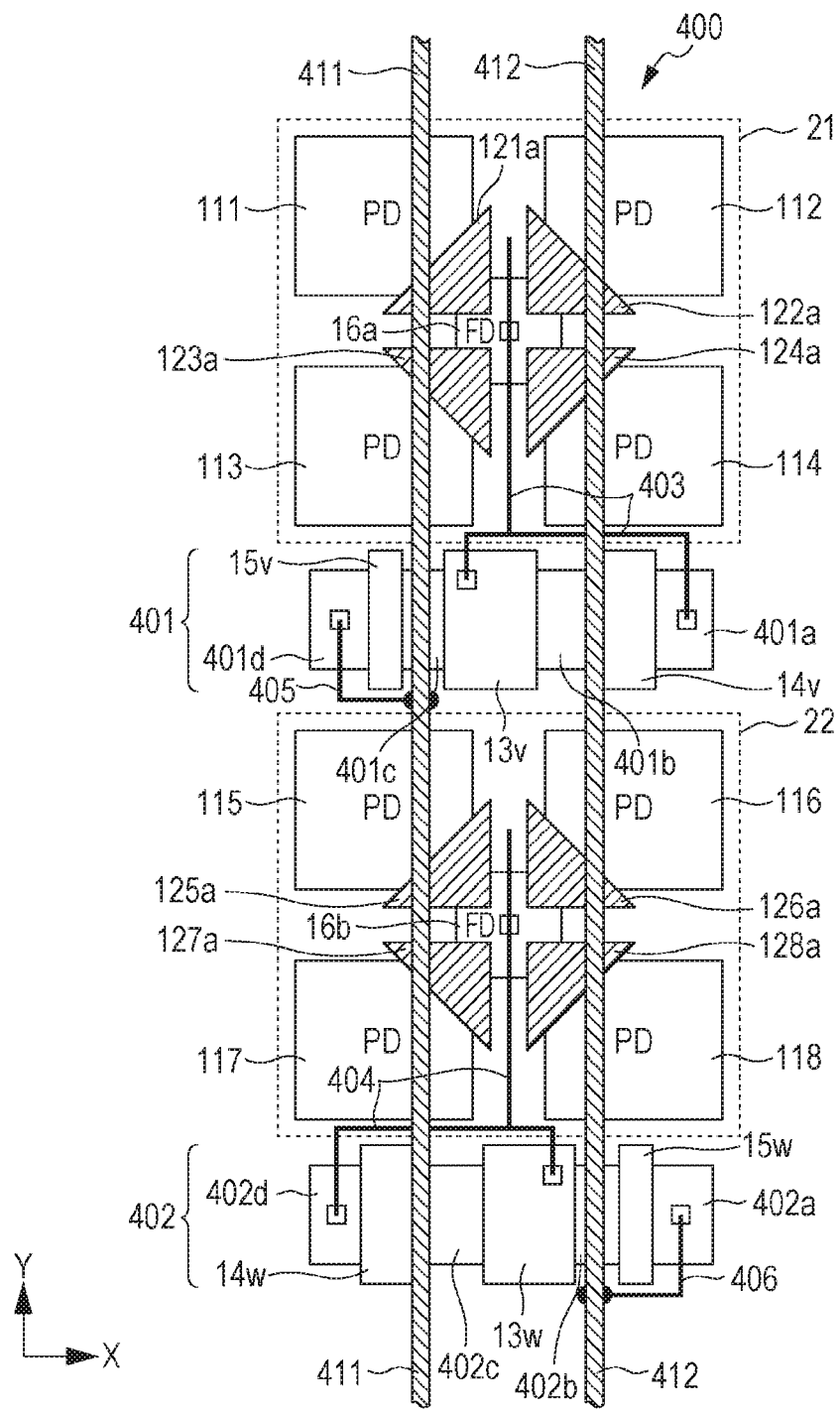
FIG. 25 is a schematic layout plan view of a shared pixel unit part in a solid-state imaging device according to an eleventh embodiment.

FIG. 25 illustrates a schematic plan view of a layout configuration of the shared pixel unit part in the CMOS image sensor (solid-state imaging device) of the present embodiment. In the layout configuration of a shared pixel unit part 400 shown in FIG. 25, components corresponding to the components of the shared pixel unit part 110 of the first embodiment shown in FIG. 4 or the components of the shared pixel unit part 180 of the seventh embodiment shown in FIG. 16, are designated with the same reference numerals.

The shared pixel unit part 400 is a shared pixel unit part which shares four pixels, and includes a first light-receiving unit 21, a second light-receiving unit 22, a first transistor group 401, and a second transistor group 402. Although not shown in FIG. 25, well contacts are provided in the same manner as the first well contact 23a and the second well contact 23b shown in FIG. 4. On the other hand, in FIG. 25, wires 403, 404, 405 and 406 and vertical signal lines 411 and 412 connecting FD areas 16a and 16b, and the transistor groups 401 and 402 to each other, which are not shown in FIG. 4, are shown.

As shown in FIG. 25, the shared pixel unit part 400 includes the first transistor group 401 which has a configuration in which arrangements of left and right of three transistors are the same as the first transistor group of the shared pixel unit part 120 of FIG. 5, and the second transistor group 402 which has a configuration in which arrangements of left and right of three transistors are opposite to the second transistor group of the shared pixel unit part 120 of FIG. 5. In addition, in the present embodiment, configurations of the first light-receiving unit 21 and the second light-receiving unit 22 are the same as those of the first embodiment shown in FIG. 4, but, is different from the first embodiment in that the first light-receiving unit 21 and the second light-receiving unit 22 are not electrically connected to each other.

As shown in FIG. 25, the first transistor group 401 is arranged between the first light-receiving unit 21 and the second light-receiving unit 22. In addition, the second transistor group 402 is arranged in an area on a side opposite to the arrangement side of the first transistor group 401 of the second light-receiving unit 22 in the surrounding area of the second light-receiving unit 22.

In the present embodiment as well, in the same manner as the first embodiment, each transistor group is formed to extend along the horizontal direction (in the X direction in FIG. 25) from a position in the vicinity of one of the end portions of the light-receiving unit to a position in the vicinity of the other of the end portions.

Further, although not shown in FIG. 25, the first light-receiving unit 21, the second light-receiving unit 22, the first transistor group 401, and the second transistor group 402 are formed in a predetermined well area formed in a Si substrate. In the present embodiment, although not shown, well contacts that electrically connect the well area to the internal wiring are provided separately in two portions.

The first transistor group 401 is constituted by three transistors, a reset transistor, an amplification transistor, and a selection transistor. The first transistor group 401 includes, as shown in FIG. 25, a reset gate 14v of the reset transistor, an amplification gate 13v of the amplification transistor, a selection gate 15v of the selection transistor, and a first source/drain 401a to a fourth source/drain 401d. In the present embodiment, in the X direction of the figure from the right to the left, the first source/drain 401a, the reset gate 14v, the second source/drain 401b, the amplification gate 13v, the third source/drain 401c, the selection gate 15v, and the fourth source/drain 401d are arranged in this order. In addition, in FIG. 25, the contacts between the wires and the amplification gate 13v and the first and fourth sources/drains 401a and 401d, which are not shown in FIG. 4, are shown. The amplification gate 13v is connected to the wire 403 via the contact. The first source/drain 401a is connected to the wire 403 via the contact. The fourth source/drain 401d is connected to the wire 405 via the contact. In addition, the wire 403 is connected to an FD area 16a of the first light-receiving unit 21 via the contact. The wire 405 is connected to a first vertical signal line 411 via the contact.

The second transistor group 402 is also constituted by three transistors, a reset transistor, an amplification transistor, and a selection transistor. The second transistor group 402 includes, as shown in FIG. 25, a reset gate 14w of the reset transistor, an amplification gate 13w of the amplification transistor, a selection gate 15w of the selection transistor, and a fifth source/drain 402a to an eighth source/drain 402d. In the present embodiment, in the X direction of the figure from the right to the left, the fifth source/drain 402a, the selection gate 15w, the sixth source/drain 402b, the amplification gate 13w, the seventh source/drain 402c, the reset gate 14w, and the eighth source/drain 402d are arranged in this order. In addition, in FIG. 25, the contacts between the wires and the amplification gate 13w and the fifth and eighth sources/drains 402a and 402d, which are not shown in FIG. 4, are shown. The amplification gate 13w is connected to the wire 404 via the contact. The fifth source/drain 402a is connected to the wire 406 via the contact. The eighth source/drain 402d is connected to the wire 404 via the contact. In addition, the wire 404 is connected to an FD area 16b of the second light-receiving unit 22 via the contact. The wire 406 is connected to a second vertical signal line 412 via the contact.

The wire 403 and the wire 404 are formed as further upper wires than the transfer gates 121a to 128a, the amplification gates 13v and 13w, the reset gates 14v and 14w, and the selection gates 15v and 15w. The first vertical signal line 411 and the second vertical signal line 412 are formed as still further upper wires than the wire 403 and the wire 404. In addition, the wire 405 and the wire 406 are formed as an L-shaped single wire in FIG. 25, but may be formed by making a wire of the lower layer extending in the Y direction coming into contact with a wire of the lower layer extending in the Y direction.

The first vertical signal line 411 and the second vertical signal line 412 are arranged so as to have line symmetry with respect to the central line of the light-receiving units 21 and 22. In addition, the first vertical signal line 411 and the second vertical signal line 412 are connected to different columns to each other of the column processing unit 103 of FIG. 1, and a signal is read from each column.

The first vertical signal line 411 is connected to the fourth drain/source 401d of the first transistor group 401, and the first source/drain 401a of the first transistor group 401 is connected to the FD area 16a of the first light-receiving unit 21 via the wire 403. Accordingly, a signal based on electric charge in the FD area 16a of the first light-receiving unit 21 is read from the first vertical signal line 411.

The second vertical signal line 412 is connected to the fifth source/drain 402a of the second transistor group 402, and the eighth source/drain 402d of the second transistor group 402 is connected to the FD area 16b of the second light-receiving unit 22 via the wire 404. Accordingly, a signal based on electric charge in the FD area 16b of the second light-receiving unit 22 is read from the second vertical signal line 412.

As described above, in the first light-receiving unit 21 and the second light-receiving unit 22, a signal based on electric charge of each of them is read to a different vertical signal line, and thereby it is possible to achieve a high speed operation.

In the present embodiment, the amplification gate 13v of the first transistor group 401 has the dimension and the area equivalent to those of the amplification gate 13w of the second transistor group 402. The reset gate 14v of the first transistor group 401 has the dimension and the area equivalent to those of the reset gate 14w of the second transistor group 402. The selection gate 15v of the first transistor group 401 has the dimension and the area equivalent to those of the selection gate 15w of the second transistor group 402.

In other words, in FIG. 25, the sum total of the area of the gates of the first transistor group 401 is approximately the same as that of the second transistor group 402. Accordingly, in the shared pixel unit part 400, the occupation area of the gates in the first transistor group 401 is approximately symmetrical to the occupation area of the gate in the second transistor group 402. That is, in the present embodiment as well, the layout configuration of the first transistor group 401 becomes substantially symmetrical to the layout configuration of the second transistor group 402. Therefore, in the CMOS image sensor of the present embodiment as well, the problems that arise due to the asymmetry of the layout configurations between the first transistor group 401 and the second transistor group 402 can be solved, and thus it is possible to achieve the same effect as in the first embodiment.

In the present embodiment, furthermore, the wire 403 and the three transistors of the first transistor group 401, and the wire 404 and the three transistors of the second transistor group 402 are arranged so as to be opposite on left and right sides (in a line-symmetric manner with respect to the central line of the light-receiving units 21 and 22). That is, in the first transistor group 401 and the second transistor group 402, the transistors of the respective transistor groups and the wires connected to the transistor are arranged so as to be opposite in left and right (in a line-symmetric manner with respect to the central line of the light-receiving units 21 and 22). Accordingly, the distance between the wire 403 and the second vertical signal line 412 becomes the same as the distance between the wire 404 and the first vertical signal line 411. In other words, the distance between the wire connected to the FD area of the light-receiving unit and the vertical signal line on the side which is not connected to the light-receiving unit becomes the same in the first light-receiving unit 21 and the second light-receiving unit 22. Therefore, the capacitance occurring between the wire connected to the FD area and the vertical signal line becomes the same in the first light-receiving unit 21 and the second light-receiving unit 22, thereby noise resistance and a variety of electrical crosstalk being uniform, and thus it is possible to obtain images of high quality.

In contrast, in a case where the arrangement of the wire connected to the FD area and the three transistors of the transistor groups is the same arrangement in the first light-receiving unit 21 and the second light-receiving unit 22, the distance between the wire connected to the FD area and the vertical signal line is different, and thus a variation in the capacitance occurs therebetween. In this case, such a capacitance difference causes a difference in an image, which is shown as a line defect or a dot defect.

In addition, in the configuration of each embodiment described above, the first transistor group and the second transistor group may be exchanged, and such a configuration is included in the technical scope of the present disclosure.

13. Twelfth Embodiment

The CMOS image sensor (solid-state imaging device) according to the above-described various embodiments and modified examples may be mounted in any electronic apparatus which has a function of capturing images with the solid-state imaging device and be used. The electronic apparatus may include, for example, an imaging apparatus (camera system) such as a digital still camera or a video camera, a portable terminal apparatus having an imaging function such as a mobile phone, a copier having an image capturing unit including the solid-state imaging device, or the like. Here, the imaging apparatus is exemplified as the electronic apparatus, and a configuration thereof will be described. In addition, a camera module mounted in the electronic apparatus is referred to as an imaging apparatus in some cases.

Figure 26:
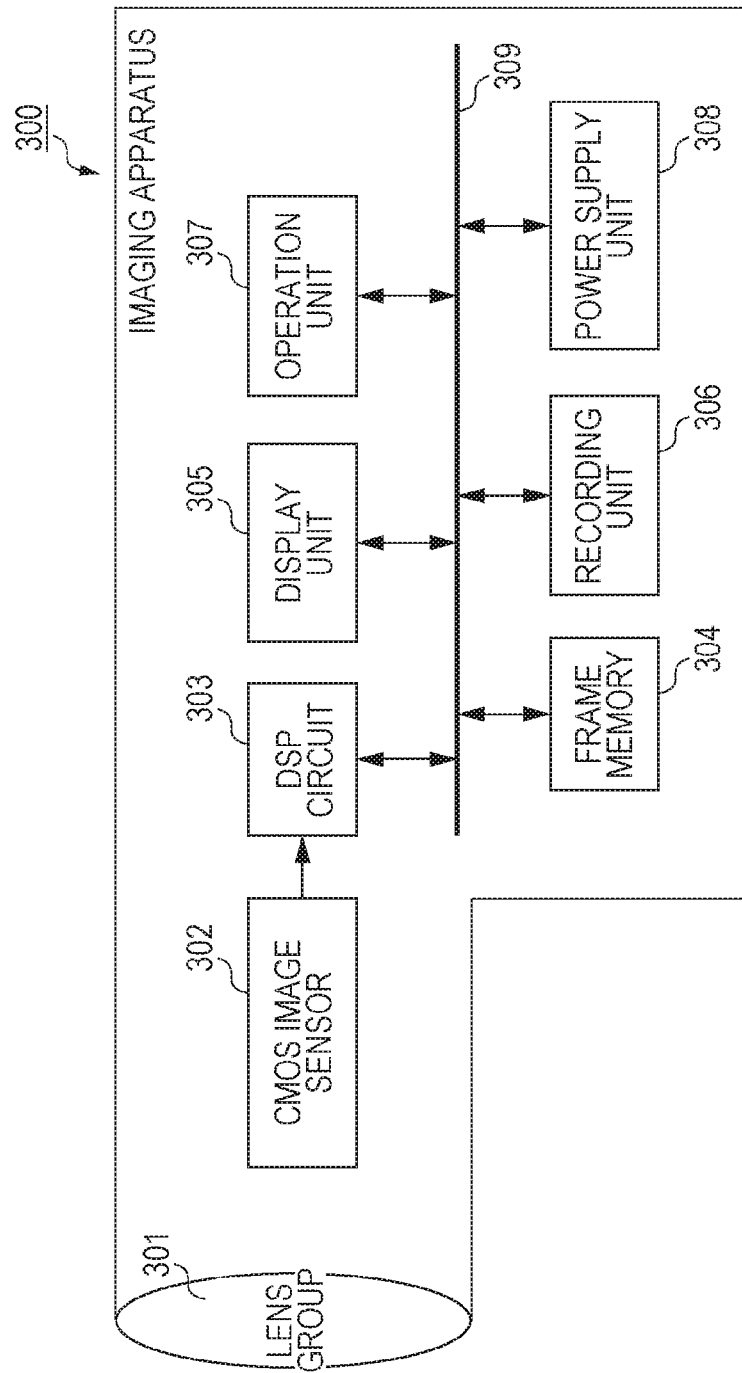
FIG. 26 is a schematic block diagram of an electronic apparatus according to a twelfth embodiment.

FIG. 26 illustrates a schematic block configuration of an imaging apparatus to which the CMOS image sensor according to the various embodiments and modified examples is applied.

An imaging apparatus 300 includes an optical unit 301, a CMOS image sensor 302, and a DSP circuit 303 (signal processing circuit) which is a camera signal processing circuit. In addition, the imaging apparatus 300 includes a frame memory 304, a display unit 305, a recording unit 306, an operation unit 307, and a power supply unit 308. In addition, the DSP circuit 303, the frame memory 304, the display unit 305, the recording unit 306, the operation unit 307, and the power supply unit 308 are electrically connected to each other via a bus line 309.

The optical unit 301 is constituted by, for example, a lens group and the like. The optical unit 301 captures incident light (image light) from a subject and causes the incident light to form an image on an imaging surface of the CMOS image sensor 302.

The CMOS image sensor 302 converts a light amount of the incident light forming the image on the imaging surface by the optical unit 301 into an electric signal per pixel unit so as to be output as a pixel signal. In addition, the CMOS image sensor 302 is constituted by, for example, the CMOS image sensor described in the above-described various embodiments and modified examples. Therefore, in the imaging apparatus 300 of the present embodiment, for example, even if the miniaturization of a pixel progresses, for example, variations in the characteristics such as the sensitivity or an amount of saturated electric charge in a plurality of photodiodes can be reduced, and thereby capturing of a high quality image is possible.

The display unit 305 is constituted by, for example, a display device including a panel such as, for example, a liquid crystal panel or an organic electro luminescence (EL) panel, and displays moving images or still images captured by the CMOS image sensor 302. The recording unit 306 records the moving images or the still images captured by the CMOS image sensor 302 on a recording medium such as, for example, a video tape or a DVD (Digital Versatile Disk).

The operation unit 307 outputs operation command signals for operating various functions of the imaging apparatus 300 upon receiving a predetermined operation of a user. The power supply unit 308 appropriately supplies a variety of power which is operation power of the CMOS image sensor 302, the DSP circuit 303, the frame memory 304, the display unit 305, the recording unit 306, and the operation unit 307, to corresponding units.

In addition, in the imaging apparatus 300 shown in FIG. 26, the CMOS image sensor 302 may be formed as one chip, or as a module in which the imaging unit and the signal processing unit or the optical unit are integrally packaged and have an imaging function.

As above, although the solid-state imaging device and the electronic apparatus having the same according to the various embodiments and modified examples related to the present disclosure have been described, the present disclosure is not limited to the above-described various embodiments and modified examples. For example, any layout configuration of the shared pixel unit part may be set in a range in which adverse effect on output characteristics of a photodiode caused by the above-described asymmetry of layout configurations between the first transistor group and the second transistor group can be sufficiently suppressed. More specifically, if variations in sensitivity are, for example, approximately 0.1% or less, there is no problem in practical use, and, therefore, any layout configuration of the shared pixel unit part may be set, for example, in such a configuration where the variations in sensitivity are made to be approximately 0.1% or less.

In addition, although, in the various embodiments and modified examples, an example in which two transistor groups are provided in the shared pixel unit part has been described, the present disclosure is not limited thereto, and three or more transistor groups may be provided in the shared pixel unit part. In that case, layout configurations of the gate and/or the source/drain may be symmetrical between at least two transistor groups.

In addition, the problem resulting from the asymmetry of the layout configuration between the first transistor group and the second transistor group may occur in the front-illuminated CMOS image sensor, depending on the layout form of the wiring layer provided on the light incidence side of the photodiode, as described above. Therefore, the layout of the shared pixel unit part according to the above-described various embodiments and modified examples may be applied to the front-illuminated CMOS image sensor using the pixel sharing technology, and the same effects can be achieved.

In addition, the layout configuration of the shared pixel unit part according to the various embodiments and modified examples related to the present disclosure may be appropriately applied to any use in which various transistors shared in the shared pixel unit part are arranged in a plurality of transistor groups.

In addition, the present disclosure may have the following configurations.

(1)

A solid-state imaging device including a plurality of photoelectric conversion units; a floating diffusion unit that is shared by the plurality of photoelectric conversion units and converts electric charge generated in each of the plurality of photoelectric conversion units into a voltage signal; a plurality of transfer units that are respectively provided in the plurality of photoelectric conversion units and transfer the electric charge generated in the plurality of photoelectric conversion units to the floating diffusion unit; a first transistor group that is electrically connected to the floating diffusion unit and includes a gate and source/drain which are arranged with a first layout configuration; and a second transistor group that is electrically connected to the floating diffusion unit, includes a gate and source/drain arranged with a second layout configuration symmetrical to the first layout configuration, and is provided in a separate area from the first transistor group.

(2)
The solid-state imaging device according to (1), wherein gates and sources/drains of a plurality of transistors which perform the same operation in response to the voltage signal converted by the floating diffusion unit are provided in one of the first transistor group and the second transistor group.

(3)
The solid-state imaging device according to (1), wherein gates and sources/drains of some transistors of a plurality of transistors which perform the same operation in response to the voltage signal converted by the floating diffusion unit are provided in the first transistor group, and gates and sources/drains of the rest of the transistors are provided in the second transistor group.

(4)
The solid-state imaging device according to (2) or (3), wherein some transistors of the plurality of transistors performing the same operation do not act as a transistor.

(5)
The solid-state imaging device according to any one of (1) to (4), wherein a dummy gate is provided in at least one of the first transistor group and the second transistor group.

(6)
The solid-state imaging device according to (1), wherein gates and sources/drains of some transistors of a plurality of transistors which perform different operations in response to the voltage signal converted by the floating diffusion unit are provided in the first transistor group, and gates and sources/drains of the rest of the transistors are provided in the second transistor group.

(7)
The solid-state imaging device according to any one of (1) to (6), further including a well contact, wherein the well contact is formed in an area different from the formation areas of the first transistor group and the second transistor group in a surrounding area of a formation area of the plurality of photoelectric conversion units and is formed at a position where a direction from the first transistor group to the second transistor group is perpendicular to a direction from the well contact to the floating diffusion unit.

(8)
The solid-state imaging device according to any one of (1) to (7), further including a wire unit that is provided on a side opposite to a light illumination side of the plurality of photoelectric conversion units.

(9)
The solid-state imaging device according to (1), wherein amplification transistors are respectively provided in the first transistor group and the second transistor group, and the amplification transistor of the first transistor group and the amplification transistor of the second transistor group are connected in parallel.

(10)
The solid-state imaging device according to (9), wherein a reset transistor is provided in only one of the first transistor group and the second transistor group.

(11)
The solid-state imaging device according to (9), wherein reset transistors are respectively provided in the first transistor group and the second transistor group, and the reset transistor of the first transistor group and the reset transistor of the second transistor group are connected in parallel.

(12)
The solid-state imaging device according to (10), wherein a selection transistor is provided in the other of the first transistor group and the second transistor group.

(13)
The solid-state imaging device according to (10), wherein a dummy gate is provided in the other of the first transistor group and the second transistor group.

(14)
The solid-state imaging device according to (1), wherein the plurality of photoelectric conversion units, the floating diffusion unit, and the plurality of transfer units constitute a light-receiving unit, and wherein arrangements of transistors of the respective transistor groups and wires connected to the transistors are in a symmetrical relationship with respect to a central line of the light-receiving unit in the first transistor group and the second transistor group.

(15)
An electronic apparatus including a solid-state imaging device that includes a plurality of photoelectric conversion units; a floating diffusion unit that is shared by the plurality of photoelectric conversion units and converts electric charge generated in each of the plurality of photoelectric conversion units into a voltage signal; a plurality of transfer units that are respectively provided in the plurality of photoelectric conversion units and transfers the electric charge generated in the plurality of photoelectric conversion units to the floating diffusion unit; a first transistor group that is electrically connected to the floating diffusion unit and includes a gate and source/drain which are arranged with a first layout configuration; and a second transistor group that is electrically connected to the floating diffusion unit, includes a gate and source/drain arranged with a second layout configuration symmetrical to the first layout configuration, and is provided in a separate area from the first transistor group; and a signal processing circuit that performs a predetermined process for an output signal from the solid-state imaging device.

The present disclosure contains subject matter related to that disclosed in Japanese Priority Patent Application JP 2011-180142 filed in the Japan Patent Office on Aug. 22, 2011 and Japanese Priority Patent Application JP 2012-145606 filed in the Japan Patent Office on Jun. 28, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state image device comprising:
a pixel array including a plurality of shared units,
wherein a shared unit in the plurality of shared units comprises:
a first unit including a first four photoelectric conversion regions, a first four transfer transistors, and a first floating diffusion, respective ones of the first four transfer transistors are coupled to respective ones of the first four photoelectric conversion regions, the first floating diffusion is shared by the first four transfer transistors;

a second unit including a second four photoelectric conversion regions, a second four transfer transistors, and a second floating diffusion, respective ones of the second four transfer transistors are coupled to respective ones of the second four photoelectric conversion regions, the second floating diffusion is shared by the second four transfer transistors, wiring electrically connects the second floating diffusion directly to the first floating diffusion;

shared transistors coupled to the first floating diffusion and the second floating diffusion; and a signal line coupled to the shared transistors to transfer a signal based on an output of at least one of the first four photoelectric conversion regions and the second four photoelectric conversion regions, wherein the shared transistors include a first selection transistor and a second selection transistor.

2. The solid-state image device according to claim 1, wherein the first unit and the second unit are arranged in a first direction,
wherein the first floating diffusion and the second floating diffusion are arranged in the first direction, and
wherein the first selection transistor and the second selection transistor are arranged in the first direction.

3. The solid-state image device according to claim 2, further comprising:
a plurality of well contacts arranged in the first direction.

4. The solid-state image device according to claim 1, wherein the shared transistors include an amplification transistor coupled to the first floating diffusion and the second floating diffusion.

5. The solid-state image device according to claim 4, wherein the amplification transistor is coupled to at least one of the first selection transistor and the second selection transistor.

6. The solid-state image device according to claim 5, wherein the shared transistors include a reset transistor coupled to the first floating diffusion and the second floating diffusion.

7. The solid-state image device according to claim 6, wherein the reset transistor coupled to the amplification transistor.

8. The solid-state image device according to claim 4, wherein a first source/drain is shared by the amplification transistor and the first selection transistor.

9. The solid-state image device according to claim 1, wherein the signal line includes a plurality of signal lines coupled to the shared transistors, and
wherein the plurality of the signal lines include a first signal line coupled to the first selection transistor and a second signal line coupled to the second selection transistor.

10. A solid-state image device comprising:
a first unit including a first plurality of photoelectric conversion regions, a first four transfer transistors, and a first floating diffusion shared by the first four transfer transistors, the first four transfer transistors are configured to transfer a charge accumulated in the first plurality of photoelectric conversion regions to the first floating diffusion;
a second unit including a second plurality of photoelectric conversion regions, a second four transfer transistors, and a second floating diffusion shared by the second four transfer transistors, the second four transfer transistors are configured to transfer a charge accumulated in the second plurality of photoelectric conversion regions to the second floating diffusion, wiring electrically connects the second floating diffusion directly to the first floating diffusion;
shared transistors coupled to the first floating diffusion and the second floating diffusion; and
a signal line coupled to the shared transistors to transfer a signal based on an output of at least one of the first plurality of photoelectric conversion regions and the second plurality of photoelectric conversion regions,
wherein the shared transistors include a first selection transistor and a second selection transistor.

11. The solid-state image device according to claim 10, wherein the first unit and second unit are arranged in a first direction,
wherein the first floating diffusion and the second floating diffusion are arranged in the first direction, and
wherein the first selection transistor and the second selection transistor are arranged in the first direction.

12. The solid-state image device according to claim 11, further comprising:
a plurality of well contacts arranged in the first direction.

13. The solid-state image device according to claim 10, wherein the shared transistors include an amplification transistor coupled to the first floating diffusion and the second floating diffusion and a reset transistor coupled to the first floating diffusion and the second floating diffusion.

14. The solid-state image device according to claim 13, wherein the amplification transistor is coupled to at least one of the first selection transistor and the second selection transistor.

15. The solid-state image device according to claim 10, wherein the first floating diffusion is surrounded by the first four transfer transistors, and
wherein the second floating diffusion is surrounded by the second four transfer transistors.

16. The solid-state image device according to claim 13, wherein a source/drain is shared by the amplification transistor and the first selection transistor.

17. The solid-state image device according to claim 10, wherein the signal line includes a plurality of signal lines coupled to the shared transistors, and
wherein the plurality of the signal lines include a first signal line coupled to the first selection transistor and a second signal line coupled to the second selection transistor.

18. A camera module comprising:
a solid-state image device comprising:
a first unit including a first plurality of photoelectric conversion regions, a first four transfer transistors, and a first floating diffusion shared by the first four transfer transistors, the first four transfer transistors are configured to transfer a charge accumulated in the first plurality of photoelectric conversion regions to the first floating diffusion;
a second unit including a second plurality of photoelectric conversion regions, a second four transfer transistors, and a second floating diffusion shared by the second four transfer transistors, the second four transfer transistors are configured to transfer a charge accumulated in the second plurality of photoelectric conversion regions to the second floating diffusion, wiring electrically connects the second floating diffusion directly to the first floating diffusion;
shared transistors coupled to the first floating diffusion and the second floating diffusion; and a signal line coupled to the shared transistors to transfer a signal based on an output of at least one of the first plurality of photoelectric conversion regions and the second plurality of photoelectric conversion regions, wherein the shared transistors include a first selection transistor and a second selection transistor.

19. The camera module according to claim 18, wherein the first unit and second unit are arranged in a first direction, wherein the first floating diffusion and the second floating diffusion are arranged in the first direction, and wherein the first selection transistor and the second selection transistor are arranged in the first direction.

20. The camera module according to claim 19, further comprising:

a plurality of well contacts arranged in the first direction.

21. The camera module according to claim 18, wherein the shared transistors include an amplification transistor coupled to the first floating diffusion and the second floating diffusion, the amplification transistor is coupled to at least one of the first selection transistor and the second selection transistor, and wherein the shared transistors include a reset transistor coupled to the first floating diffusion and the second floating diffusion, the reset transistor coupled to the amplification transistor.

22. The camera module according to claim 21, wherein a source/drain is shared by the amplification transistor and the first selection transistor.

23. The camera module according to claim 18, wherein the signal line includes a plurality of signal lines coupled to the shared transistors, and wherein the plurality of the signal lines include a first signal line coupled to the first selection transistor and a second signal line coupled to the second selection transistor.

24. An electronic apparatus comprising:

a solid-state image device comprising:

a first unit including a first plurality of photoelectric conversion regions, a first four transfer transistors, and a first floating diffusion shared by the first four transfer transistors, the first four transfer transistors is configured to transfer a charge accumulated in the first plurality of photoelectric conversion regions to the first floating diffusion;

a second unit including a second plurality of photoelectric conversion regions, a second four transfer transistors, and a second floating diffusion shared by the second four transfer transistors, the second four transfer transistors is configured to transfer a charge accumulated in the second plurality of photoelectric conversion regions to the second floating diffusion, wiring electrically connects the second floating diffusion directly to the first floating diffusion;

shared transistors coupled to the first floating diffusion and the second floating diffusion; and a signal line coupled to the shared transistors to transfer a signal based on an output of at least one of the first plurality of photoelectric conversion regions and the second plurality of photoelectric conversion regions, wherein the shared transistors include a first selection transistor and a second selection transistor.

25. The electronic apparatus according to claim 24, wherein the first unit and second unit are arranged in a first direction, wherein the first floating diffusion and the second floating diffusion are arranged in the first direction, and wherein the first selection transistor and the second selection transistor are arranged in the first direction.

26. The electronic apparatus according to claim 25, further comprising:

a plurality of well contacts arranged in the first direction.

27. The electronic apparatus according to claim 24, wherein the shared transistors include an amplification transistor coupled to the first floating diffusion and the second floating diffusion, the amplification transistor is coupled to at least one of the first selection transistor and the second selection transistor, and wherein the shared transistors include a reset transistor coupled to the first floating diffusion and the second floating diffusion, the reset transistor coupled to the amplification transistor.

28. The electronic apparatus according to claim 27, wherein a source/drain is shared by the amplification transistor and the first selection transistor.

29. The solid-state image device according to claim 24, wherein the signal line includes a plurality of signal lines coupled to the shared transistors, and wherein the plurality of the signal lines include a first signal line coupled to the first selection transistor and a second signal line coupled to the second selection transistor.

* * * * *